(12) United States Patent
Maeda et al.

(10) Patent No.: US 8,198,698 B2
(45) Date of Patent: Jun. 12, 2012

(54) SEMICONDUCTOR DEVICE

(75) Inventors: Satoshi Maeda, Tokyo (JP); Yasushi Sekine, Tokyo (JP); Tetsuya Watanabe, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 197 days.

(21) Appl. No.: 12/395,202

(22) Filed: Feb. 27, 2009

(65) Prior Publication Data

US 2009/0236648 A1    Sep. 24, 2009

(30) Foreign Application Priority Data

Mar. 18, 2008   (JP) ................... 2008-068807

(51) Int. Cl.
*H01L 21/70* (2006.01)
*H01L 21/02* (2006.01)

(52) U.S. Cl. ........ 257/499; 257/528; 257/532; 257/272; 257/E27.026; 257/E27.027

(58) Field of Classification Search .................. 257/532, 257/E31.001, E27, 296, 512, 528, 272, 499, 257/758, E27.026–28, E25.023, E25.01, 257/510, 513, 516
See application file for complete search history.

(56) References Cited

U.S. PATENT DOCUMENTS

| | | | | |
|---|---|---|---|---|
| 6,020,616 A | * | 2/2000 | Bothra et al. | 257/381 |
| 2005/0145987 A1 | * | 7/2005 | Okuda et al. | 257/532 |
| 2007/0013029 A1 | * | 1/2007 | Iioka et al. | 257/532 |
| 2007/0296020 A1 | * | 12/2007 | Shiba et al. | 257/315 |
| 2008/0173978 A1 | * | 7/2008 | Tu | 257/532 |

FOREIGN PATENT DOCUMENTS

| | | | |
|---|---|---|---|
| JP | 2001-274255 | * | 5/2001 |
| JP | 2001-274255 A | | 10/2001 |
| JP | 2005-072233 | * | 8/2003 |
| JP | 2005-197396 A | | 7/2005 |
| JP | 2007-081044 | * | 9/2005 |
| JP | 2006-253498 | * | 9/2006 |
| JP | 2006-253498 A | | 9/2006 |
| JP | 2007-081044 | * | 3/2007 |
| JP | 2007-081044 A | | 3/2007 |

* cited by examiner

*Primary Examiner* — Colleen Matthews
*Assistant Examiner* — Galina Yushina
(74) *Attorney, Agent, or Firm* — Miles & Stockbridge P.C.

(57) ABSTRACT

To improve a performance of a semiconductor device having a capacitance element. An MIM type capacitance element, an electrode of which is formed with comb-shaped metal patterns composed of the wirings, is formed over a semiconductor substrate. A conductor pattern, which is a dummy gate pattern for preventing dishing in a CMP process, and an active region, which is a dummy active region, are disposed below the capacitance element, and these are coupled to shielding metal patterns composed of the wirings and then connected to a fixed potential. Then, the conductor pattern and the active region are disposed so as not to overlap the comb-shaped metal patterns in the wirings in a planar manner.

17 Claims, 26 Drawing Sheets

SEMICONDUCTOR DEVICE

CROSS-REFERENCE TO RELATED APPLICATION

The present application claims priority from Japanese patent application No. 2008-68807 filed on Mar. 18, 2008, the content of which is hereby incorporated by reference into this application.

BACKGROUND OF THE INVENTION

The present invention relates to a semiconductor device, and particularly to a technique which is effective in an application thereof to a semiconductor device having a capacitance element.

Various semiconductor devices are produced by forming a MISFET, a capacitor, etc. over a semiconductor substrate and by wiring respective elements with wirings. The capacitors formed over the semiconductor substrate include a MOS type capacitance element, a PIP (Poly-silicon Insulator Poly-silicon) type capacitance element, an MIM (Metal Insulator Metal) type capacitance element, etc.

Japanese patent laid-open No. 2005-197396 (Patent document 1) discloses a technique to form a capacitance using a comb-shaped wiring.

Japanese patent laid-open No. 2006-253498 (Patent document 2) discloses a technique to connect a dummy pattern disposed neighboring a signal wiring pattern to a fixed potential such as a power source or the ground.

Japanese patent laid-open No. 2001-274255 (Patent document 3) discloses a technique to connect some of dummy wirings to a fixed potential node of a power source or the ground.

Japanese patent laid-open No. 2007-81044 (Patent document 4) discloses a technique to provide a shielding conductor so as to surround a capacitance element in a planar manner in the same wiring layer as that of an electrode of the capacitance element.

SUMMARY OF THE INVENTION

The investigation by the inventors of the present invention has found the following.

It is possible to form an MIM type capacitance element by combining wiring metals used for wiring elements in various forms. This MIM type capacitance element uses the wiring as an electrode and an interlayer insulating film as a dielectric film (capacitance insulating film), and thereby can form capacitances in both of the horizontal direction and the vertical direction in a multilayer wiring structure and realize a large capacitance in the capacitance element. Further, as the development of the recent micro-fabrication technique, a distance between the wirings has been shrunk in both of the horizontal direction and the vertical direction and a larger capacitance value has been obtained.

Below the MIM type capacitance element, it is preferable to dispose a dummy pattern of an active region or a gate electrode for improving flatness in a CMP process. By disposing the dummy pattern of the active region below the MIM type capacitance element, it is possible to prevent dishing and to improve the flatness in the CMP process, in which an element isolation region is formed by filling a groove provided in a semiconductor substrate with an insulating material. Further, by disposing the dummy pattern of the gate electrode below the MIM type capacitance element, it is possible to prevent dishing and improve the flatness in the CMP process, which planarizes an upper surface of an interlayer insulating film formed so as to cover the gate electrode and the dummy pattern thereof.

However, when the dummy pattern of the active region or the gate pattern is disposed below the MIM type capacitance element, since this dummy pattern is an isolated pattern which is not connected to any pattern (so called floating pattern), the dummy pattern has an unstable potential, and thereby sometimes may become a noise source to the MIM type capacitance element or may cause an electric characteristic of a circuit using the capacitance element to become unstable by changing a parasitic capacitance value between the dummy pattern and an electrode wiring pattern of the MIM type capacitance element. This degrades a performance of a semiconductor device.

Further, when the dummy pattern of the active region or the gate electrode is disposed below the MIM type capacitance element and this dummy pattern faces the electrode wiring pattern of the MIM type capacitance element vertically, both patterns interfere with each other to increase the parasitic capacitance and possibly to degrade the electrical characteristic of the circuit using the capacitance element. This degrades the performance of the semiconductor device.

On the other hand, when the dummy pattern of the active region or the gate electrode is not disposed below the MIM type capacitance element, the flatness of each layer formed over the semiconductor substrate is deteriorated and productivity of the semiconductor device may be degraded.

An object of the present invention is to provide a technique improving a performance of a semiconductor device having a capacitance element.

The above and the other objects and novel features of the present invention will be apparent by the description of the present specification and the accompanying drawings.

Outlines of the representative inventions among the inventions disclosed in the present application will be described simply as follows.

A semiconductor device according to the representative embodiment is one in which a dummy gate pattern and a dummy active region pattern are provided below a capacitance element utilizing a capacitance between metal patterns in the same layer and the dummy patterns are connected to a fixed potential.

Further, a semiconductor device according to the representative embodiment is one in which a dummy gate pattern and a dummy active region pattern are provided below a capacitance element utilizing a capacitance between metal patterns in the same layer and the dummy patterns are disposed so as not to overlap a metal pattern composing the capacitance element in a planar manner.

An advantage obtained by the representative inventions, among the inventions disclosed in the present application, will be described simply as follows.

It is possible to improve a performance of a semiconductor device having a capacitance element according to the representative embodiments.

DETAILED DESCRIPTION OF THE PREFERRED EMBODIMENTS

Figure 1:
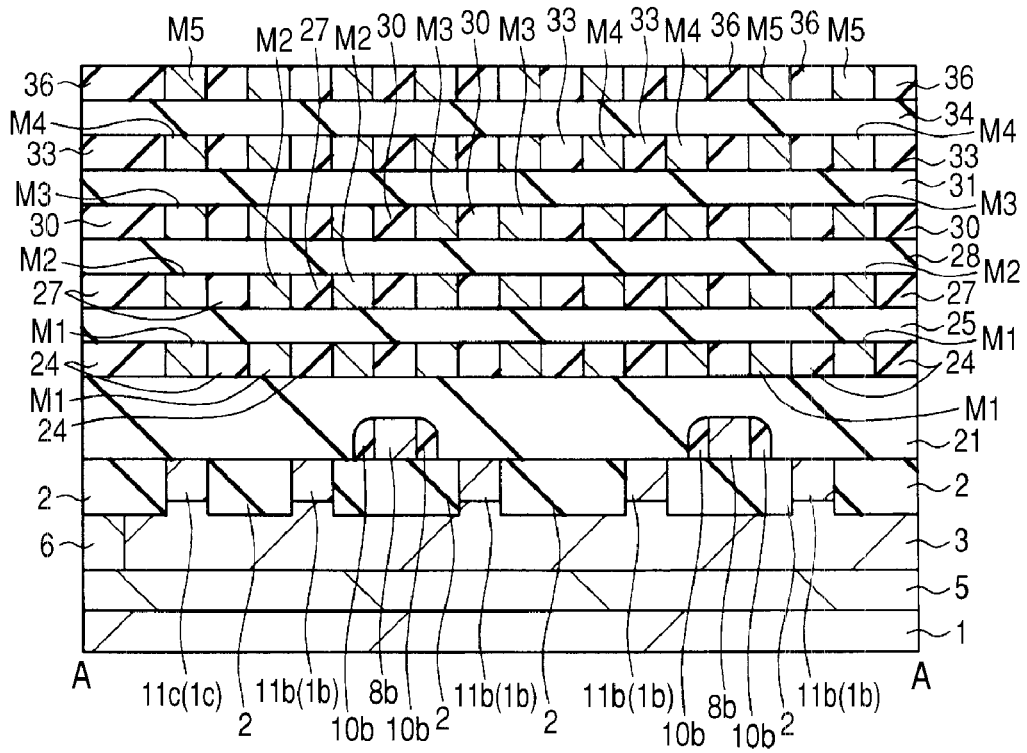
FIG. 1 is a cross-sectional view of a substantial part in a semiconductor device according to one embodiment of the present invention.
Figure 2:
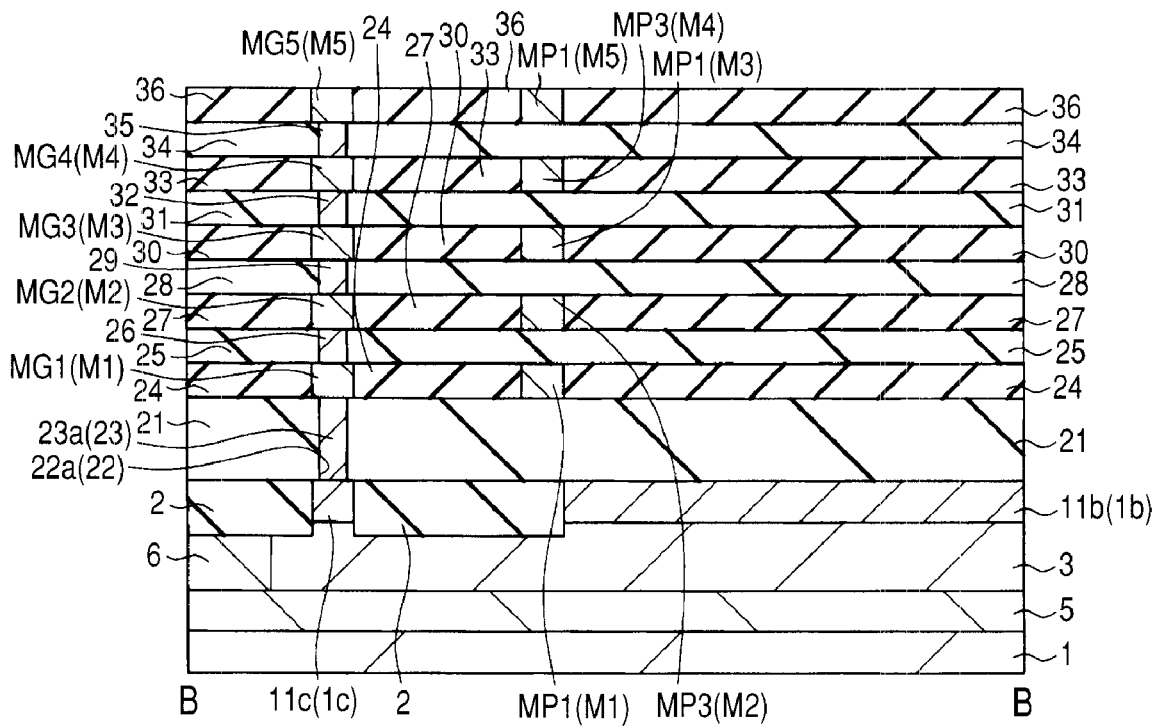
FIG. 2 is a cross-sectional view of a substantial part in a semiconductor device according to one embodiment of the present invention.
Figure 3:
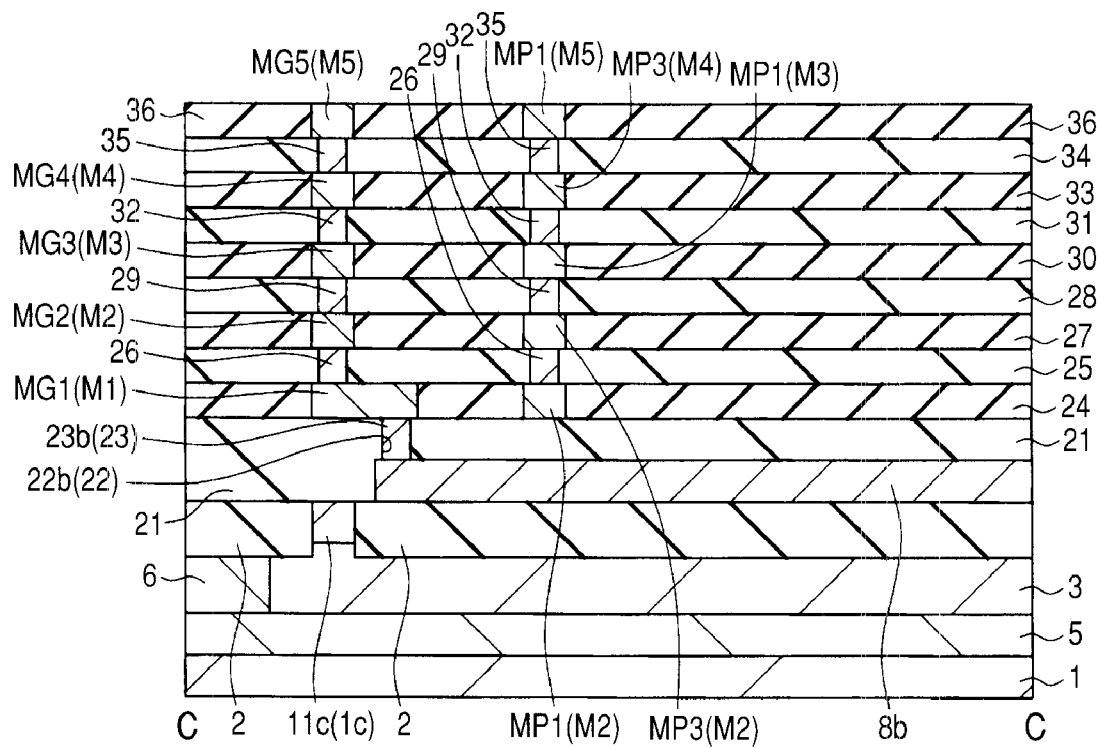
FIG. 3 is a cross-sectional view of a substantial part in a semiconductor device according to one embodiment of the present invention.
Figure 4:
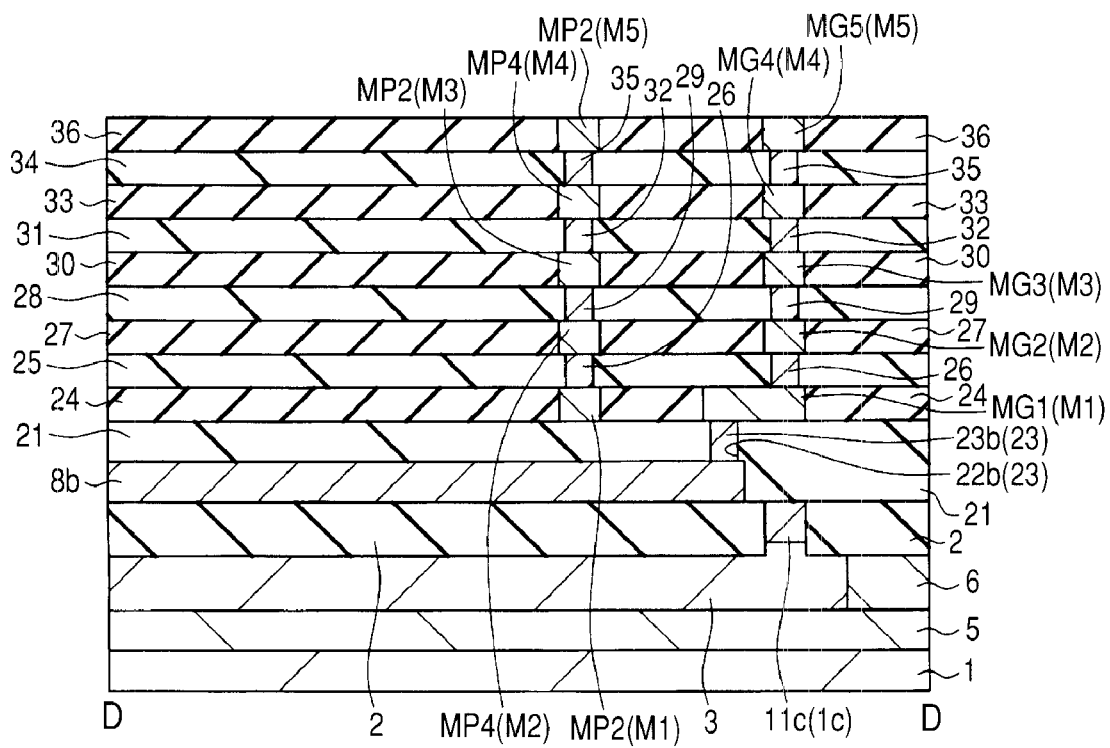
FIG. 4 is a cross-sectional view of a substantial part in a semiconductor device according to one embodiment of the present invention.
Figure 5:
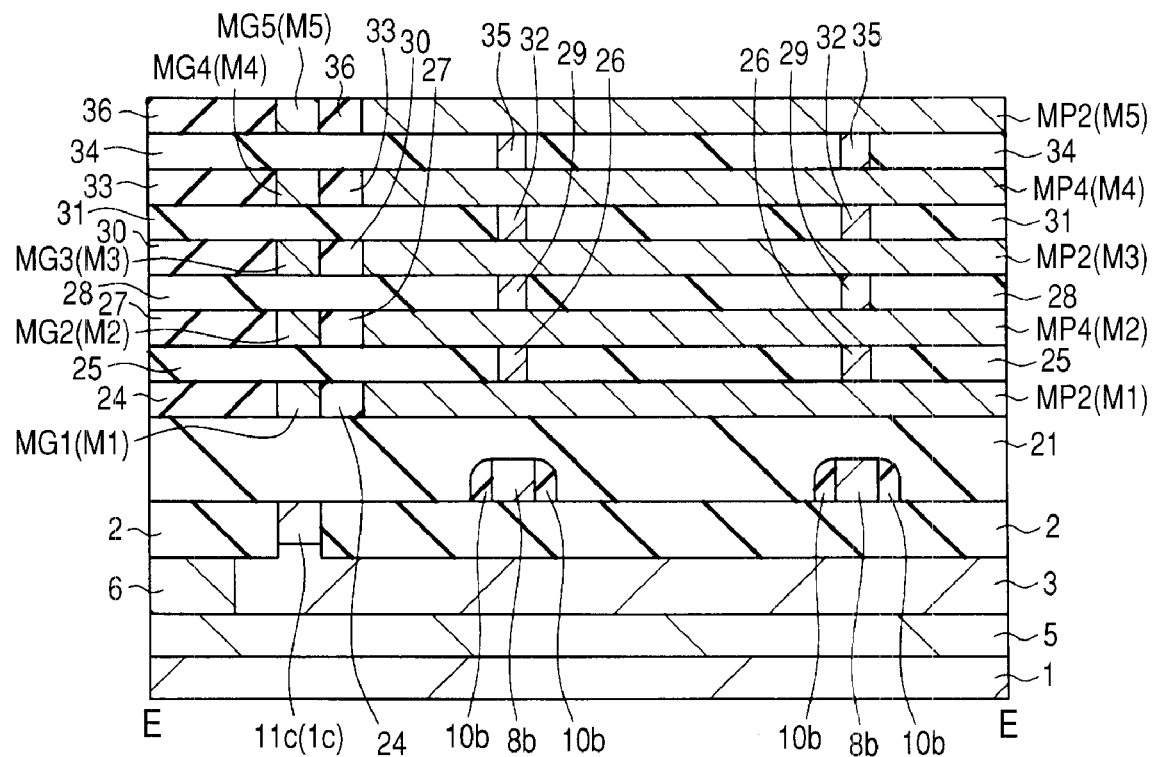
FIG. 5 is a cross-sectional view of a substantial part in a semiconductor device according to one embodiment of the present invention.

In the following embodiments, when necessary for the sake of convenience, description will be given by dividing an embodiment into a plurality of sections or embodiments, however, except when explicitly stated in particular, the sections or embodiments are not those having nothing to do with each other but one has a relationship with another or all the rest as a variation, detail, supplementary description, etc. When the number of elements etc. (including the number of items, numerical value, quantity, range, etc.) is referred to in the following embodiments, except when explicitly stated in particular or when the number is apparently limited to a specific number in principle, the number is not limited to the specific number but may be greater or less than that. Further, it is needless to say that, in the following embodiments, except when explicitly stated in particular or when apparently indispensable in principle, the components (including elementary steps) are not necessarily indispensable. Similarly, it is assumed that, in the following embodiments, when the shapes, positional relationships, etc., of the components etc. are referred to, except when explicitly stated or when they can apparently be thought otherwise in principle, those substantially similar to or resembling the shapes etc. are also included. This also applies to the above-mentioned numerical values and ranges.

Hereinafter, embodiments of the present invention will be described in detail referring to accompanied drawings. In all of the drawings for explaining the embodiments, the member having the same function are assigned the same symbols and its duplicated description will be omitted. In the following embodiments, other than when necessary in particular, descriptions of the same or similar part will not be repeated as a rule.

Moreover, in the drawings used in the embodiments, in order to make the drawing easier-to-see, even in a sectional view hatching may be omitted. Further, in order to make the drawing easier-to-see, even a plan view may be hatched.

(First Embodiment) A semiconductor device of the present embodiment will be described with reference to the drawings. The semiconductor device of the present embodiment is the one having a capacitance element.

Figure 6:
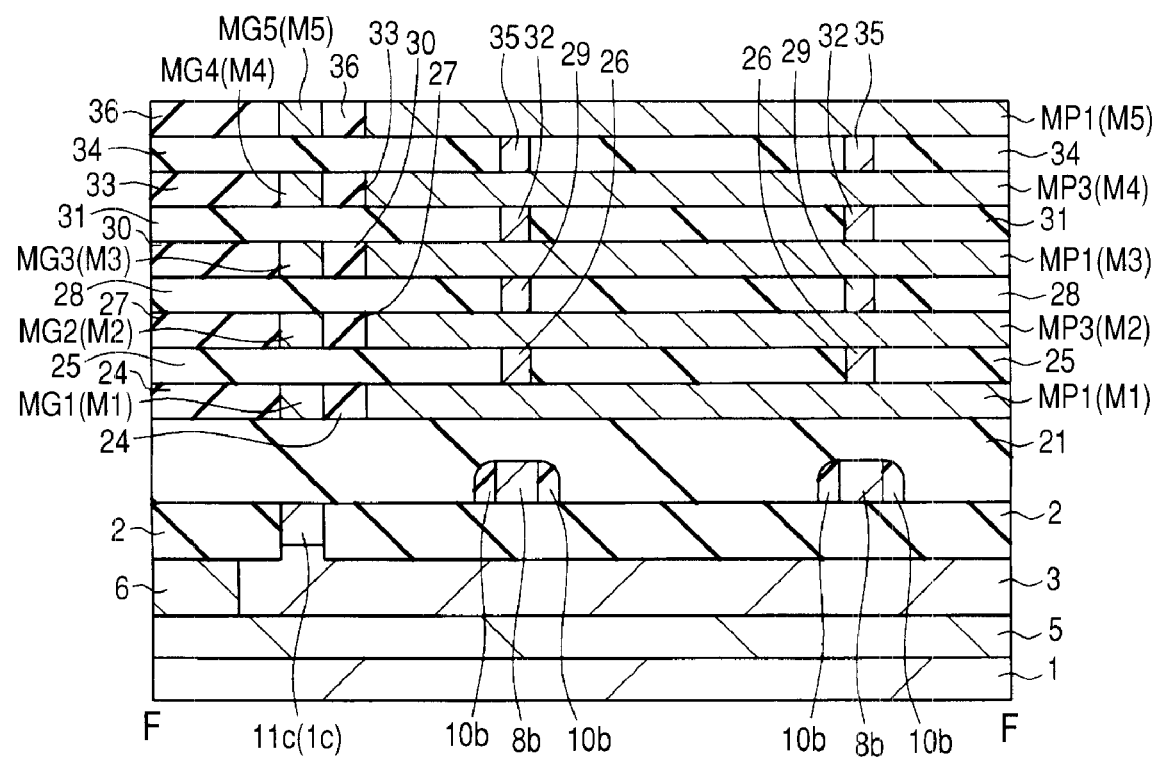
FIG. 6 is a cross-sectional view of a substantial part in a semiconductor device according to one embodiment of the present invention.
Figure 7:
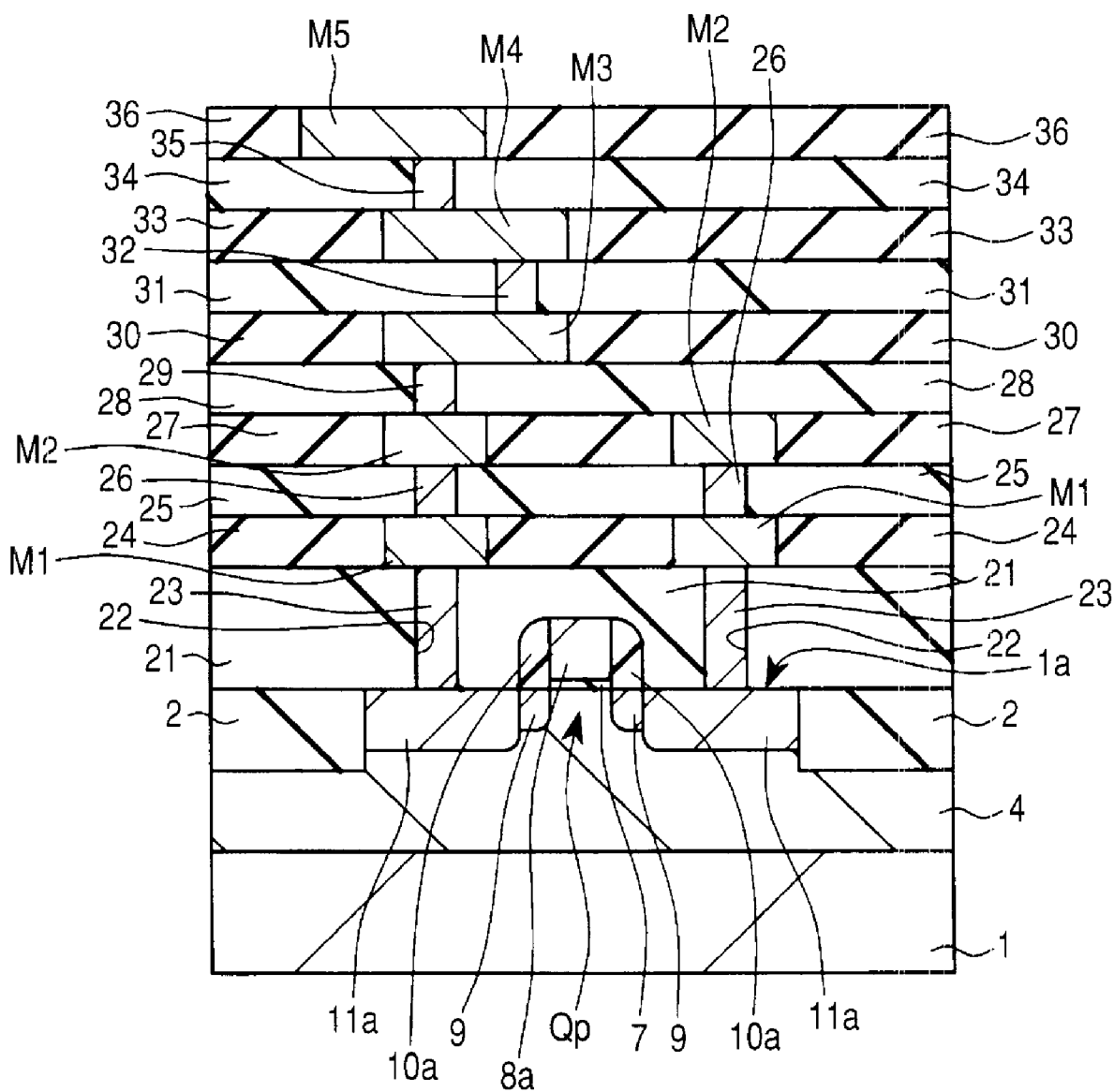
FIG. 7 is a cross-sectional view of a substantial part in a semiconductor device according to one embodiment of the present invention.

FIG. 1 to FIG. 7 are cross-sectional views of substantial parts in the semiconductor device of the present embodiment, FIG. 8 to FIG. 18 are plan views of substantial parts in the semiconductor device of the present embodiment. Each of FIG. 1 to FIG. 6 and FIG. 8 to FIG. 18 shows a cross-sectional view or a plan view of a capacitor formation region of the semiconductor device, and FIG. 7 shows a cross-sectional view of a MISFET formation region of the semiconductor device. FIG. 1 corresponds to a cross-section at an A-A line in FIG. 8 or FIG. 9, FIG. 2 corresponds to a cross-section at a B-B line in FIG. 8 or FIG. 9, FIG. 3 corresponds to a cross-section at a C-C line in FIG. 8 or FIG. 9, FIG. 4 corresponds to a cross-section at a D-D line in FIG. 8 or FIG. 9, FIG. 5 corresponds to a cross-section at an E-E line in FIG. 9, and FIG. 6 corresponds to a cross-section at an F-F line in FIG. 9. In the cross-sectional views of FIG. 1 to FIG. 7, a structure in an upper layer than an insulating film 36 and a wiring M5 is not shown in the drawings. Further, in the semiconductor device, the MISFET formation region of FIG. 7 is disposed in a planar region different from the capacitance formation region of FIG. 8 to FIG. 18.

Figure 8:
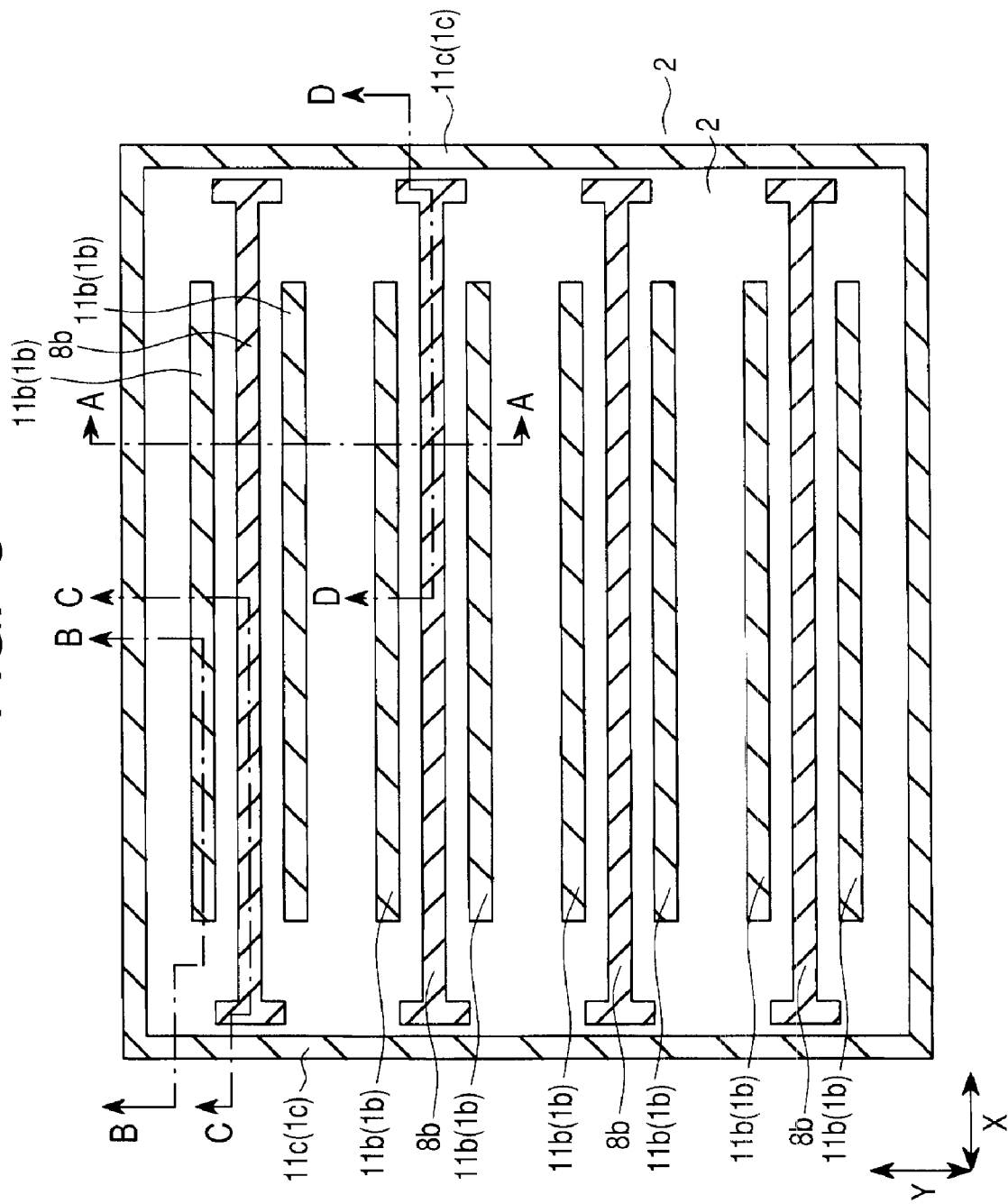
FIG. 8 is a cross-sectional view of a substantial part in a semiconductor device according to one embodiment of the present invention.
Figure 9:
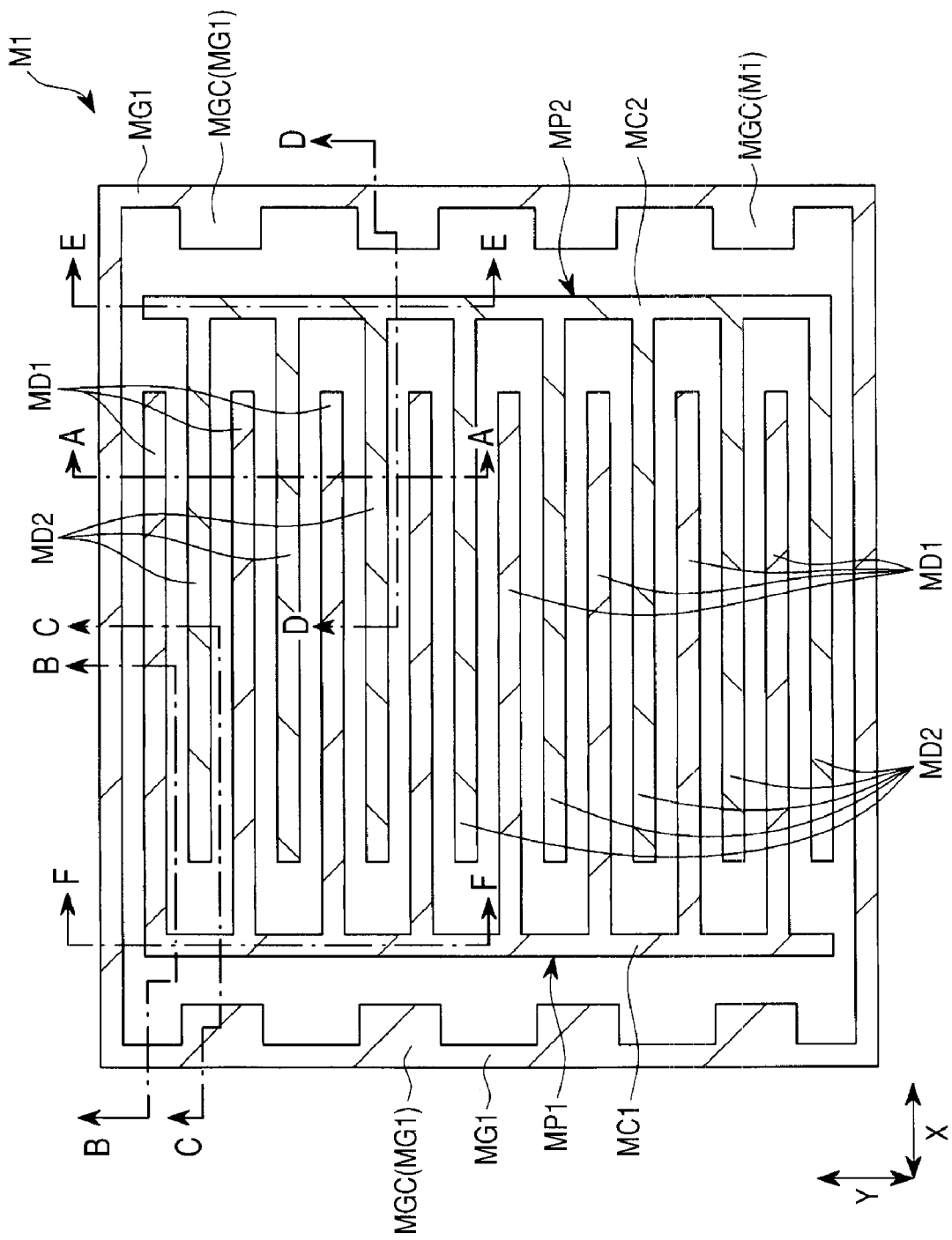
FIG. 9 is a plan view of a substantial part in a semiconductor device according to one embodiment of the present invention.
Figure 10:
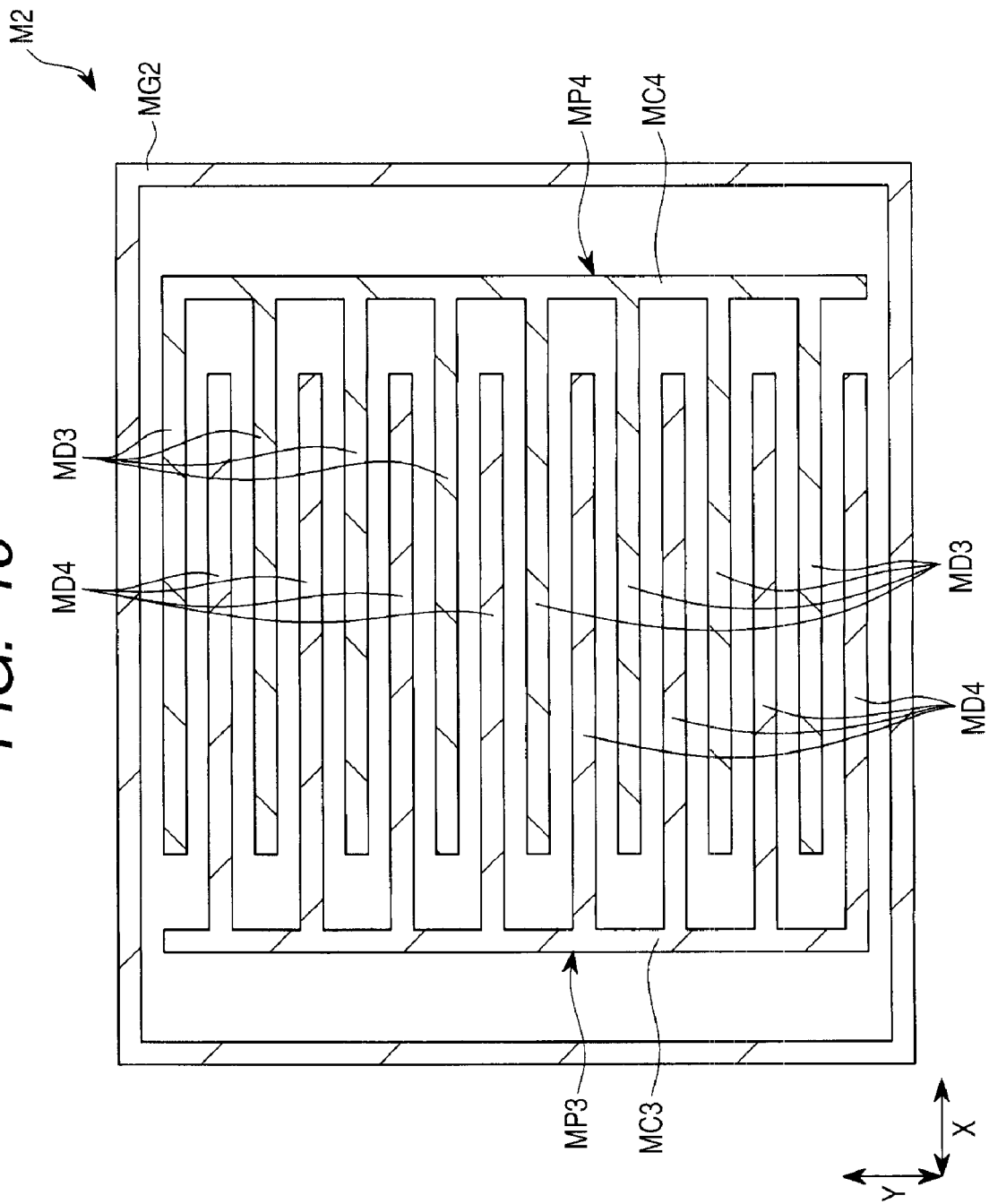
FIG. 10 is a plan view of a substantial part in a semiconductor device according to one embodiment of the present invention.
Figure 11:
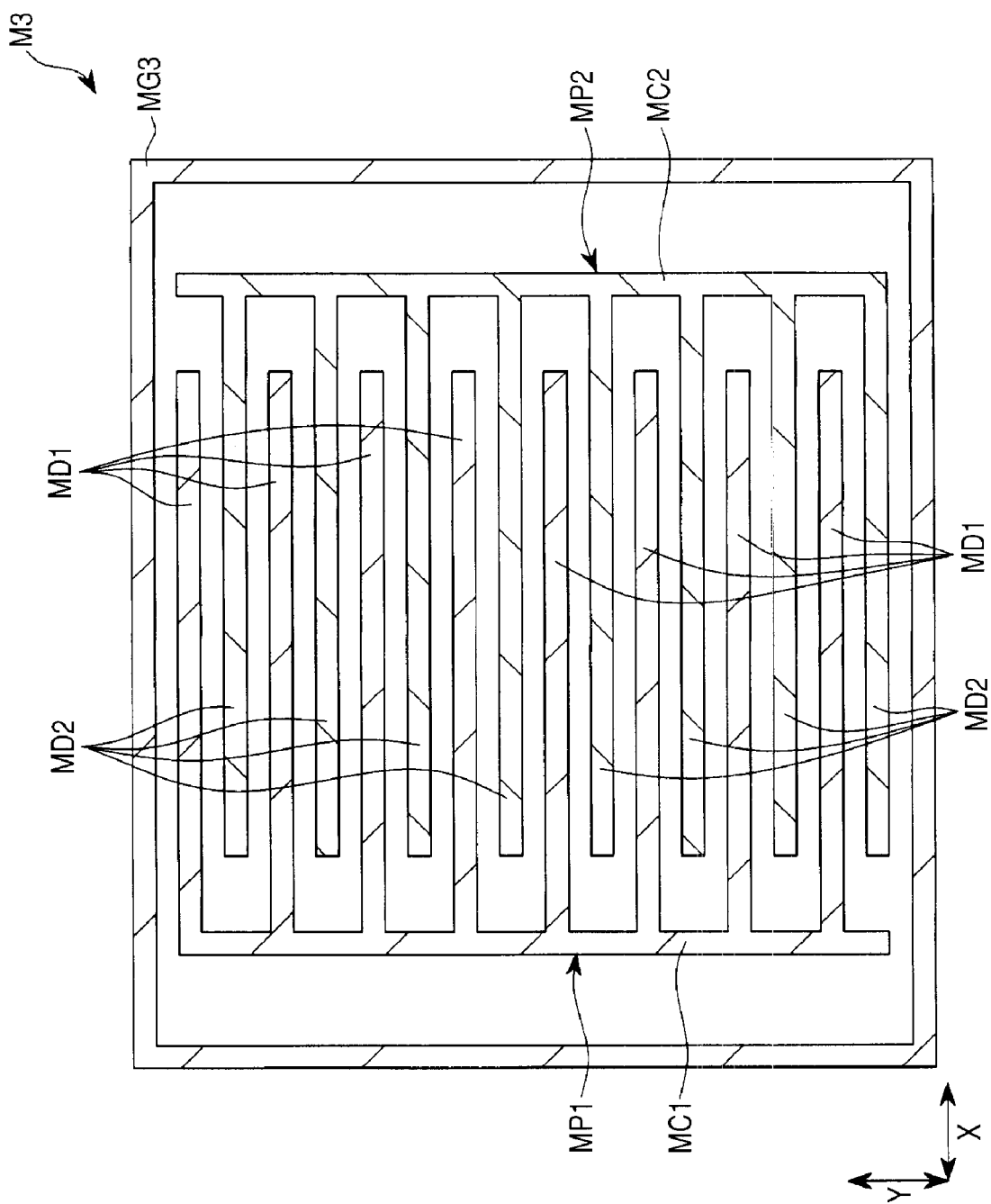
FIG. 11 is a plan view of a substantial part in a semiconductor device according to one embodiment of the present invention.
Figure 12:
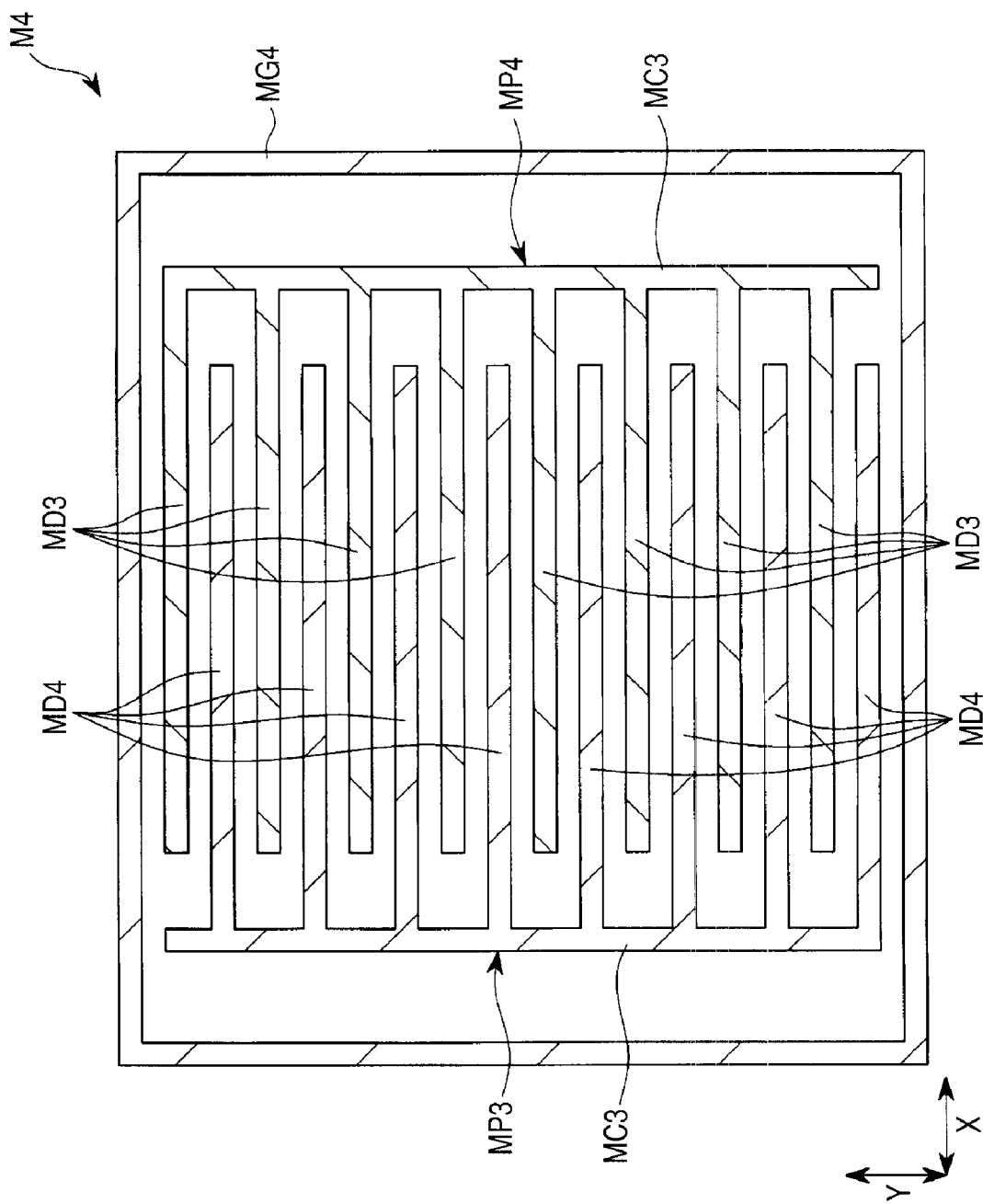
FIG. 12 is a plan view of a substantial part in a semiconductor device according to one embodiment of the present invention.
Figure 13:
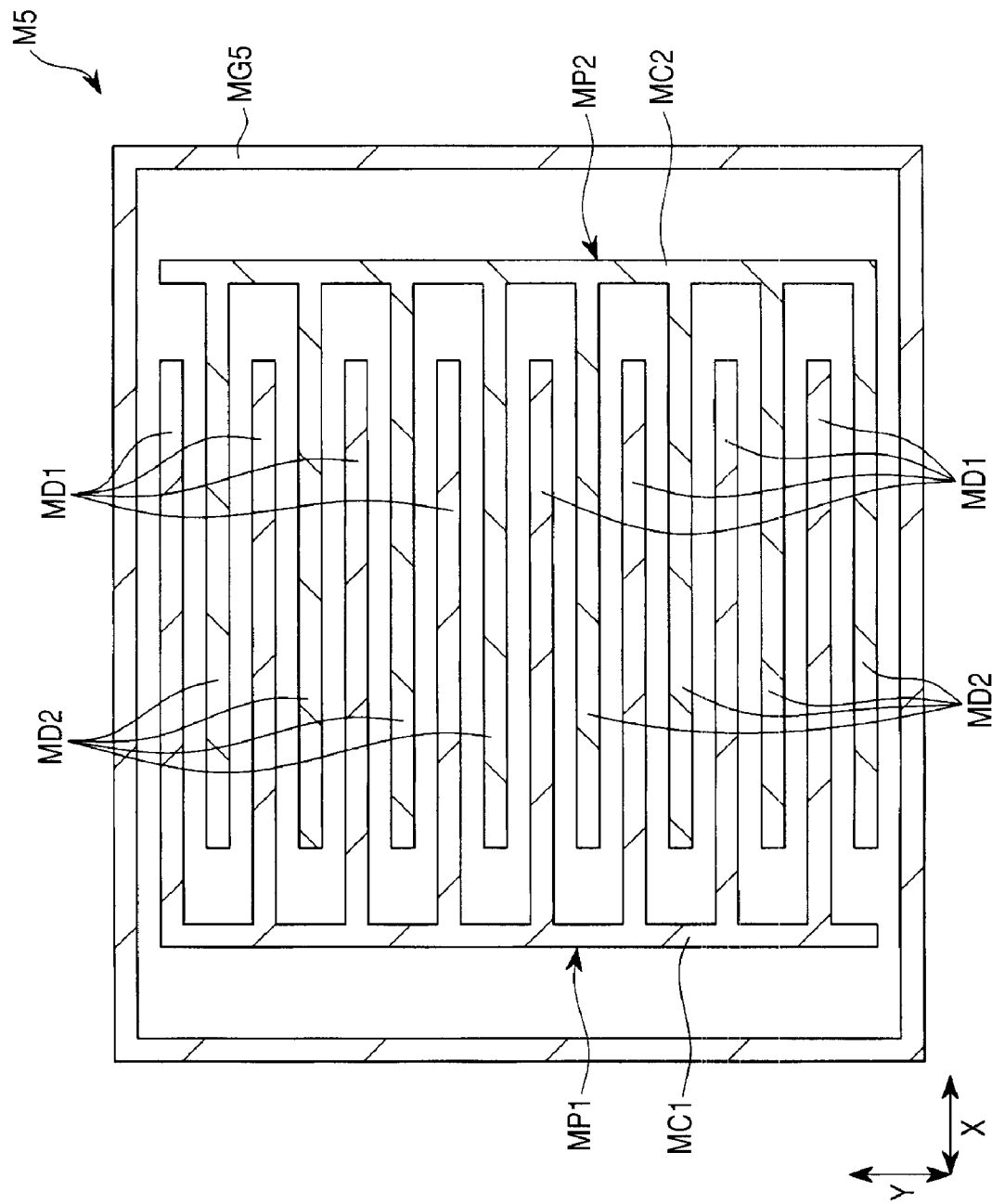
FIG. 13 is a plan view of a substantial part in a semiconductor device according to one embodiment of the present invention.

Further, FIG. 8 to FIG. 13 show the same planar region (here, capacitor formation region) in different layers. That is, FIG. 8 shows a planar layout (planar arrangement) of p-type semiconductor regions 11b, 11c and a conductor pattern 8b in the capacitor formation region, FIG. 9 shows a planar layout of a wiring M1 of a first layer wiring in the capacitor formation region, and FIG. 10 shows a planar layout of a wiring M2 of a second layer wiring in the capacitor formation region. Similarly, FIG. 11 shows a planar layout of a wiring M3 of a third layer wiring in the capacitor formation region, FIG. 12 shows a planar layout of a wiring M4 of a fourth layer wiring in the capacitor formation region, and FIG. 13 shows a planar layout of a wiring M5 of a fifth layer wiring in the capacitor formation region. In addition, FIG. 14 corresponds to the layout of the p-type semiconductor regions 11b, 11c and the conductor pattern 8b in the capacitor formation region, overlapped by the planar layout of the wiring M1. Note that in FIG. 14, the p-type semiconductor region 11c is disposed below a shielding metal pattern MG1. FIG. 8 to FIG. 14, while all of the drawings are plan views, are provided with hatching in the p-type semiconductor regions 11b, 11c, the conductor pattern 8b and the wirings M1, M2, M3, M4, and M5 for making the drawings easily to be viewed.

Figure 15:
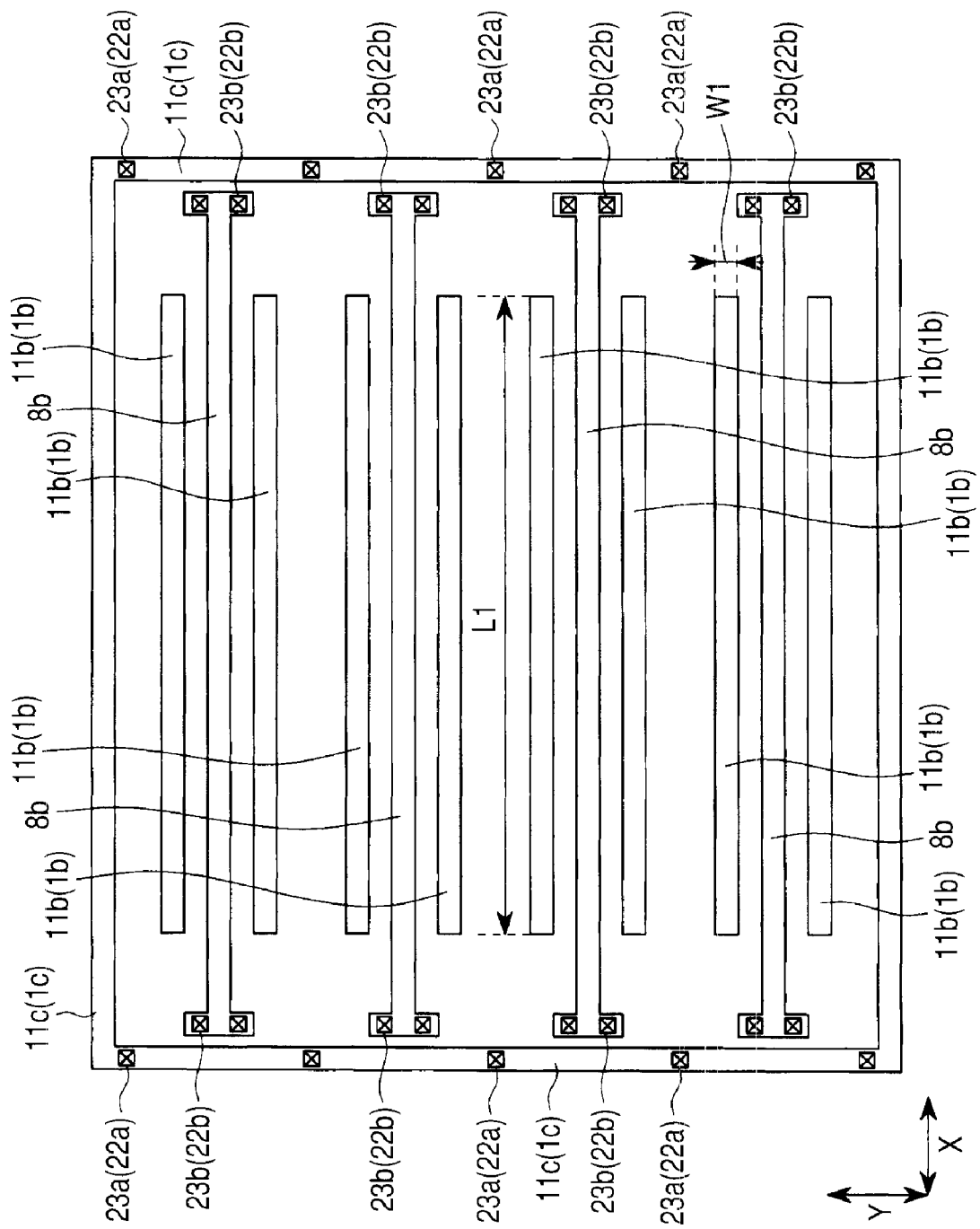
FIG. 15 is a plan view of a substantial part in a semiconductor device according to one embodiment of the present invention.
Figure 16:
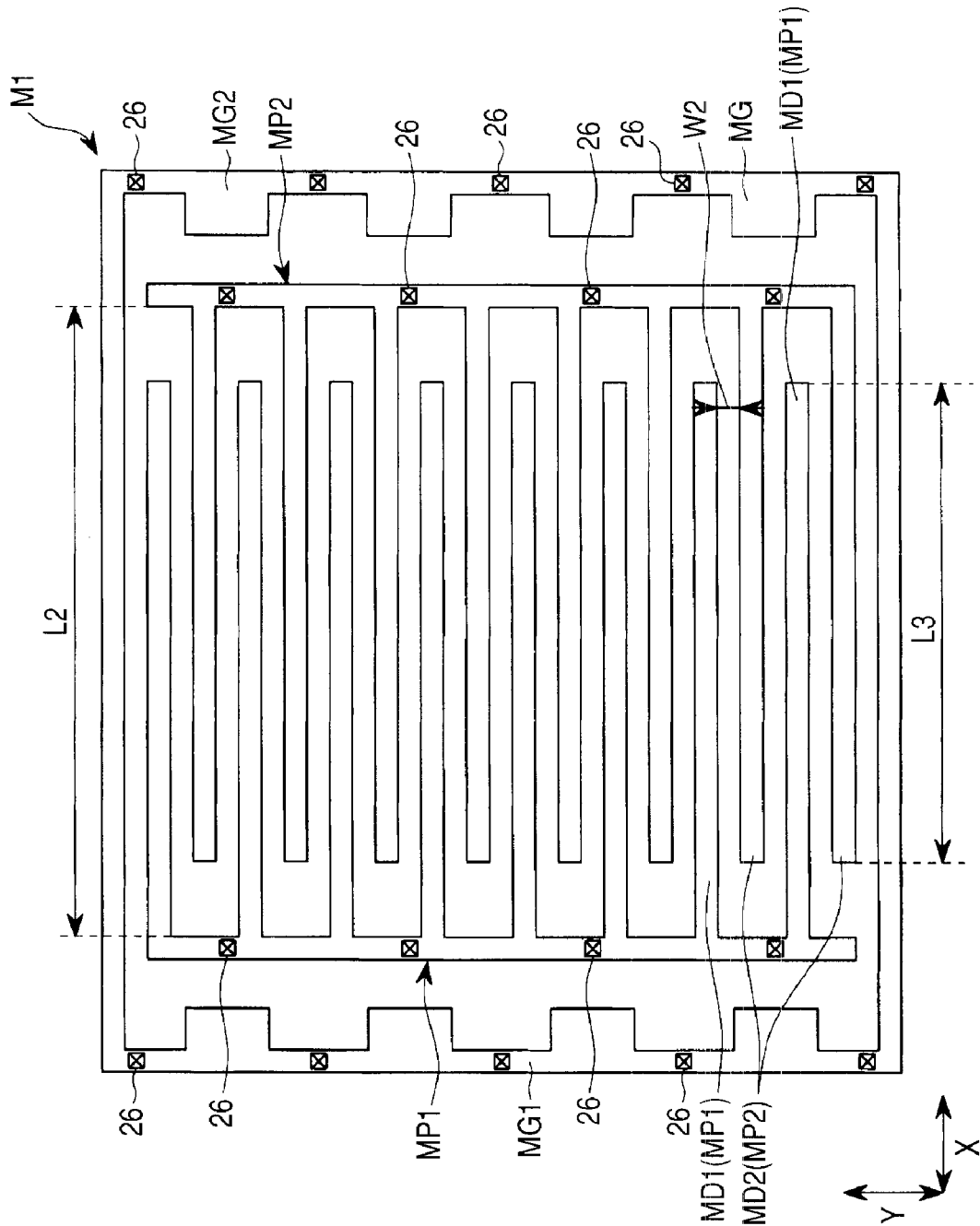
FIG. 16 is a plan view of a substantial part in a semiconductor device according to one embodiment of the present invention.
Figure 17:
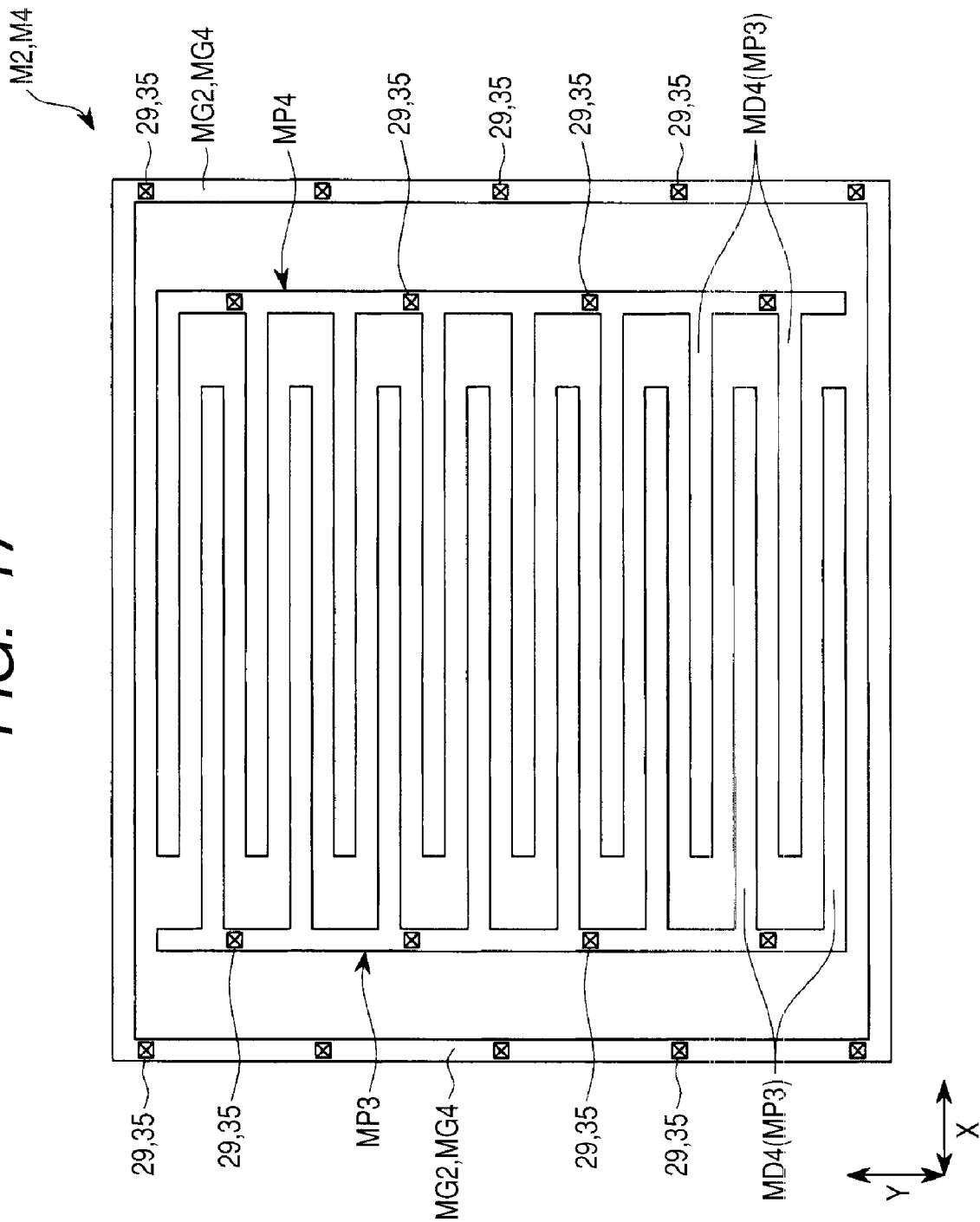
FIG. 17 is a plan view of a substantial part in a semiconductor device according to one embodiment of the present invention.
Figure 18:
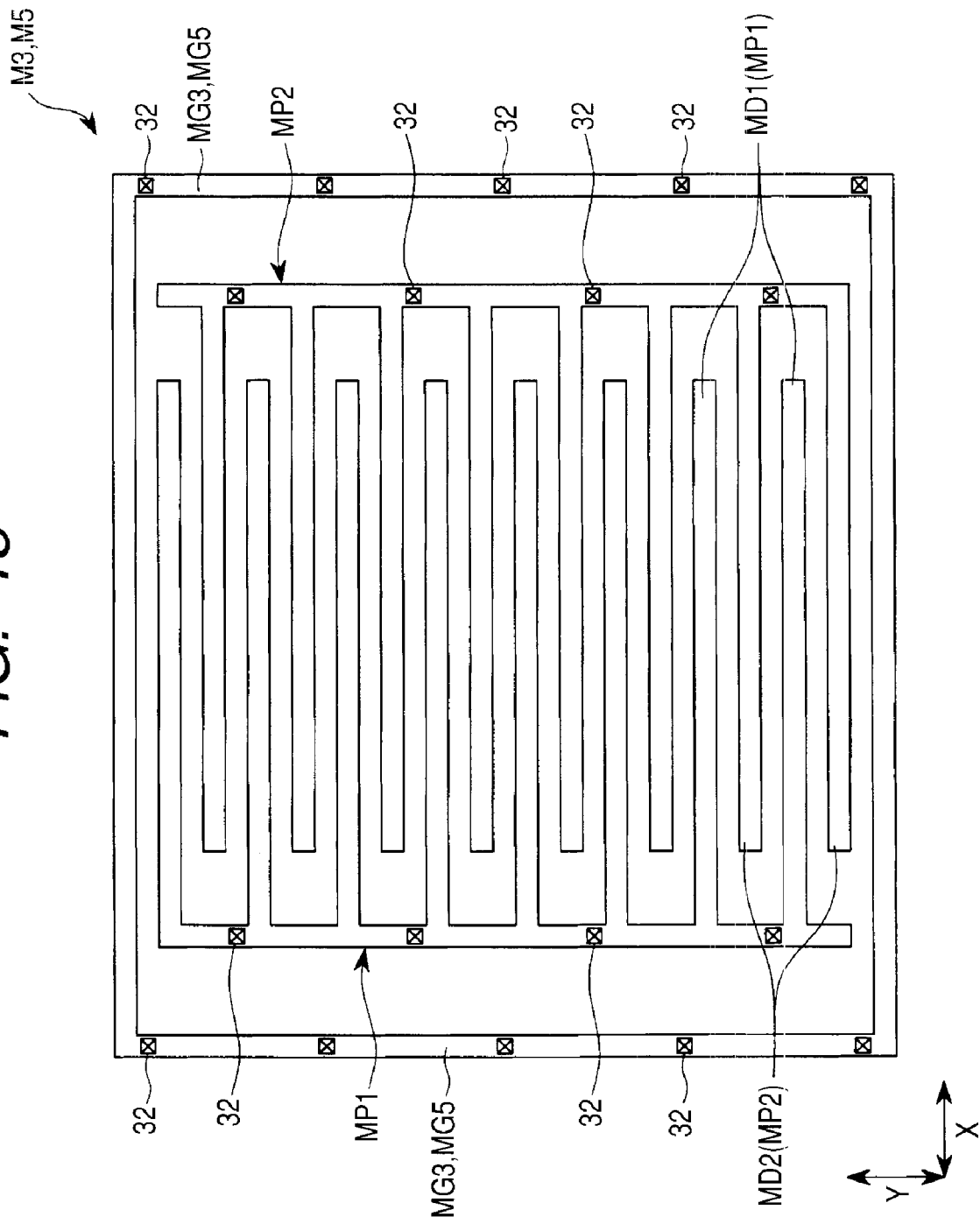
FIG. 18 is a plan view of a substantial part in a semiconductor device according to one embodiment of the present invention.

Moreover, FIG. 15 shows planar layouts of the p-type semiconductor regions 11b and 11c, the conductor pattern 8b, and plugs 23a, 23b in the capacitor formation region. In addition, FIG. 16 shows planar layouts of the wiring M1 (i.e., metal patterns MP1, MP2, and the shielding metal pattern MG1 formed by the wiring M1) and a plug 26 in the capacitor formation region. Similarly, FIG. 17 shows planar layouts of the wirings M2, M4 (i.e., metal patterns MP3, MP4 and shielding metal patterns MG2, MG4 formed by the wirings M2, M4) and a plug 29, 35 in the capacitor formation region. Further, FIG. 18 shows planar layouts of the wiring M3, M5 (i.e., metal patterns MP1, MP2 and shielding metal patterns MG3, MG4 formed by the metal pattern M3, M5) and a plug 32 in the capacitor formation region. Note that the planar layouts of the wiring M2 (i.e., metal patterns MP3, MP4, and MG2 formed by the wiring M2) and the wiring M4 (i.e., metal patterns MP3, MP4, and MG4 formed by the wiring M4) are the same as each other or the planar layouts of the plug 29 and plug 35 are the same as each other in the capacitor formation region, and all the layouts are shown in FIG. 17 at the same time. Similarly, the planar layouts of the wiring M3 (i.e., the metal patterns MP1, MP2, and MG3 formed by the wiring M3) and the wiring M5 (i.e., metal patterns MP1, MP2, and MG5 formed by the wiring M5) are the same as each other in the capacitor formation region, and both of the layouts are shown in FIG. 18 at the same time.

The semiconductor device of the present embodiment has a MISFET (Field Effect Transistor) formed in the MISFET formation region and a capacitance element C1 formed in the capacitor formation region (planer region) different from the MISFET formation region. A specific configuration of the semiconductor device in the present embodiment will be described with reference to FIG. 1 to FIG. 18.

As shown in FIG. 1 to FIG. 7, a semiconductor substrate 1 of the semiconductor device in the present embodiment is made of p-type single crystal silicon having a specific resistance of about 1 to 10 Ocm, for example. The semiconductor substrate 1 of the semiconductor device in the present embodiment has the capacitor formation region (second region) forming the capacitance element C1 and the MISFET formation region (first region) forming the MISFET (Field Effect Transistor), and FIG. 1 to FIG. 6 show the cross-sectional views of this capacitor formation region (second region) and FIG. 7 shows the cross-sectional view of this MISFET formation region (first region).

As shown in FIG. 1 to FIG. 7, an element isolation region 2 (groove filled with insulating material) is formed over the main surface of the semiconductor substrate 1. The element isolation region 2 is a groove (element isolation groove, groove for isolating elements, or groove for forming an element isolation region) formed over the semiconductor substrate 1 and filled with an insulating material (e.g., oxide silicon). That is, the element isolation region 2 is composed of the groove which is formed in the semiconductor substrate 1 and also filled with the insulating material (insulating film). The element isolation region 2 can be formed by an STI (Shallow Trench Isolation) method.

Over the main surface of the semiconductor substrate 1, the element isolation region 2 defines an active region (region which is surrounded by the element isolation region 2 and has not the element isolation region 2 formed therein). That is, an active region 1a defined by the element isolation region 2 is formed over the semiconductor substrate 1 in the MISFET formation region, and active regions 1b, 1c defined by the element isolation region 2 are formed over the semiconductor substrate 1 in the capacitor formation region. The active regions 1a, 1b, and 1c are substrate regions of the semiconductor substrate 1 and correspond to regions where the element isolation region 2 is not formed over the main surface of the semiconductor substrate 1.

The active region 1a in the MISFET formation region is the one for forming the MISFET. On the other hand, the active regions 1b, 1c are not provided for forming a semiconductor element but provided for improving flatness (preventing dishing in the capacitor formation region) over the main surface of the semiconductor substrate 1 in a process forming the element isolation region 2, and the active regions 1b, 1c are presumed to be dummy active regions (dummy active region pattern or dummy pattern).

A p-type well region 3 (semiconductor region or first semiconductor region) is formed over the semiconductor substrate 1 in the capacitor formation region and an n-type well region 4 (semiconductor region) is formed over the semiconductor substrate 1 in the MISFET formation region. Under the p-type well region 3, an n-type well region 5 (semiconductor region) is formed, and around the side plane of the p-type well region 3, an n-type well region 6 (semiconductor region) is formed. Accordingly, the p-type well region 3 is in a state surrounded by the n-type well regions 5 and 6 having the reverse conduction type and thereby the p-type well region 3 is isolated electrically from the other region. A junction plane between the p-type well region 3 and the n-type well region 5 (i.e., the lower plane of the p-type well region 3) is deeper than the bottom of the element isolation region 2, and the p-type well region 3 is formed so as to include the active regions 1b, 1c in a planar manner in the capacitor formation region and also extends below the element isolation region 2.

As shown in FIG. 7, in the MISFET formation region, a p-channel type MISFET Qp (Metal Insulator Semiconductor Field Effect Transistor: MIS-type field effect transistor) is formed over the n-type well region 4 in the active region 1a. The MISFET Qp in the MISFET formation region has a gate insulating film 7 formed over the surface of the n-type well region 4 in the active region 1a and a gate electrode 8a formed over the gate insulating film 7. That is, the gate electrode 8a is formed above the active region 1a defined by the element isolation region 2 in the MISFET formation region via the gate insulating film 7.

On the side plane of the gate electrode 8a is formed a sidewall 10a (side wall spacer, or side wall insulating film) made of an insulating material such as a silicon oxide film, a silicon nitride film, or a laminated film thereof.

In the MISFET formation region, a semiconductor region (p-type impurity-diffused layer) for the source or drain of the MISFET Qp is formed in the n-type well region 4 of the active region 1a, and this semiconductor region for the source or drain has an LDD (Lightly Doped Drain) structure and is composed of a p$^-$-type semiconductor region 9 and a p$^+$-type semiconductor region 11a which has a impurity concentration higher than that of the p$^-$-type semiconductor region 9. The p$^-$-type semiconductor region 9 is formed in the n-type well region 4 under the side wall 10a and the p$^+$-type semiconductor region 11a is formed in the n-type well region 4 outside the gate electrode 8a and the side wall 10a, and thereby the p$^+$-type semiconductor region 11a is formed in the n-type well region 4 at a position separated from a channel region by the p$^-$-type semiconductor region 9.

Over each of the surfaces of the gate electrode 8a and the p$^+$-type semiconductor region 11a (surface layer part), a metal silicide layer (e.g., cobalt silicide ($CoSi_2$) layer) can be formed by a silicide process or the like, but this metal silicide layer is omitted from the drawings for simplicity. This metal silicide layer can reduce a diffusion resistance and a contact resistance of the p$^+$-type semiconductor region 11a or the like.

On the other hand, as shown in FIG. 1 to FIG. 6, in the capacitor formation region, p-type semiconductor regions (p-type impurity-diffused layers or p$^+$-type semiconductor regions) 11b, 11c are formed in a surface layer part of the p-type well region 3 of the active regions 1b, 1c, respectively. Further, in the capacitor formation region, a conductor pattern 8b is formed over the element isolation region 2. The p-type semiconductor regions 11b, 11c (active regions 1b, 1c) and the conductor pattern 8b have patterns as shown in FIG. 8, respectively, in the capacitor formation region.

The p-type semiconductor region 11b, 11c has an impurity concentration higher than that of the p-type well region 3 and is formed by a process introducing p-type impurity (e.g., boron (B)) into the surface layer part of the p-type well region 3, that is, the p-type well region 3 of the active region 1b, 1c, by ion implantation or the like, for example.

The p-type semiconductor regions 11b, 11c are formed in the capacitor formation region where the element isolation region 2 is not formed, that is, in the active regions 1b, 1c defined by the element isolation region 2, respectively. In other words, the element isolation region 2 is formed in a region except for a region (planar region) where the p-type semiconductor regions 11b, 11c are formed, in the capacitor formation region shown in FIG. 8. Accordingly, in the capacitor formation region shown in FIG. 8, a pattern (planar shape) of the p-type semiconductor region 11b corresponds to (is the same as) a pattern (planar shape) of the active region 1b defined (surrounded) by the element isolation region 2, and a pattern (planar shape) of the p-type semiconductor region 11c corresponds to (is the same as) a pattern (planar shape) of the active region 1c defined (surrounded) by the element isolation region 2.

The conductor pattern 8b in the capacitor formation region is composed of a patterned conductor film (conductor layer) and is a conductor pattern in the same layer as that of the gate electrode 8a of the MISFET formation region. Thereby, the conductor pattern 8b in the capacitor formation region and the gate electrode 8a in the MISFET formation region are made of the same material (conductor material) and formed in the same process. For example, the gate electrode 8a and the conductor pattern 8b can be formed by a process in which a conductor film made of a poly-silicon film (doped poly-silicon film) or the like is formed over the entire main surface of the semiconductor substrate 1 and this conductor film is patterned using a photolithography method and a dry etching method. Accordingly, the conductor pattern 8b in the capacitor formation region is formed together (at the same time) in the process forming the gate electrode 8a for the MISFET, and, while the conductor pattern 8b in the capacitor formation region and the gate electrode 8a of the MISFET are made of the conductor film in the same layer, the conductor pattern 8b in the capacitor formation region is a conductor pattern which does not function as a gate electrode of a MISFET, that is, a dummy gate electrode pattern (dummy pattern). The conductor pattern 8b is provided for the flatness improvement (prevention of dishing in the capacitor formation region) of an insulating film 21 in the process planerizing the upper surface of the insulating film 21.

Further, like the gate electrode 8a in the MISFET formation region, the conductor pattern 8b in the capacitor formation region also has a side wall 10b as same as the side wall 10a formed on the side plane thereof. As in the gate electrode 8a and the p$^+$-type semiconductor region 11a, metal silicide layers can be formed also in the upper parts (surface layer parts) of the conductor pattern 8b and the p-type semiconductor regions 11b, 11c, respectively, in the capacitor formation region by the silicide process or the like, but these metal silicide layers are omitted from the drawings for simplicity. Moreover, it is possible to omit forming the metal silicide layers in the upper part of the conductor pattern 8b and the p-type semiconductor regions 11b, 11c, respectively.

AS shown in FIG. 1 to FIG. 7, the insulating film 21 (interlayer insulating film) is formed over the semiconductor substrate 1 so as to cover the gate electrode 8a and the conductor pattern 8b. The insulating film 21 is formed by using a laminated film of a silicon nitride film (lower layer side) and a silicon oxide film (upper layer side) which is thicker than the silicon nitride film, a single layer film of a silicon oxide, or the like.

When the insulating film 21 is formed, an irregular shape is formed on the surface of the insulating film 21 caused by a step in the foundation layer (step of the gate electrode 8a, the conductor pattern 8b, or the like), but, after the formation of the insulating film 21, the upper surface (surface) of the insulating film 21 is subjected to processing such as polishing using the CMP (Chemical Mechanical Polishing) method, and the upper surface (surface) of the insulating film 21 is planarized. Thereby, a structure upper than this insulating film 21 (multilayer wiring structure including the wirings M1 to M5 to be described hereinafter) is formed over the flat upper surface (surface) of the insulating film 21.

A contact hole 22 (opening part, hole, or through-hole) is formed in the insulating film 21 and a plug 23 (conductor part or connection conductor part) is formed by a conductor film mainly made of a tungsten (W) film or the like and embedded within the contact hole 22. Accordingly, the plug 23 is a conductor part embedded in the opening part (here, contact hole 22) formed in the insulating film 21.

In the MISFET formation region, the contact hole 22 and the plug 23 filling the same are formed above the $p^+$-type semiconductor region 11a, above the gate electrode 8a, or the like. On the other hand, in the capacitor formation region, the contact hole 22 and the plug 23 filling the same are formed above the p-type semiconductor region 11c (active region 1c) and above the conductor pattern 8b.

As apparent in FIG. 2 to FIG. 4 and FIG. 15, a contact hole 22a (first opening part) among the contact holes 22 is formed above the p-type semiconductor region 11c in the capacitor formation region and exposes the p-type semiconductor region 11c (or the metal silicide layer in the upper part thereof) at the bottom thereof. Further, a contact hole 22b (second opening part) among the contact holes 22 is formed above the conductor pattern 8b and exposes the conductor pattern 8b (or the metal silicide layer in the upper part thereof) at the bottom thereof. Accordingly, among the plugs 23, a plug 23a embedded in the contact hole 22a (first connection conductor part) is electrically coupled to the p-type semiconductor region 11c (or the metal silicide layer in the upper part thereof) with the bottom of the plug 23a contacting thereto. Similarly, among the plugs 23, a plug 23b embedded in the contact hole 22b (second connection conductor part) is electrically coupled to the conductor pattern 8b (or metal silicide layer in the upper part thereof) with the bottom of the plug 23b contacting thereto.

As shown in FIG. 1 to FIG. 7, a plurality of wiring layers including wirings M1 to M5, that is, the multilayer wiring structure is formed over the insulating film 21.

That is, an insulating film 24 (interlayer insulating film) is formed over the insulating film 21 embedded with the plug 23, and a wiring groove, and the wiring M1 embedded in this wiring groove are formed in this insulating film 24. The wiring M1 can be formed using a Damascene technique (here, single Damascene technique) and can be a copper wiring containing copper as a main component. The wiring M1 is a first layer wiring (wiring layer). The wiring M1 has a pattern as shown in FIG. 9 in the capacitor formation region.

An insulating film 25 (interlayer insulating film) is formed over the insulating film 24 embedded with the wiring M1. A through-hole (opening part, hole, or through-bore) is formed in the insulating film 25, and a plug 26 (conductor part or connection conductor part) is formed and embedded therein. The plug 26 is electrically coupled to the wiring M1 with the bottom thereof contacting the wiring M1 and electrically coupled to the wiring M2 to be described below with the top thereof contacting the wiring M2, and formed at a planar position as shown in FIG. 16, for example, in the capacitor formation region.

An insulating film 27 (interlayer insulating film) is formed over the insulating film 25 embedded with the plug 26, and a wiring groove and the wiring M2 embedded in this wiring groove are formed in this insulating film 27. The wiring M2 is a second layer wiring (wiring layer) in a layer upper than that of the wiring M1 by one layer. The wiring M2 has a pattern as shown in FIG. 10 in the capacitor formation region. The wiring M2 can be formed using the Damascene technique (here, single Damascene technique) and can be a copper wiring containing copper as a main component. The wiring M2 can be formed also using the dual Damascene (Dual-Damascene) technique and the wiring M2 and the plug 26 are formed in an integrated manner in this case.

An insulating film 28, a through-hole (through-hole for a plug 29 formed in the insulating film 28), the plug 29, an insulating film 30, and a wiring M3 are formed over the insulating film 27 embedded with the wiring M2, in the same manner as that of the insulating film 25, the through-hole (through-hole for the plug 26 formed in the insulating film 25), the plug 26, the insulating film 27, and the wiring M2. The plug 29 is electrically coupled to the wiring M2 with the bottom thereof contacting thereto and electrically coupled to the wiring M3 with the top thereof contacting thereto, and formed at a planar position as shown in FIG. 17, for example, in the capacitor formation region.

Similarly, an insulating film 31, a through-hole (through-hole for a plug 32 formed in the insulating film 31), the plug 32, an insulating film 33, and a wiring M4 are formed over the insulating film 30 embedded with the wiring M3, in the same manner as that of the insulating film 25, the through-hole (through-hole for the plug 25 formed in the insulating film 25), the plug 26, the insulating film 27, and the wiring M2. Moreover, an insulating film 34, a through-hole (through-hole for a plug 35 formed in the insulating film 34), the plug 35, an insulating film 36, and a wiring M5 are formed over the insulating film 33 embedded with the wiring M4, in the same manner as that of the insulating film 25, the through-hole (through-hole for the plug 26 formed in the insulating film 25), the plug 26, the insulating film 27, and the wiring M2. The plug 32 is electrically coupled to the wiring M3 with the bottom thereof contacting thereto and electrically coupled to the wiring M4 with the top thereof contacting thereto, and formed at a planar position as shown in FIG. 18, for example, in the capacitor formation region. Further, the plug 35 is electrically coupled to the wiring M4 at the bottom thereof and electrically coupled to the wiring M5 at the top thereof, and formed at a planar position as shown in FIG. 17, for example, in the capacitor formation region.

The wiring M3 is a third layer wiring (wiring layer) in a layer upper than that of the wiring M2 by one layer, the wiring M4 is a fourth layer wiring (wiring layer) in a layer upper than that of the wiring M3 by one layer, and the wiring M5 is a fifth layer wiring (wiring layer) in a layer upper than that of the wiring M4 by one layer. The wiring M3, wiring M4 and wiring M5 have patterns shown in FIG. 11, FIG. 12, and FIG. 13, respectively, in the capacitor formation region. The wirings M3, M4, and M5 can be formed using the Damascene technique (here, single Damascene technique) and embedded in the wiring grooves formed in the insulating films 30, 33, and 36, respectively. The wirings M3, M4, and M5 also can be formed using the dual Damascene technique, and, in this case, the wiring M3 and the plug 29 are formed in an integrated manner, the wiring M4 and the plug 32 are formed in an integrated manner, and the wiring M5 and the plug 35 are formed in an integrated manner. The single Damascene and the dual Damascene may be selectively used for each of the wirings M1 to M5. The wirings M1 to M5 are made mainly of metal (metal material or a material having a metallic conductivity) such as copper. The wirings M1 to M5 are preferably the embedded wirings formed by the Damascene method as in the present embodiment, but the wirings M1 to M5 may be also wirings (e.g., aluminum wirings) formed by patterning of conductor films (metallic films), for another embodiment.

Over the insulating film 36 embedded with the wiring M5, further upper layers such as an insulating film, a wiring layer, a bonding pad, and a passivation film as the uppermost layer are formed as needed, but drawing and description thereof are omitted here.

Next, a production process of the semiconductor device in the present embodiment will be described with reference to the drawings. FIG. 19 to FIG. 30 are cross-sectional views of substantial parts of the semiconductor device in the present embodiment during the production process. Among FIG. 19 to FIG. 30, FIG. 19, FIG. 21, FIG. 23, FIG. 25, FIG. 27, and FIG. 29 show a region corresponding to the above FIG. 1, and FIG. 20, FIG. 22, FIG. 24, FIG. 26, FIG. 28, and FIG. 30 show a region corresponding to the above FIG. 7. Further, FIG. 19 and FIG. 20 correspond to the same process step, FIG. 21 and FIG. 22 correspond to the same process step, FIG. 23 and FIG. 24 correspond to the same process step, FIG. 25 and FIG. 26 correspond to the same process step, FIG. 27 and FIG. 28 correspond to the same process step, and FIG. 29 and FIG. 30 correspond to the same process step.

Figure 19:
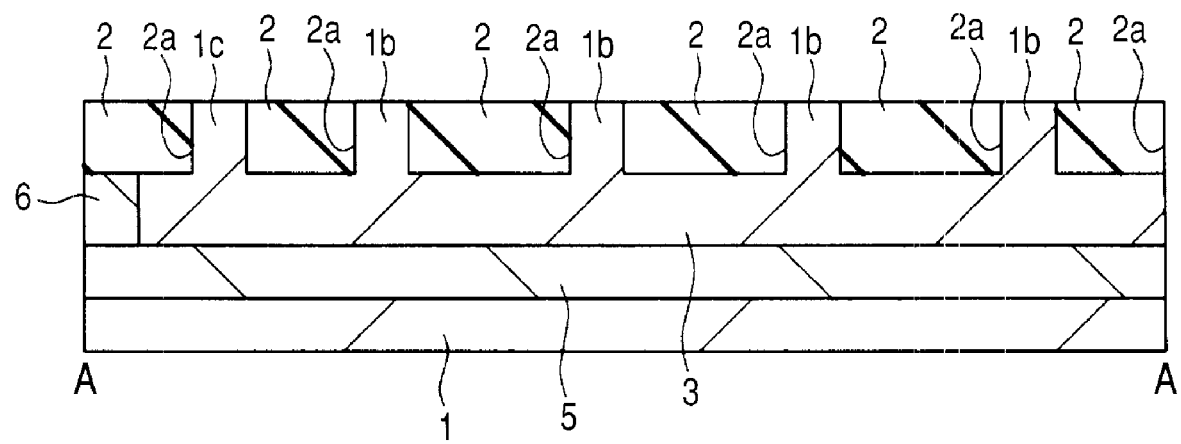
FIG. 19 is a cross-sectional view of a substantial part in a semiconductor device in a production process according to one embodiment of the present invention.
Figure 20:
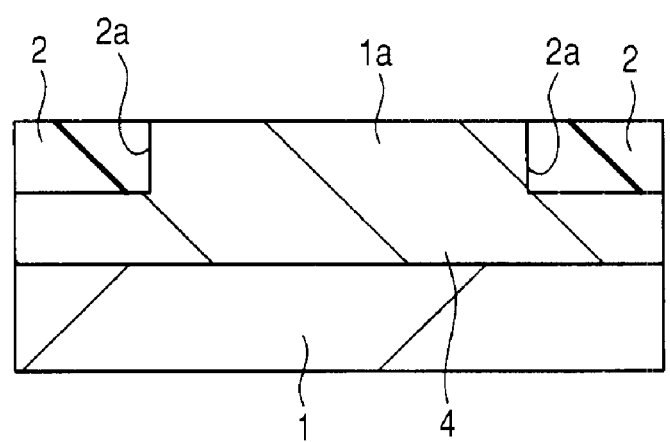
FIG. 20 is a cross-sectional view of a substantial part in a semiconductor device in the same production process as that of FIG. 19.

First, as shown in FIG. 19 and FIG. 20, the semiconductor substrate 1 (semiconductor wafer) made of p-type single crystal silicon or the like having a specific resistance of about 1 to 10 Ocm, for example, is prepared.

Next, the element isolation region 2 is formed over the semiconductor substrate 1. The element isolation region 2 can be formed as follows, for example. First, the semiconductor substrate 1 is oxidized thermally and a silicon oxide film having a thickness of about 10 nm (not shown in the drawings), for example, is formed over the surface thereof, and after that, a silicon nitride film having a thickness of about 100 nm (not shown in the drawings), for example, is deposited in an upper layer thereof by a CVD method or the like. Then, a groove 2a (element isolation groove) having a depth of about 300 nm, for example, is formed over the semiconductor substrate 1 in a region where the element isolation region is to be formed, by a process which dry-etches sequentially the silicon nitride film, the silicon oxide film and the semiconductor substrate 1, using a photo-resist pattern (not shown in the drawings) formed on the silicon nitride film as an etching mask. The groove 2a is a groove for forming the element isolation region 2. After that, the above silicon nitride film is removed by wet etching. After the groove 2a is formed over the semiconductor substrate 1 in this manner, an insulating film (made of a silicon oxide film or silicon nitride film) having a thickness of about 10 nm, for example, is formed over the main surface of the semiconductor substrate 1 including the inside (side plane and bottom part) of the groove 2a and then an insulating film thicker than the above insulating film is formed (deposited) over the main surface of the semiconductor substrate 1 so as to fill the inside of the groove 2a by the CVD method or the like. This thick insulating film is a silicon oxide film, an $O_3$-TEOS oxide film, or the like, formed by an HDP-CVD (High Density Plasma CVD) method. Note that the $O_3$-TEOS oxide film is a silicon oxide film formed by a thermal CVD method using $O_3$ (ozone) and TEOS (Tetraethoxysilane, also called Tetra Ethyl Ortho Silicate) as source gas. After the formation (deposition) of the thick insulating film, this thick insulating film is polished by the CMP method, and the insulating film outside the grove 2a is removed while the insulating film inside the groove 2a is left, and thereby the element isolation region 2 is formed. After that, the insulating film embedded in the groove 2a also can be hardened by a heat treatment of the semiconductor substrate 1.

In this manner, the element isolation region 2 made of the groove 2a embedded with the insulating material (insulating film) (in other words, insulating film embedded in the groove 2a) is formed. In the present embodiment, the element isolation region 2 is formed not by an LOCOS (Local Oxidization of Silicon) method but preferably by the STI (Shallow Trench Isolation) method. That is, the element isolation region 2 of the present embodiment is preferably a region where the insulating material (insulating film) is embedded in the groove 2a formed over the semiconductor substrate 1. By the formation of the element isolation region 2, the active regions 1a, 1b, and 1c, surrounding of which is defined (surrounded) by the element isolation regions 2, are formed over the semiconductor substrate 1. Among the active regions, the active region 1a is formed in the MISFET formation region, and the active regions 1b and 1c are formed in the capacitor formation region.

Next, the p-type well region 3, n-type well region 4, n-type well region 5 and n-type well region 6 are formed over the semiconductor substrate 1. The p-type well region 3 can be formed by ion implantation or the like of a p-type impurity (e.g., boron (B)) into a part of the semiconductor substrate 1, and the n-type well region 4, n-type well region 5, and n-type well region 6 can be formed by ion implantation or the like of an n-type impurity (e.g., phosphorus (P) or arsenic (As)) into a part of the semiconductor substrate 1. The p-type well region 3 is formed so as to include the active regions 1b, 1c in the capacitor formation region, and the n-type well region 4 is formed so as to include the active region 1a in the MISFET formation region.

Next, after the surface of the semiconductor substrate 1 is cleaned (washed) by a process such as wet etching using hydrofluoric (HF) acid, for example, an insulating film 7a for gate insulation is formed over the surface of the semiconductor substrate 1 (i.e., surface of the active region defined by the element isolation region 2). The insulating film 7a (gate insulating film 7) is made of a thin silicon oxide film or the like and can be formed by a process such as a thermal oxidation method, for example. At this time, the insulating film 7a is formed not only over the surface of the n-type well 4 in the MISFET formation region but also over the surface of the p-type well region 3 in the capacitor formation region, but the insulating film 7a in the p-type well region 3 is removed afterward (for example, in a patterning process of a conductor film 8).

Figure 21:
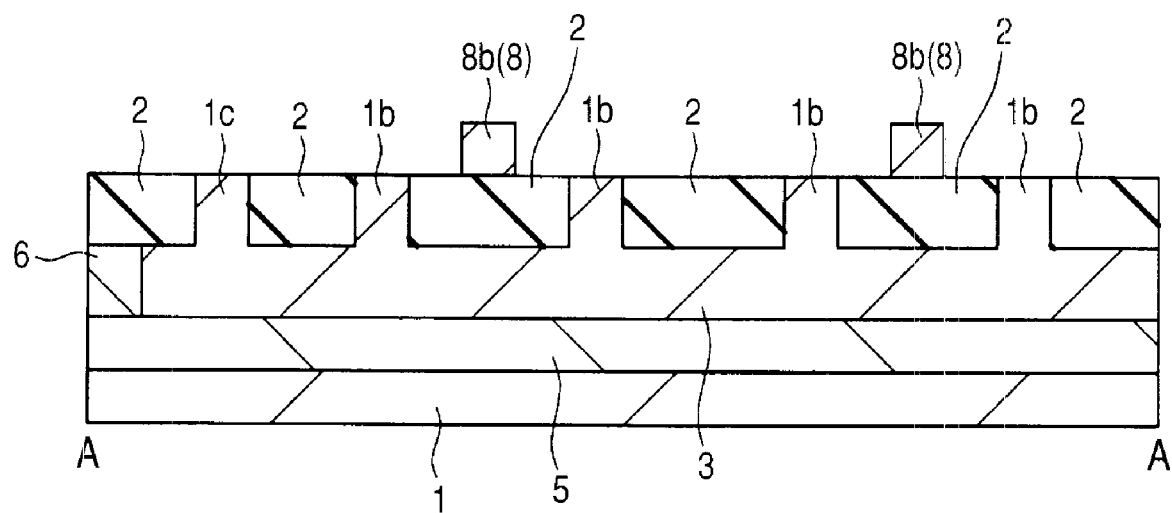
FIG. 21 is a cross-sectional view of a substantial part of a semiconductor device in a production process subsequent to that of FIG. 19.
Figure 22:
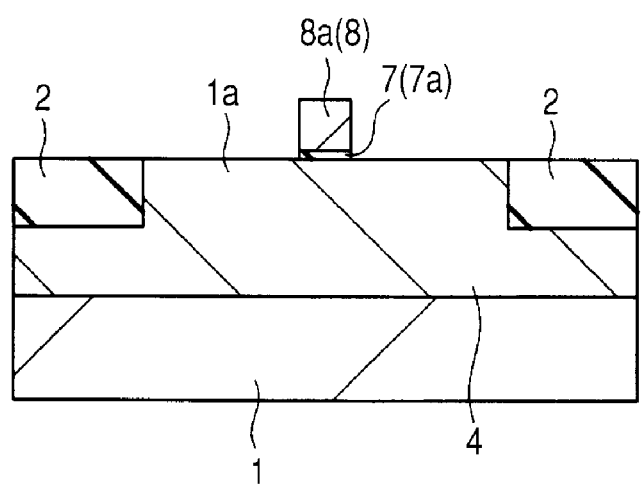
FIG. 22 is a cross-sectional view of a substantial part in a semiconductor device in the same production process as that of FIG. 21.

Next, the conductor film 8 for forming the gate electrode is formed over the entire main surface of the semiconductor substrate 1. The conductor film 8 is made of a poly-silicon film (doped poly-silicon film) or the like, for example. Then, by a process which patterns the conductor film 8 using the photo-lithography method and the dry-etching method, the gate electrode 8a and the conductor pattern 8b are formed. Both of the gate electrode 8a and the conductor pattern 8b are made of the patterned conductor film 8, and the gate electrode 8a is formed above the n-type well 4 in the MISFET formation region via the insulating film 7a and the conductor pattern 8b is formed over the element isolation region 2 in the capacitor formation region. The insulating film 7a remaining under the gate electrode 8a becomes the gate insulating film 7. The structures shown in FIG. 21 and FIG. 22 are obtained in this manner. The conductor pattern 8b formed in the capacitor formation region does not function as a gate electrode of a MISFET, but the conductor pattern 8b is a conductor pattern formed in the same layer and by the same process as those of the gate electrode 8a in the MISFET formation region and can be presumed as a dummy gate electrode.

Figure 23:
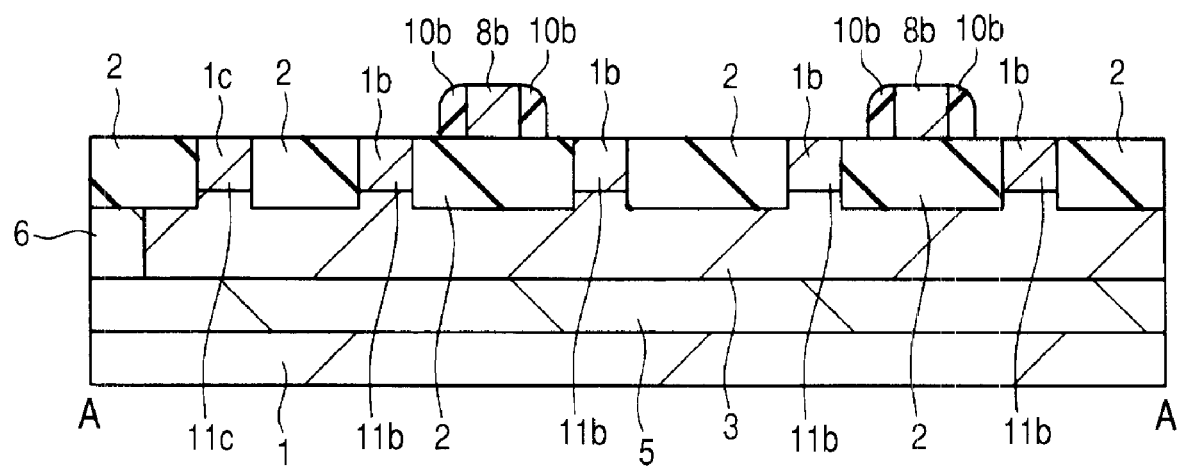
FIG. 23 is a cross-sectional view of a substantial part of a semiconductor device in a production process subsequent to that of FIG. 21.
Figure 24:
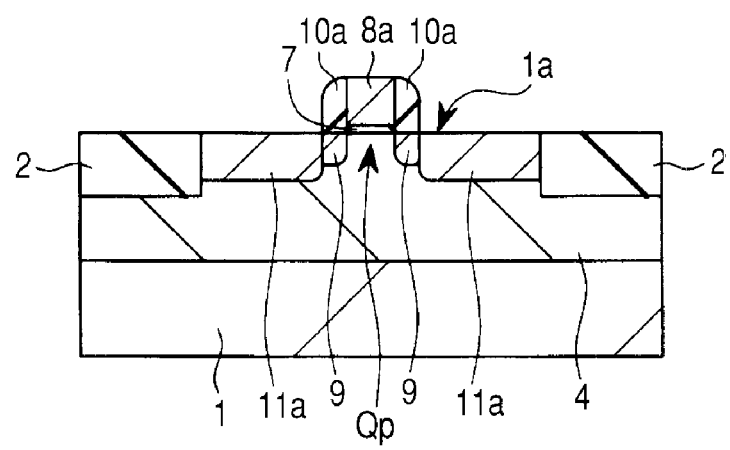
FIG. 24 is a cross-sectional view of a substantial part in a semiconductor device in the same production process as that of FIG. 23.

Next, as shown in FIG. 23 and FIG. 24, P⁻-type semiconductor regions 9 are formed in regions of the n-type well 4 on both sides of the gate electrode 8a by the ion-implantation of the p-type impurity such as boron (B).

Next, the side wall 10a is formed on the side plane of the gate electrode 8a. The side wall 10a is formed by a process depositing a silicon oxide film, a silicon nitride film, or a laminated film thereof, for example, over the semiconductor substrate 1 and etching this silicon oxide film, silicon nitride film, or laminated film in an anisotropic manner by an RIE (Reactive Ion Etching) or the like. When the side wall 10a is formed on the side plane of the gate electrode 8a, a side wall 10b as same as the side wall 10a is formed also on the side plane of the conductor pattern 8b.

Next, the p⁺-type semiconductor regions 11a are formed in regions of the n-type well 4 on both sides of the gate electrode 8a and the side walls 10a by the ion-implantation or the like of the p-type impurity such as boron (B). In the ion-implantation forming the p⁺-type semiconductor region 11a, a p-type impurity is introduced (ion-implanted) into also the surface layer part of the active region (active region defined by the element isolation region 2) in the capacitor formation region and thereby the p-type semiconductor regions 11b, 11c can be formed in the capacitor formation region. While it is preferable to reduce the number of processes by forming the p-type semiconductor regions 11b, 11c of the capacitor formation region in the same process as that of forming the p⁺-type semiconductor region 11a in the MISFET formation region in this manner, the p⁺-type semiconductor region 11a in the MISFET formation region and the p-type semiconductor regions 11b, 11c in the capacitor formation regions also can be formed in different processes (different ion-implantation processes), respectively. After the ion-implantation, annealing processing (heat treatment) also can be provided for activating the introduced impurity.

Next, the surfaces of the gate electrode 8a and the p⁺-type semiconductor region 11a are exposed and metal silicide layers (not shown in the drawings) also can be formed over the surfaces of the gate electrode 8a and the p⁺-type semiconductor region 11a, respectively, by a process depositing and heat-treating a metal film such as a cobalt (Co) film, for example. After that, the metal film, which remains unreacted, is removed. In the process forming the metal silicide layer in the MISFET formation region, the metal silicide layers are formed also over the conductor pattern 8b and the p-type semiconductor regions 11b, 11c, respectively, in the capacitor formation region.

When the metal silicide layers are necessary over the gate electrode 8a and the p⁺-type semiconductor region 11a respectively, in the MISFET formation region and the metal silicide layer is not necessary over the conductor pattern 8b or the p-type semiconductor regions 11b, 11c in the capacitor formation region, for example, a metal film for forming the metal silicide layer may be formed after an insulating film (e.g., silicon oxide film) pattern, such as one which exposes the MISFET formation region and also covers the capacitor formation region, is formed over the semiconductor substrate 1. This insulating film pattern functions as a film for preventing silicide formation. By the process heat-treating and removing the metal film after that, the metal silicide layers may be formed over the gate electrode 8a and the p⁺-type semiconductor region 11a in the MISFET formation region, respectively, but the metal silicide layer may not be formed over the conductor pattern 8b or the p-type semiconductor regions 11b, 11c in the capacitor formation region.

Figure 25:
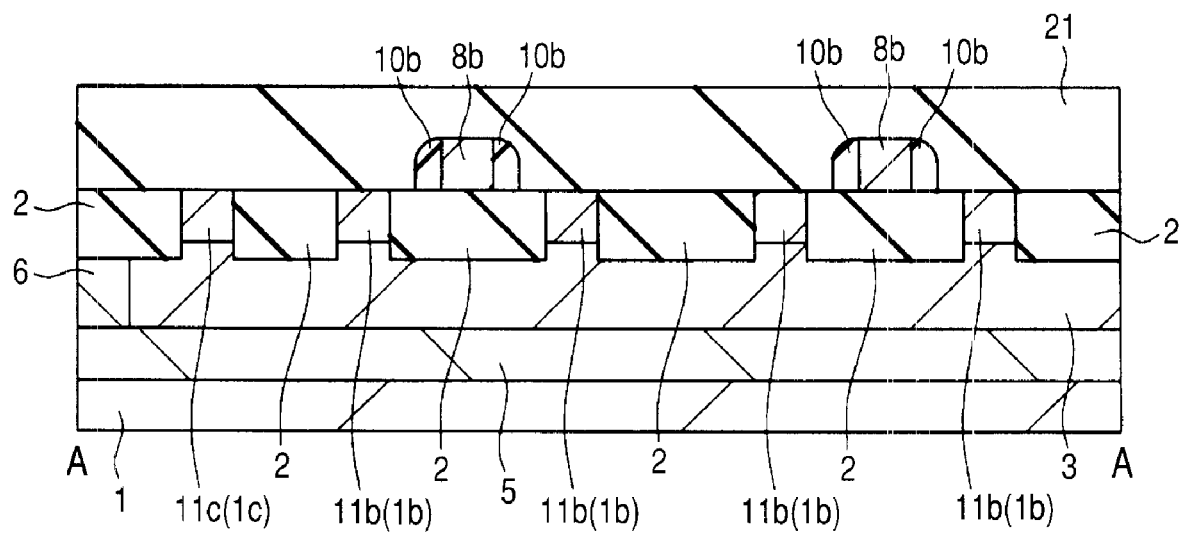
FIG. 25 is a cross-sectional view of a substantial part of a semiconductor device in a production process subsequent to that of FIG. 23.
Figure 26:
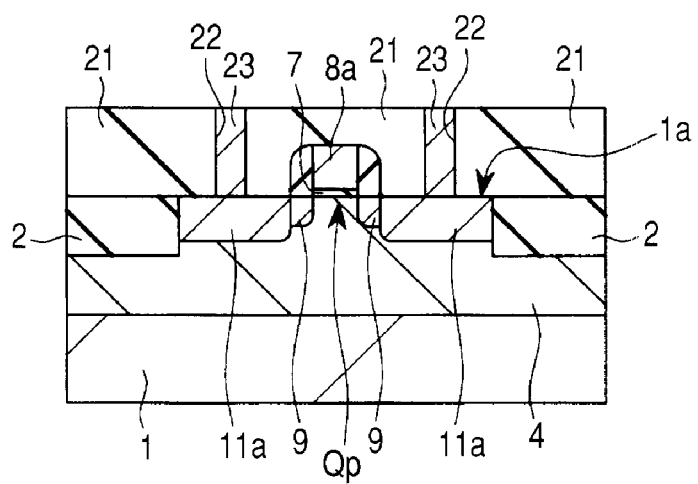
FIG. 26 is a cross-sectional view of a substantial part in a semiconductor device in the same production process as that of FIG. 25.

Next, as shown in FIG. 25 and FIG. 26, the insulating film 21 (interlayer insulating film) is formed over the semiconductor substrate 1 so as to cover the gate electrode 8a and the conductor pattern 8b using the CVD method or the like. The insulating film 21 is made of, for example, a single silicon oxide film, a laminated film of a silicon nitride film and a silicon oxide film thereon, or the like. When the insulating film 21 is formed, an irregular shape is formed on the upper surface of the insulating film 21 caused by steps of the foundation layer (such as steps of the gate electrode 8a and the conductor pattern 8b). After the formation of the insulating film 21, the upper surface (surface) of the insulating film 21 is subjected to processing such as polishing using the CMP method, and the upper surface of the insulating film 21 is planarized. Thereby, heights of the upper surface of the insulating film 21 become approximately the same with one another in the MISFET formation region, the capacitor formation region and the other regions.

Next, the contact hole 22 is formed in the insulating film 21 by dry-etching of the insulating film 21 using a photo-resist pattern (not shown in the drawings), which is formed on the insulating film 21 by the photo-lithography method as an etching mask. At this time, for suppressing over etching, the insulating film 21 is made of the laminated film of the silicon nitride film (lower layer side) and the silicon oxide film (upper layer side) which is thicker than the silicon oxide film, and the contact hole 22 is formed in the silicon oxide film by dry-etching of the silicon oxide film using the silicon nitride film on the lower layer side as an etching stopper and then the contact hole 22 is opened through the insulating film 21 by dry-etching of the silicon nitride film at the bottom part of the contact hole 22.

Next, the plug 23 is formed within the contact hole 22. At this time, for example, after a conductive barrier film is formed over the insulating film 21 including the inside of the contact hole 22 by a sputtering method or the like, a main conductor made of tungsten (W) film or the like is formed over the conductive barrier film by the CVD method or the like so as to fill the contact hole 22, and the unnecessary main conductor film and conductive barrier film on the insulating film 21 are removed by the CMP method, an etch-back method, or the like. Thereby, the remaining main conductor film and the conductive barrier film embedded within the contact hole 22 can form the plug 23.

Figure 27:
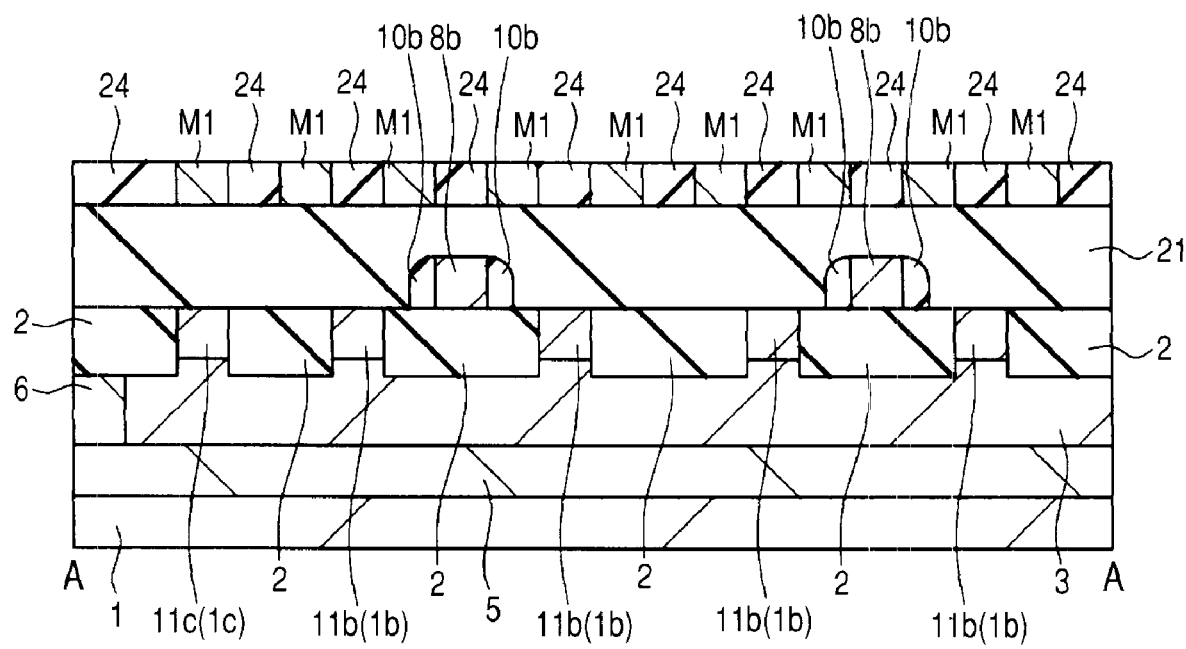
FIG. 27 is a cross-sectional view of a substantial part of a semiconductor device in a production process subsequent to that of FIG. 25.
Figure 28:
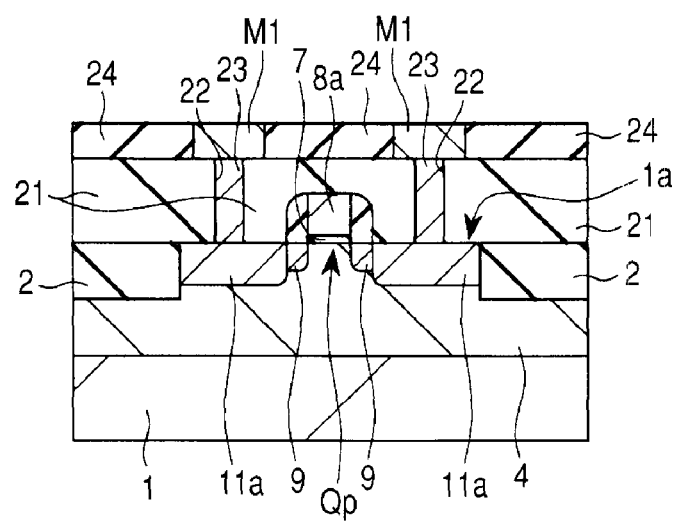
FIG. 28 is a cross-sectional view of a substantial part in a semiconductor device in the same production process as that of FIG. 27.

Next, as shown in FIG. 27 and FIG. 28, the insulating film 24 is formed over the insulating film 21 embedded with the plug 23. Then, the wiring groove (opening part) is formed in the insulating film 24 by dry-etching of the insulating film 24 using a photo-resist pattern (not shown in the drawings), which is formed on the insulating film 24 by the photo-lithography method, as an etching mask.

Next, the wiring M1 is formed in the wiring groove formed in the insulating film 24. At this time, for example, after a barrier conductor film (e.g., titanium nitride film) is formed over the insulating film 24 including the inside (bottom part and side plane) of the wiring groove, a copper seed layer is formed over the barrier conductor film by the CVD method, the sputtering method, or the like, and further a plated copper film is formed over the seed layer using an electro-plating method or the like to fill the inside of the wiring groove. Then, the plated copper film, the seed layer, and the barrier conductor film are removed in the region except for the wiring groove by the CMP method, and the plated copper film, the seed layer, and the barrier conductor film are left within the wiring groove to form the wiring M1 containing copper as a main conductor material.

Figure 29:
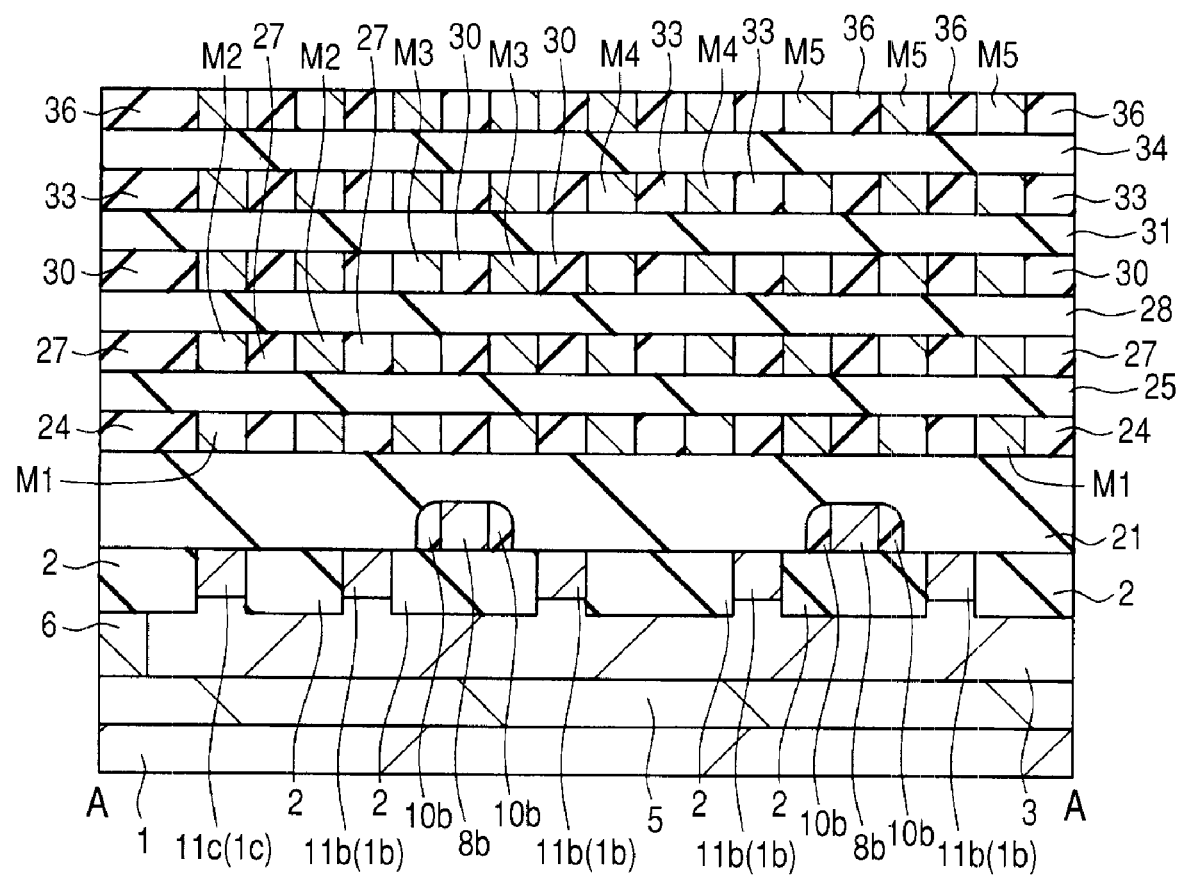
FIG. 29 is a cross-sectional view of a substantial part of a semiconductor device in a production process subsequent to that of FIG. 27.
Figure 30:
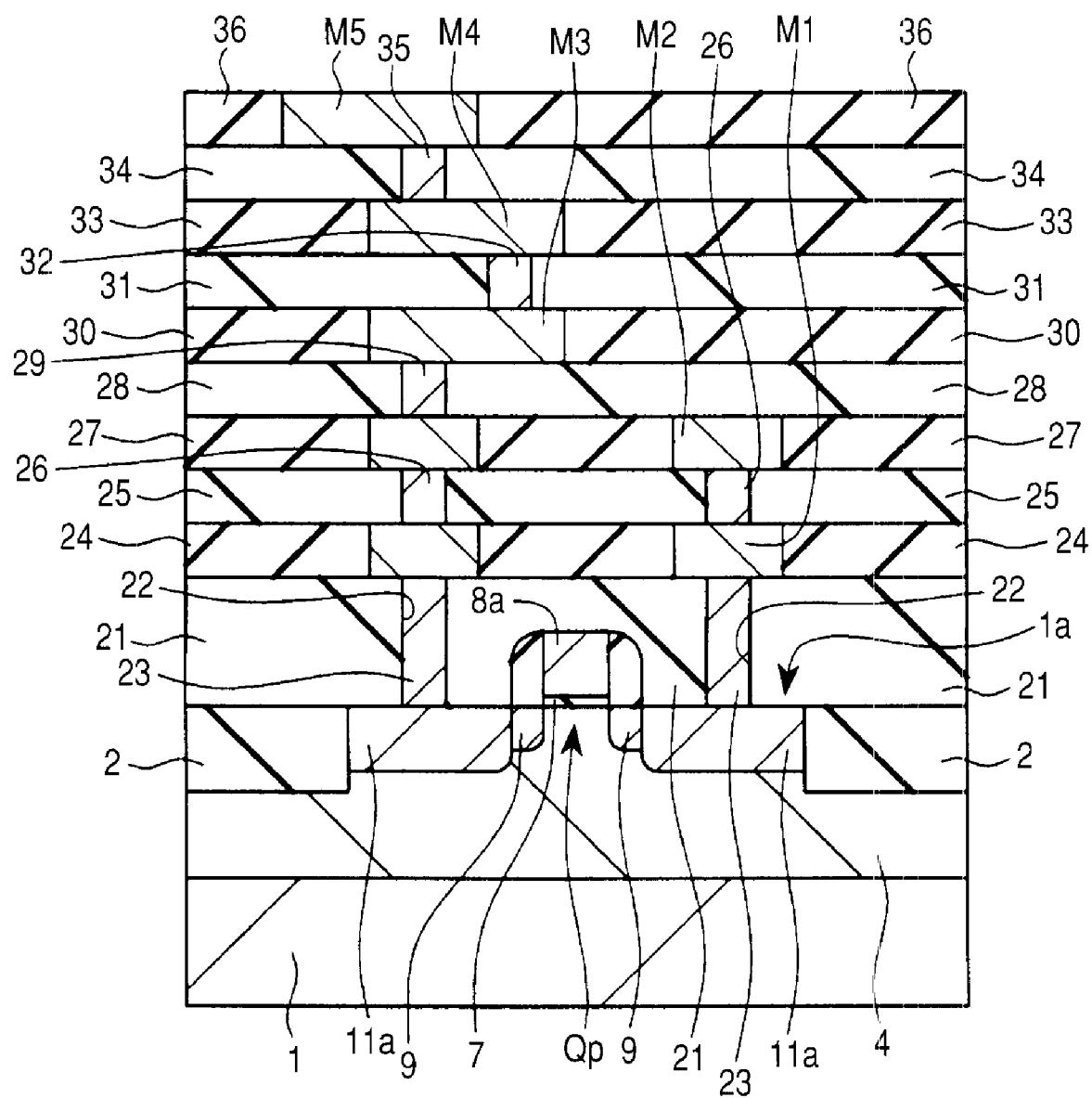
FIG. 30 is a cross-sectional view of a substantial part in a semiconductor device in the same production process as that of FIG. 29.

Next, as shown in FIG. 29 and FIG. 30, the insulating film 25 (interlayer insulating film) is formed over the insulating film 24 embedded with the wiring M1, and a through-hole is formed in the insulating film 25 using the photo-lithography method and the dry-etching method, and the plug 26 is formed in this through-hole. The plug 26 can be formed by approximately the same process as that of embedding the wiring M1 into the wiring groove.

Next, the insulating film 27 (interlayer insulating film) is formed over the insulating film 25 embedded with the plug 26, a wiring grove is formed in the insulating film 27 using the photo-lithography method and the dry-etching method, and the wiring M2 is formed within the wiring groove formed in the insulating film 27. The wiring M2 can beformed in approximately the same manner as that of the wiring M1.

Next, the insulating film 28, a through-hole (through-hole for the plug 29), the plug 29, the insulating film 30, a wiring groove (wiring groove for the wiring M3) and the wiring M3 are formed in the same manner as that of the insulating film 25, the through-hole (through-hole for the plug 26), the plug 26, the insulating film 27, the wiring groove (wiring groove for the wiring M2) and the wiring M2. Further, similarly, the insulating film 31, a through-hole (through-hole for the plug 32), the plug 32, the insulating film 33, a wiring groove (wiring groove for the wiring M4) and the wiring M4 are formed, and the insulating film 34, a through-hole (through-hole for the plug 35), the plug 35, the insulating film 36, a wiring groove (wiring groove for the wiring M5), and the wiring M5 are formed.

While the case of forming wirings M2 to M5 using the single Damascene technique is described, the wirings M2 to M5 can be formed also using the dual Damascene technique, and, in this case, the wiring and the plug are formed in an integrated manner.

Over the insulating film 36 embedded with the wiring M5, further higher layers such as an insulating film, a wiring layer, a bonding pad, and a passivation film of the uppermost layer are formed as needed, but drawing and description thereof will be omitted here.

Next, a structure of the semiconductor device, particularly a structure of the capacitor formation region, will be described in more detail.

As apparent from FIG. 9 to FIG. 13, the planar layouts (planar pattern shapes) of the wiring M1, wiring M3, and wiring M5 are the same as one another in the capacitor formation region and also the planar layouts (planar pattern shapes) of the wiring M2 and wiring M4 are the same as each other in the capacitor formation region. That is, in the capacitor formation region, the wirings having two kinds of layouts (wirings M1, M3, and M5, and wirings M2 and M4) accumulated alternately to form the first layer wiring to the fifth layer wiring. Note that the wiring M1 is different from the wirings M3 and M5 in the planar layout in which the shielding metal pattern MG1 of the wiring M1 has a contact part MGC for connecting to the conductor pattern 8b.

As shown in FIG. 9, FIG. 11, and FIG. 13 (plan views), each of the wirings M1, M3, and M5 includes, in the capacitor formation region, a plurality of wiring parts MD1, MD2 (electrode parts and conductor parts) extending in an X direction, a wiring part MC1 (coupling part or conductor part) extending in a Y direction for coupling the ends of the wiring parts MD1, and a wiring part MC2 (coupling part or conductor part) extending in the Y direction for coupling the ends of the wiring parts MD2. Between the wiring part MC1 and the wiring part MC2 extending in the Y direction, the wiring parts MD1 and the wiring parts MD2 extending in the X direction are arranged alternately at a given spacing (preferably at the same spacing). The X direction and the Y direction are directions crossing each other, and preferably directions perpendicular to each other. Further, the X direction and the Y direction are directions parallel to the main surface of the semiconductor substrate 1 and also parallel to the upper surface of the insulating film 21. In addition, the wiring widths (widths or sizes in the Y direction) of the respective wiring parts MD1, MD2 are preferably the same as each other.

Each of the wiring parts MD1 is coupled to the wiring part MC1 on one end side (left end side in FIG. 9, FIG. 11, and FIG. 13) and also is separated from the wiring part MC2 on the other end side (right end side in FIG. 9, FIG. 11, and FIG. 13). Each of the wiring parts MD2 is separated from the wiring part MC1 on one end side (left end side in FIG. 9, FIG. 11, and FIG. 13) and also is coupled to the wiring part MC2 on the other end side (right end side in FIG. 9, FIG. 11, and FIG. 13).

Accordingly, in each of the wirings M1, M3, and M5, the wiring parts MD1 and the wiring part MC1 coupling them are formed in an integrated manner to form a comb-shaped metal pattern MP1 (conductor pattern, wiring pattern, or metal pattern), and also the wiring parts MD2 and the wiring part MC2 coupling them are formed in an integrated manner to form a comb-shaped metal pattern MP2 (conductor pattern, wiring pattern, or metal pattern). Then, in each of the wirings M1, M3, and M5, the metal pattern MP1 (first metal pattern) composed of the wiring parts MD1, MC1 and the metal pattern MP2 (second metal pattern) composed of the wiring parts MD2, MC2 face each other via the insulating film (insulating film 24 for the wiring M1, insulating film 30 for the wiring M3, and insulating film 36 for the wiring M5) therebetween in a planar direction (in the direction parallel to the main surface of the semiconductor substrate 1).

Further, in the capacitor formation region, the planar layouts of the wiring M1, wiring M3, and wiring M5 are approximately the same as one another except for a point where the shielding metal pattern MG1, to be described hereinafter, of the wiring M1 has the contact part MGC for coupling to the conductor pattern 8b. Accordingly, the respective wiring parts MD1 of the wiring M1, wiring M3, and wiring M5, the respective wiring parts MD2 of the wiring M1, wiring M3, and wiring M5, the respective wiring parts MC1 of the wiring M1, wiring M3, and wiring M5, or the respective wiring parts MC2 of the wiring M1, wiring M3, and wiring M5 are disposed (preferably having the same planar sizes) at positions where they overlap one another in a planar manner (preferably at the same planar position). That is, the metal pattern MP1 of the wiring M1, the metal pattern MP1 of the wiring M3, and the metal pattern MP1 of the wiring M5, though formed in different layers, are disposed (preferably having the same planar size and planar shape) at positions which overlap one another in a planar manner (preferably at the same planar position). Similarly, the metal pattern MP2 of the wiring M1, the metal pattern MP2 of the wiring M3, and the metal pattern MP2 of the wiring M5, though formed in different layers, are disposed (preferably having the same planar size and planar shape) at positions which overlap one another in a planar manner (preferably at the same planar position). Note that to "overlap in a planar manner" means to overlap when the main surface of the semiconductor substrate 1 is viewed from a direction vertical to the main surface of the semiconductor substrate 1.

As shown in FIG. 10 and FIG. 12, each of the wirings M2, M4 includes, in the capacitor formation region, a plurality of wiring parts MD3, MD4 (electrode parts or conductor parts) extending in the X direction, a wiring part MC3 (coupling part or conductor part) extending in the Y direction for coupling the ends of the wiring parts MD4, and a wiring part MC4 (coupling part or conductor part) extending in the Y direction for coupling the ends of the wiring parts MD3. Between the wiring part MC3 and the wiring part MC4 extending in the Y direction, the wiring parts MD3 and the wiring parts MD4 extending in the X direction are arranged alternately at a given spacing (preferably at the same spacing) in the Y direction. The wiring widths of the respective wiring parts MD3, MD4 are preferably the same as each other. Further, the wiring widths (widths or sizes in the Y direction) of the respective wiring parts MD1 to MD4 are more preferably the same as one another and thereby it is possible to increase a capacitance value of the capacitance element C1 efficiently.

Each of the wiring parts MD3 is separated from the wiring part MC3 on one end side (left end side in FIG. 10 and FIG. 12) and also is coupled to the wiring part MC4 on the other end side (right end side in FIG. 10 and FIG. 12). Each of the wiring parts MD4 is coupled to the wiring part MC3 on one end side (left end side in FIG. 10 and FIG. 12) and also is separated from the wiring part MC4 on the other end side (right end side in FIG. 10 and FIG. 12).

Accordingly, in each of the wirings M2 and M4, the wiring parts MD3 and the wiring part MC4 coupling them are formed in an integrated manner to form a comb-shaped metal pattern MP4 (conductor pattern, wiring pattern, or metal pattern), and also the wiring parts MD4 and the wiring part MC3 coupling them are formed in an integrated manner to form a comb-shaped metal pattern MP3 (conductor pattern, wiring pattern, or metal pattern). Then, in each of the wirings M2 and M4, the metal pattern MP4 (fifth metal pattern) composed of the wiring parts MD3 and MC4 and the metal pattern MP3 (fourth metal pattern) composed of the wiring parts MD4 and MC3 face each other via the insulating film (insulating film 27 for the wiring M2, and insulating film 33 for the wiring M4) therebetween in the planar direction (in the direction parallel to the main surface of the semiconductor substrate 1).

Further, in the capacitor formation region, the planar layouts of the wiring M2 and wiring M4 are approximately the same as each other, and, therefore, the respective wiring parts MD3 of the wiring M2 and wiring M4, the respective wiring parts MD4 of the wiring M2 and wiring M4, the respective wiring parts MC3 of the wiring M2 and wiring M4, or the respective wiring parts MC4 of the wiring M2 and wiring M4 are disposed (preferably having the same planar sizes) at positions which overlap each other in a planar manner (preferably at the same planar position). That is, the metal pattern MP3 of the wiring M2, and the metal pattern MP3 of the wiring M4, though formed in different layers, are disposed (preferably having the same planar size and planar shape) at positions which overlap each other in a planar manner (preferably at the same planar position). Similarly, the metal pattern MP4 of the wiring M2 and the metal pattern MP4 of the wiring M4, though formed in different layers, are disposed (preferably having the same planar size and planar shape) in positions which overlap each other in a planar manner (preferably at the same planar position).

Then, the wiring part MD3 of the metal pattern MP4 in the wiring M2 or M4 and the wiring part MD1 of the metal pattern MP1 in the wiring M1, M3, or M5 are formed (preferably having the same planar size) at positions which overlap each other in a planar manner (preferably at the same planar position), and also the wiring part MD4 of the metal pattern MP3 in the wiring M2 or M4 and the wiring part MD2 of the metal pattern MP2 in the wiring M1, M3, or M5 are formed (preferably having the same planar size) at positions which overlap each other in a planar manner (preferably at the same planar position). Similarly, the wiring part MC3 of the metal pattern MP3 in the wiring M2 or M4 and the wiring part MC1 of the metal pattern MP1 in the wiring M1, M3, or M5 are formed (preferably having the same planar size) at positions which overlap each other in a planar manner (preferably at the same planar position), and also the wiring part MC4 of the metal pattern MP4 in the wiring M2 or M4 and the wiring part MC2 of the metal pattern MP2 in the wiring M1, M3, or M5 are formed (preferably having the same planar size) at positions which overlap each other in a planar manner (preferably at the same planar position).

Note that, while the wiring part MD1 in the wiring M1, M3, or M5 is coupled to the wiring part MC1 and is not coupled to the wiring part MC2, the wiring part MD3 in the wiring M2 or M4, which is disposed at the same planar (overlapped) position as that of the wiring part MD1, is coupled not to the wiring part MC3 which is disposed at the same planar position as that of the wiring part MC1, but is coupled to the wiring part MC4 and also not coupled to the wiring part MC3. Similarly, while the wiring part MD2 in the wiring M1, M2, or M5 is coupled to the wiring part MC2 and is not coupled to the wiring part MC1, the wiring part MD4 in the wiring M2 or M4, which is disposed at the same planar (overlapped) position as that of the wiring part MD2, is coupled not to the wiring part MC4 which is disposed at the same planar position as that of the wiring part MC2, but is coupled to the wiring part MC3 and also not coupled to the wiring part MC4.

As apparent in FIG. 6 and FIG. 16 to FIG. 18, the plugs 26, 29, 32, and 35 (and the through-holes for embedding the plugs 26, 29, 32, and 35) are disposed at positions which overlap the wiring parts MC1, MC3 in the wirings M1 to M5, and the wiring parts MC1, MC3 in the wirings M1 to M5 are electrically coupled with one another via the plugs. That is, the wiring part MC1 in the wiring M1 and the wiring part MC3 in the wiring M2 are electrically coupled with each other via the plug 26 therebetween, and the wiring part MC3 in the wiring M2 and the wiring part MC1 in the wiring M3 are electrically coupled with each other via the plug 29 therebetween. Similarly, the wiring part MC1 in the wiring M3 and the wiring part MC3 in the wiring M4 are electrically coupled with each other via the plug 32 therebetween and the wiring part MC3 in the wiring M4 and the wiring part MC1 in the wiring M5 are electrically coupled with each other via the plug 35 therebetween.

Further, as apparent in FIG. 5, and FIG. 16 to 18, the plugs 26, 29, 32, and 35 (and the through-holes for embedding the plugs 26, 29, 32, and 35) are disposed at positions which overlap the wiring parts MC2, MC4 in the wirings M1 to M5, and the wiring parts MC2, MC4 in the wirings M1 to M5 are electrically coupled with one another via the plugs. That is, the wiring part MC2 in the wiring M1 and the wiring part MC4 in the wiring M2 are electrically coupled with each other via the plug 26 therebetween, and the wiring part MC4 in the wiring M2 and the wiring part MC2 in the wiring M3 are electrically coupled with each other via the plug 29 therebetween. Further, the wiring part MC2 in the wiring M3 and the wiring part MC4 in the wiring M4 are electrically coupled with each other via the plug 32 therebetween and the wiring part MC4 in the wiring M4 and the wiring part MC2 in the wiring M5 are electrically coupled with each other via the plug 35 therebetween.

Accordingly, the metal pattern MP1 composed of the wiring parts MD1, MC1 in the wiring M1, the metal pattern MP3 composed of the wiring parts MD4, MC3 in the wiring M2, the metal pattern MP1 composed of the wiring parts MD1, MC1 in the wiring M3, the metal pattern MP3 composed of the wiring parts MD4, MC3 in the wiring M4, and the metal pattern MP1 composed of the wiring parts MD1, MC1 in the wiring M5 are electrically coupled with one another to form a first electrode (one electrode) of the capacitance element C1. Similarly, the metal pattern MP2 composed of the wiring parts MD2, MC2 in the wiring M1, the metal pattern MP4 composed of the wiring parts MD3, MC4 in the wiring M2, the metal pattern MP2 composed of the wiring parts MD2, MC2 in the wiring M3, the metal pattern MP4 composed of the wiring parts MD3, MC4 in the wiring M4, and the metal pattern MP2 composed of the wiring parts MD2, MC2 in the wiring M5 are electrically coupled with one another to form a second electrode (the other electrode) of the capacitance element C1. Then, the insulating films between the first electrode and the second electrode become a capacitance insulating film (dielectric film) of the capacitance element C1. The metal patterns MP1 to MP4 in these wirings M1 to M5 (the first electrode and the second electrode) and the insulating films between the metal patterns MP1 to MP4 form an MIM (Metal Insulator Metal) type capacitance element (i.e., capacitance element C1), and this MIM type capacitance element is called the capacitance element C1 in the present embodiment and the following embodiments. Note that the symbol C1 is omitted from the drawings, since the capacitance element C1 is formed from all of the metal patterns MP1 to MP4 in the wirings M1 to M5 and the insulating films therebetween. Accordingly, the metal pattern MP1 or the metal pattern MP3 in each of the wirings M1 to M5 forms at least a part of the first electrode of the capacitance element C1 and the metal pattern MP2 or the metal pattern MP4 in each of the wirings M1 to M5 forms at least a part of the second electrode of the capacitance element C1.

A total capacitance of the capacitance element C1 is a sum of the following first to thirteenth capacitances: a first capacitance formed between the metal pattern MP1 and the metal pattern MP2 in the wiring M1, a second capacitance formed between the metal pattern MP3 and the metal pattern MP4 in the wiring M2, a third capacitance formed between the metal pattern MP1 and the metal pattern MP2 in the wiring M3, a fourth capacitance formed between the metal pattern MP3 and the metal pattern MP4 in the wiring M4, a fifth capacitance formed between the metal pattern MP1 and the metal pattern MP2 in the wiring M5, a sixth capacitance formed between the metal pattern MP1 in the wiring M1 and the metal pattern MP4 in the wiring M2, a seventh capacitance formed between the metal pattern MP2 in the wiring M1 and the metal pattern MP3 in the wiring M2, an eighth capacitance formed between the metal pattern MP3 wiring M2 and the metal pattern MP2 in the wiring M3, a ninth capacitance formed between the metal pattern MP4 wiring M2 and the metal pattern MP1 in the wiring M3, a tenth capacitance formed between the metal pattern MP1 in the wiring M3 and the metal pattern MP4 in the wiring M4, an eleventh capacitance formed between the metal pattern MP2 in the wiring M3 and the metal pattern MP3 in the wiring M4, a twelfth capacitance formed between the metal pattern MP3 wiring M4 and the metal pattern MP2 in the wiring M5, and a thirteenth capacitance formed between the metal pattern MP4 wiring M4 and the metal pattern MP1 in the wiring M5. The total capacitance of the capacitance element C1 is the sum of the above first to thirteenth capacitances and it is possible to realize a large capacitance in the capacitance element C1.

Among the above first to thirteenth capacitances composing the total capacitance of the capacitance element C1, the first to fifth capacitances are capacitances between the metal patterns in the same layer (here, between the metal patterns MP1, MP2, and between the metal patterns MP3, MP4). Accordingly, the capacitance element C1 is considered to be a capacitance element utilizing the capacitance between the metal patterns in the same layer (here, between the metal patterns MP1, MP2, or between the metal patterns MP3, MP4). Further, the capacitance element C1 is also considered to be a capacitance element utilizing fringe capacitances of the wiring patterns (here, metal patterns MP1 to MP4 in M1 to M5).

In this manner, the capacitance element C1 is a capacitance element utilizing the capacitance between the metal pattern MP1 (first metal pattern) and the metal pattern MP2 (second metal pattern) formed in the same layer and a capacitance element utilizing the capacitance between the metal pattern MP3 (first metal pattern) and the metal pattern MP 4 (second metal pattern) formed in the same layer. For the pattern shape, as described above, the metal pattern MP1 (first metal pattern) has a comb-shaped pattern where the wiring parts MD1 (first conductor part) extending in the X direction (first direction) are coupled with one another by the wiring part MC1 (first coupling part) extending in the Y direction (second direction) which crosses the X direction. Further, the metal pattern MP2 (second metal pattern) has a comb-shaped pattern where the wiring parts MD2 (second conductor part) extending in the X direction (first direction) and also disposed between the wiring parts MD1 (first conductor part), respectively, are coupled with one another by the wiring part MC2 (second coupling part) extending in the Y direction (second direction). Similarly, the metal pattern MP3 (fourth metal pattern) has a comb-shaped pattern where the wiring parts MD4 (third conductor part) extending in the X direction (first direction) are coupled with one another by the wiring part MC3 (third coupling part) extending in the Y direction (second direction). Further, the metal pattern MP4 (fifth metal pattern) has a comb-shaped pattern where the wiring parts MD3 (fourth conductor part), extending in the X direction (first direction) and also disposed between the wiring parts MD4 (third conductor part), respectively, are coupled with one another by the wiring part MC4 (fourth coupling part) extending in the Y direction (second direction). By causing the metal patterns MP1 to MP4 to have such pattern shapes, it is possible to increase efficiently a capacitance value per unit area (planar area) of the capacitance element C1. Further, the wiring width (width in Y direction) in each of the wiring parts MD1 to MD4 of the metal patterns MP1 to MP4 in the wirings M1 to M5 is preferably the same as the minimum wiring width in each of the wirings M1 to M5, and thereby it is possible to increase further efficiently the capacitance value per unit area (planar area) of the capacitance element C1.

In the semiconductor device of the present embodiment, in addition to the metal patterns MP1, MP2 or the metal patterns MP3, MP4 forming the capacitance element C1 in the capacitor formation region, the wirings M1 to M5 have the shielding metal patterns MG1 to MG5 (conductor patterns, wiring patterns, or metal patterns), respectively, which are provided around the metal patterns MP1, MP2 or the metal patterns MP3, MP4 and connected to a fixed potential.

That is, as shown in FIG. 9, the shielding metal pattern MG1 (third metal pattern) of the wiring M1 is provided around the metal patterns MP1, MP2 of the wiring M1, preferably so as to surround the metal patterns MP1, MP2 in a planar manner in the capacitor formation region. Similarly, as shown in FIG. 10, the shielding metal pattern MG2 (sixth metal pattern) of the wiring M2 is provided around the metal patterns MP3, PM4 of the wiring M2, preferably so as to surround the metal patterns MP3, MP4 in a planar manner in the capacitor formation region. Further as shown in FIG. 11, the shielding metal pattern MG3 of the wiring M3 is provided around the metal patterns MP1, PM2 of the wiring M3, preferably so as to surround the metal patterns MP1, MP2 in a planar manner in the capacitor formation region. Similarly, as shown in FIG. 12, the shielding metal pattern MG4 of the wiring M4 is provided around the metal patterns MP3, PM4 of the wiring M4, preferably so as to surround the metal patterns MP3, MP4 in a planar manner in the capacitor formation region. Further, as shown in FIG. 13, the shielding metal pattern MG5 of the wiring M5 is provided around the metal patterns MP1, PM2 of the wiring M5, preferably so as to surround the metal patterns MP1, MP2 in a planar manner in the capacitor formation region. The metal patterns MP1, MP2, and MG1 of the wiring M1 are disposed in the same layer, the metal patterns MP3, MP4, and MG2 of the wiring M2 are disposed in the same layer, the metal patterns MP1, MP2, and MG3 of the wiring M3 are disposed in the same layer, the metal patterns MP3, MP4, and MG4 of the wiring M4 are disposed in the same layer, and the metal patterns MP1, MP2, and MG5 of the wiring M5 are disposed in the same layer.

The metal patterns MG1, MG2, MG3, MG4, and MG5 are disposed at positions which overlap one another in a planar manner (preferably at the same planar position) and electrically coupled with one another via the plugs 26, 29, 32, and 35. Further, the metal patterns MG1, MG2, MG3, MG4, and MG5 have preferably the same planar size and planar shape, except that the metal pattern MG1 has the contact part MGC for coupling to the conductor pattern 8b.

For example, each of the metal patterns MG1 to MG5 can have a ring type planar shape which has a rectangular outer perimeter and inner perimeter, and the metal patterns MP1, MP2 or the metal patterns MP3, MP4 of the wirings M1 to M5 can be disposed within the rectangular rings of the metal patterns MG1 to MG5 in a planar manner. Thereby, the capacitance element C1 having the electrodes composed of the metal patterns MP1, MP2, MP3, and MP4 of the wirings M1 to M5 can be shielded efficiently by the shielding metal patterns MG1 to MG5.

The metal patterns MG1 to MG5 are connected to the fixed potential. The fixed potential, to which the metal patterns MG1 to MG5 are connected, is more preferably the earth potential or the ground potential but can be a power source potential. Therefore, at least any of the shielding metal patterns MG1 to MG5 is connected to the fixed potential (preferably the earth potential or the ground potential) via any of the wirings M1 to M5 or a wiring in an upper layer than that of the wiring M5. Since the metal patterns MG1 to MG5 are electrically coupled with one another via the plugs 26, 29, 32, and 35 as described above, every one of the metal patterns MG1 to MG5 becomes to be connected to the fixed potential. The metal patterns MG1 to MG5 are metal patterns for shielding the capacitance element C1. By providing the metal patterns MG1 to MG5, it is possible to electro-magnetically shield the capacitance element C1 having the electrodes composed of the metal patterns MP1, MP2, MP3, and MP4 of the wirings M1 to M5. Thereby, it is possible to prevent noise from entering the capacitance element C1 and also to prevent the capacitance element C1 from causing noise. Accordingly, it is possible to improve the characteristic of the circuit using the capacitance element C1.

Further, in the semiconductor device of the present embodiment, the conductor pattern 8b is formed below the capacitance element C1 over the semiconductor substrate 1 in the capacitor formation region. Then, as apparent also from FIG. 3, FIG. 4, and FIG. 15, the conductor pattern 8b (first conductor pattern) is electrically coupled to the metal pattern MG1 (third metal pattern) of the wiring M1 via the plug 23b (second connection conductor part) embedded within the contact hole 22b (second opening part) formed in the insulating film 21 (first insulating film). Since the metal patterns MG1 to MG5 are connected to the fixed potential as described above, the conductor pattern 8b electrically coupled to the metal pattern MG1 of the wiring M1 is also connected to the fixed potential in the capacitor formation region.

Further, in the capacitor formation region, a plurality of the conductor patterns 8b is disposed and each of the conductor patterns 8b extends in the X direction as same as the wiring parts MD1, MD2, MD3, and MD4 in the metal patterns MP1, MP2, MP3, and MP4. Then, in the capacitor formation region, the conductor patterns 8b extending in the X direction are arranged in the Y direction at a given spacing (preferably at the same spacing).

Preferably the conductor pattern 8b is disposed at a planar position between the wiring part MD1 (wiring part MD1 in the metal pattern MP1) and the wiring part MD2 (wiring part MD2 in the metal pattern MP2) of the wiring M1 neighboring each other. This disposition is for preventing the wiring part MD1, MD2, in the metal patterns MP1, MP2 of the wiring M1, and the conductor pattern 8b from overlapping each other in a planar manner. Accordingly, more preferably, the conductor pattern 8b is disposed at a planar position between the wiring part MD1 in the metal pattern MP1 of the wiring M1 and the wiring part MD2 in the metal pattern MP2 of the wiring M1 and also the conductor pattern 8b does not overlap the wiring parts MD1, MD2 in the metal patterns MP1, MP2 of the wiring M1 in a planar manner.

Note that the conductor pattern 8b crosses the wiring parts MC1, MC2 of the wiring M1 in a planar manner and extends to reach positions below the contact parts MGC in the metal pattern MG1, and thereby the conductor pattern 8b can be coupled to the contact parts MGC in the metal pattern MG1 of the wiring M1 via the plugs 23b. Therefore, the conductor pattern 8b does not overlap the wiring part MD1, MD2 in the metal patterns MP1, MP2 (or the wiring parts MD3, MD4 in the metal patterns MP3, MP4) in a planar manner, but overlaps the wiring parts MC1, MC2 in the metal patterns MP1, MP2 (and the wiring parts MC3, MC4 in the metal patterns MP3, MP4) at the crossing regions. However, the area of this overlap region is pretty small compared to the whole planar size of the conductor pattern 8b, and therefore, it is possible to suppress a parasitic capacitance value between the conductor pattern 8b and the electrode of the capacitance element C1.

Similarly, in the semiconductor device of the present invention, the active regions 1b, 1c (p-type semiconductor regions 11b, 11c) defined by the element isolation region 2 are formed over the semiconductor substrate 1 below the capacitance element C1 in the capacitor formation region. Then, as apparent also from FIG. 2 and FIG. 15, the active region 1c (p-type semiconductor region 11c) is disposed under the metal pattern MG1 and electrically coupled to the metal pattern MG1 (third metal pattern) of the wiring M1 via the plug 23a (first connection conductor part) embedded within the contact hole 22a (first opening part) formed in the insulating film 21 (first insulating film). Since the metal patterns MG1 to MG5 are connected to the fixed potential as described above, also the active region 1c (p-type semiconductor region 11c) electrically coupled to the metal pattern MG1 of the wiring M1 is connected to the fixed potential.

Further, in the capacitor formation region, the p-type well region 3 (first semiconductor region) is formed over the semiconductor substrate 1 so as to electrically couple the active region 1b (p-type semiconductor region 11b) and the active region 1c (p-type semiconductor region 11c). Here, the p-type well region 3 is formed so as to include the active regions 1b, 1c (p-type semiconductor regions 11b, 11c) in a planar manner and the p-type well region 3 is made deeper than the bottom of the element isolation region 2, and thereby the p-type semiconductor region 11b in the active region 1b and the p-type semiconductor region 11c in the active region 1c can be coupled and electrically coupled with each other via not only the active regions 1b, 1c but also the p-type well region 3 which extends below the element isolation region 2. Thereby, the active region 1b (p-type semiconductor region 11b) is electrically coupled with the active region 1c (p-type semiconductor region 11c) via the p-type well region 3. Therefore, by electrically coupling the active region 1c (p-type semiconductor region 11c) to the metal pattern MG1 via the plug 23a, not only the active region 1c (p-type semiconductor region 11c) but also the active region 1b (p-type semiconductor region 11b) is electrically coupled to the metal pattern MG1 and thereby connected to the fixed potential.

Moreover, in the capacitor formation region, a plurality of the active regions 1b (p-type semiconductor region 11b) is disposed and each of the p-type semiconductor regions 11b extends in the X direction as same as the conductor pattern 8b. Then, in the capacitor formation region, the p-type semiconductor regions 11b extending in the X direction are arranged in the Y direction at a given spacing (preferably at the same spacing).

Preferably the active region 1b (p-type semiconductor region 11b) is disposed at a planar position between the wiring part MD1 (wiring part MD1 in the metal pattern MP1) and the wiring part MD2 (wiring part MD2 in the metal pattern MP2) of the wiring M1 neighboring each other. This disposition is for preventing the wiring parts MD1, MD2, in the metal patterns MP1, MP2 of the wiring M1, and the active region 1b (p-type semiconductor region 11b) from overlapping each other in a planar manner. Accordingly, more preferably, the active region 1b (p-type semiconductor region 11b) is disposed at a planar position between the wiring part MD1 in the metal pattern MP1 of the wiring M1 and the wiring part MD2 in the metal pattern MP2 of the wiring M1 and also the active region 1b (p-type semiconductor region 11b) does not overlap the wiring parts MD1, MD2 in the metal patterns MP1, MP2 of the wiring M1 in a planar manner.

Moreover, the active regions 1c (p-type semiconductor region 11c) are provided so as to surround the active region 1b (p-type semiconductor region 11b) disposed in plural numbers in a planar manner in the capacitor formation region. This can reduce a resistance between the active region 1c (p-type semiconductor region 11c) and the active region 1b (p-type semiconductor region 11b).

The p-type semiconductor region 11c is disposed at a position which overlaps (preferably at the same position as) the metal pattern MG1 of the wiring M1 in a planar manner, and the p-type semiconductor region 11c (active region 1c) is electrically coupled to the metal pattern MG1 of the wiring M1 via the plug 23a. For example, the p-type semiconductor region 11c (active region 1c) can have a ring type planar shape which has a rectangular outer perimeter and inner perimeter, and the p-type semiconductor regions 11b (active region 1b), which extend in the X direction and are arranged in the plural numbers in the Y direction, can be disposed in a planar manner within the rectangular ring of the p-type semiconductor region 11c (active region 1c).

Moreover, while the p-type semiconductor regions 11b, 11c can be omitted and the active regions 1b, 1c can be the same as the p-type well region 3 (i.e., the regions, where the p-type semiconductor regions 11b, 11c are to be formed, are left as the p-type well region 3), the p-type semiconductor regions 11b, 11c are more preferably formed in the active regions 1b, 1c of the capacitor formation region, respectively, as in the present embodiment. By providing the p-type semiconductor regions 11b, 11c, it is possible to reduce a contact resistance between the plug 23a and the semiconductor substrate region (here, p-type semiconductor region 11c). Further, by providing the p-type semiconductor regions 11b, 11c, it is possible to improve stability of the potential in the p-type semiconductor regions 11b, 11c connected to the fixed potential, and to prevent more securely variation of the parasitic capacitance value between the metal pattern MP1, MP2 of the wiring M1 and the semiconductor substrate region (here, p-type semiconductor region 11b).

The metal patterns MP1 to MP4 forming the capacitance element C1 and the shielding metal patterns MG1 to MG5 are formed by the wiring layers (here, wirings M1 to M5) or the patterns in the wiring layers formed over the semiconductor substrate 1, and the wiring layers (here, M1 to M5) are formed using mainly a metal (metal material or material showing metallic conductivity) such as copper and aluminum. Therefore, the metal patterns MP1, MP2, MP3, and MP4 and the shielding metal patterns MG1, MG2, MG3, MG4, and MG5 are conductor patterns showing the metallic conductivity.

Here, the present embodiment describes the case in which the plurality of wiring layers is formed over the semiconductor substrate 1 and the metal patterns MP1 to MP4 forming the capacitance element C1 and the shielding metal patterns MG1 to MG5 are formed in the wirings M1 to M5 among the wiring layers. However, the number of the wiring layers, where metal patterns (corresponding to the metal patterns MP1 to MP4) composing the capacitance element C1 and shielding metal patterns surrounding the above metal patterns (corresponding to the metal patterns MG1 to MG5) are formed, is not limited to the number of wiring layers in the present embodiment, and the metal patterns composing the capacitance element C1 and the shielding metal patterns surrounding the above metal patterns may be formed in one or more layers among the wiring layers. When the metal patterns composing the capacitance element C1 and the shielding metal pattern are formed only in one wiring layer (e.g., wiring M1), the metal patterns MP1, MP2 may be formed in the wiring layer and the shielding metal pattern (e.g., metal pattern MG1) may be formed so as to surround the above metal patterns MP1, MP2. In this case, the capacitance element C1 is a capacitance element formed utilizing only the capacitance between the metal patterns MP1, MP2 in the same layer. When the metal patterns composing the capacitance element C1 and the shielding metal patterns are formed in two or more wiring layers, the metal patterns MP1, MP2 and the metal patterns MP3, MP4 are disposed alternately in the two or more accumulated wiring layers and the shielding metal patterns may be provided so as to surround the above metal patterns, respectively.

Note that the capacitance of the capacitance element C1 can be increased efficiently, if the metal patterns MP1 to MP4 composing the capacitance element C1 and the shielding metal patterns surrounding the above respective metal patterns are formed in the two or more wiring layers among the wiring layers formed over the semiconductor substrate 1. In this case, the total capacitance of the capacitance element C1 is the capacitance (corresponding to the foregoing first to fifth capacitances in the present embodiment) between the metal patterns in the same layer (between the metal patterns MP1, MP2 in the same layer and between the metal patterns MP3, MP4 in the same layer) further added by the capacitance (corresponding to foregoing sixth to thirteenth capacitances in the present embodiment) between the metal patterns in the different layers (between the metal patterns MP1, MP4 in the layers different by one layer and between the metal patterns MP2, MP3 in the layers different by one layer). Accordingly, when the metal patterns MP1 to MP4 composing the capacitance element C1 and the shielding metal patterns surrounding the above respective metal patterns are formed in the two or more layers among the wiring layers formed over the semiconductor substrate 1 as in the present embodiment, the capacitance element C1 is a capacitance element formed utilizing the capacitance between the metal patterns in the same layer and the capacitance between the metal patterns in the different layers.

Next, advantages of the present embodiment will be described in more detail.

A capacitance element, used in a semiconductor integrated circuit represented by an analog circuit, is requested to have high precision such as a small voltage coefficient and temperature coefficient and a small parasitic capacitance ratio, and to have a small absolute and relative variation of the capacitance value. Further, it is requested to suppress the production cost of the semiconductor device by suppressing the number of production processes which increases by forming the capacitance element. The capacitance element utilizing an inter-wiring or inter-layer capacitance of the wirings can suppress the increase in the number of the production processes for forming the capacitance element, and thereby can reduce the production cost of the semiconductor device. However, for obtaining a stable electrical characteristic having the small parasitic capacitance ratio while taking productivity (CMP planarizing technique) into consideration, it is necessary to devise dummy layout patterns of the active region and the gate electrode.

When the insulating film 21 is formed, the irregular shape is formed over the upper surface of the insulating film 21 caused by the step of the foundation layer (step of the gate electrode 8a or the like), the upper surface of the insulating film 21 is planarized after the formation of the insulating film 21, using the polishing or the like on the upper surface (surface) of the insulating film 21 by the CMP method. Thereby, it is possible to obtain an interlayer insulating film (here, insulating film 21) having a planarized upper surface (surface). When the multilayer wiring structure is formed over the insulating film 21 while having the remaining irregular shape over the upper surface thereof, the multilayer wiring structure is affected by the irregular shape and the wiring layers can not be formed successfully therein. On the other hand, by forming the multilayer wiring structure over the flat upper surface of the insulating film 21, the wiring layers can be formed appropriately therein.

Further, in the present embodiment, the gate electrode 8a composing the MISFET is formed in the MISFET formation region but the gate electrode 8a is not formed in the capacitor formation region because the MISFET is not formed therein. When a semiconductor element such as the MISFET is formed in the capacitor formation region below the capacitance element C1 which has the metal patterns MP1 to MP4 of the wirings M1 to M5 as the electrodes thereof, differently from the present embodiment, an interference occurs between the capacitance element C1 and the MISFET sometimes to deteriorate a characteristic of a circuit using the capacitance element C1 and the MISFET. On the other hand, in the present embodiment, a semiconductor device such as the MISFET is not formed in the capacitor formation region below the capacitance element C1 which has the metal patterns MP1 to MP4 of the wirings M1 to M5 as the electrodes thereof, it is possible to prevent the interference from occurring between the capacitance element C1 and the MISFET or the like, and to improve the characteristic of the circuit using the capacitance element C1 and the MISFET.

However, when the gate electrode 8a composing the MISFET is not formed in the capacitor formation region and also the conductor pattern 8b is not formed in the capacitor formation region, differently from the present embodiment, a protrusion corresponding to the step of the gate electrode 8a exists over the upper surface of the insulating film 21 in the MISFET region after the formation of the insulating film 21, but, on the other hand, such an protrusion does not exist in the capacitor formation region. In this case, in the CMP process for planarizing the insulating film 21 after the formation of the insulating film 21, there is a possibility that the dishing or the like occurs in the capacitor formation region and the flatness of the insulating film 21 is deteriorated, and this degrades the precision of the capacitance element C1 (capacitance element C1 having the metal patterns MP1 to MP4 of the wirings M1 to M5 as the electrodes thereof) formed over the insulating film 21 in the capacitor formation region.

On the other hand, in the present embodiment, the gate electrode 8a composing the MISFET is not formed in the capacitor formation region, but, instead, the conductor pattern 8b is provided in the same layer as that of the gate electrode 8a. Thereby, when the insulating film 21 is formed, the protrusion corresponding to the step of the gate electrode 8a exists over the upper surface of the insulating film 21 in the MISFET formation region, and, on the other hand, a protrusion corresponding to the step of the conductor pattern 8b exists over the upper surface of the insulating film 21 in the capacitor formation region. Since the gate electrode 8a in the MISFET formation region and the conductor pattern 8b in the capacitor formation region are patterns in the same layer formed in the same process, the protrusions caused over the upper surface of the insulating film 21 after the formation of the insulating film 21 have approximately the same height in both of the MISFET formation region and the capacitor formation region. Accordingly, in the CMP process for planarizing the insulating film 21 after the formation of the insulating film 21, the dishing or the like can be prevented from occurring in the capacitor formation region, and the flatness of the insulating film 21 can be improved. Thereby, it is possible to improve the flatness in the insulating film 21 and each of the upper layers thereof to be formed, and to improve the productivity of the semiconductor device. Further, it is possible to improve the precision of the capacitance element C1 (capacitance element C1 having the metal patterns MP1 to MP4 of the wirings M1 to M5 as the electrodes thereof) formed over the insulating film 21 in the capacitor formation region. Accordingly, the performance of the semiconductor device can be improved.

However, when the conductor pattern 8b formed in the capacitor formation region is an isolated pattern (so called floating pattern) which is not connected to any pattern and has a floating potential, differently from the present embodiment, the potential of the conductor pattern 8b tends to be unstable. Thereby, the conductor pattern 8b in the capacitor formation region becomes a noise source to the capacitance element C1, or the parasitic capacitance value between the metal pattern MP1, MP 2 of the wiring M1 composing the capacitance element C1 and the conductor pattern 8b varies to deteriorate the stability of the electrical characteristic in the circuit using the capacitance element C1 and to make the design of the semiconductor device (circuit design) difficult to perform.

On the other hand, in the present embodiment, the conductor pattern 8b is disposed below the capacitance element C1 which has the metal patterns MP1 to MP4 of the wirings M1 to M5 as the electrodes thereof in the capacitor formation region, and this conductor pattern 8b is electrically coupled to the shielding metal pattern MG1 via the plug 23b and thereby connected to the fixed potential. By connecting the conductor pattern 8b to the fixed potential in the capacitor formation region, the potential of the conductor pattern 8b becomes stable and the potential of the conductor 8b can be prevented from varying. Thereby, the conductor pattern 8b in the capacitor formation region can be prevented to become the noise source to the capacitance element C1, and also the parasitic capacitance between the metal pattern MP1, MP2 of the wiring M1 composing the capacitance element C1 and the conductor pattern 8b can be prevented from varying. Accordingly, it is possible to improve the performance of the semiconductor device having the capacitance element C1. Further, it is possible to improve the stability of the electrical characteristic in the circuit using the capacitance element C1. In addition, the design of the semiconductor device (circuit design) becomes easy to perform.

Further, when the conductor pattern 8b and the wiring part MD1, MD2 in the metal patterns MP1, MP2 of the wiring M1 are disposed facing each other vertically in positions which overlap each other in a planar manner, differently from the present embodiment, both of the patterns interfere to increase the parasitic capacitance value. This may degrade the electrical characteristic of the circuit using the capacitance element C1.

On the other hand, in the present embodiment, the conductor pattern 8b is disposed below the capacitance element C1, but is disposed so as not to overlap the metal pattern MP1, MP2 of the wiring M1 (particularly, wiring part MD1, MD2) in a planar manner. That is, in a planar view in the capacitor formation region, the conductor pattern 8b is disposed between the wiring part MD1 in the metal pattern MP1 and the wiring part MD2 in the metal pattern MP2 and extends in the X direction as same as the extension direction of the wiring part MD1, MD2 so as not to overlap the wiring part MD1, MD2 in the metal patterns MP1, MP2 of the wiring M1 in a planar manner. Thereby, the upper surface of the conductor pattern 8b and the lower plane of the wiring part MD1, MD2 in the metal patterns MP1, MP2 of the wiring M1 do not have the state to face each other vertically (in the direction corresponding to one perpendicular to the main surface of the semiconductor substrate 1), and the interference of both the patterns can be suppressed or prevented and the parasitic capacitance between both of the patterns can be suppressed or prevented. Accordingly, it is possible furthermore to improve the electrical characteristic of the circuit using the capacitance element C1 and furthermore to improve the performance of the semiconductor device having the capacitance element C1.

Further, the element isolation region 2 is composed of the groove 2a embedded with the insulating material. After the formation of the groove 2a in the semiconductor substrate 1, the element isolation region 2 is formed by the process which forms the insulating film so as to fill the groove 2a over the main surface of the semiconductor substrate 1, removes the insulating film outside the groove 2a by the CMP method, and leaves the insulating film within the groove 2a.

When the element isolation region 2 is formed in the whole capacitor formation region, differently from the present invention, the grove 2a is formed also in the whole capacitor formation region and the grove 2a becomes to have a large area in the capacitor formation region, and the dishing or the like in the capacitor formation region may be caused in the CMP process to fill the insulating film within the groove 2a. This degrades the flatness of the main surface of the semiconductor substrate 1 including the upper surface of the element isolation region 2, affects the structure of the upper layer over the semiconductor substrate 1, and may degrade the precision of the capacitance element C1 having the metal patterns MP1 to MP4 of the wirings M1 to M5 as the electrodes thereof.

On the other hand, in the present embodiment, the element isolation region 2 is not formed in the whole capacitor formation region and active regions 1b, 1c defined by the element isolation regions 2 (i.e., region where the element isolation region 2 is not formed) are provided also in the capacitor formation region. In these active regions 1b, 1c, the p-type semiconductor regions 11b, 11c are formed, respectively. By providing the active regions 1b, 1c defined by the element isolation regions 2 also in the capacitor formation region, it is possible to suppress or prevent the grove 2a from having a pattern with large area in the capacitor formation region. Thereby, it is possible to prevent the dishing or the like from occurring in the capacitor formation region in the CMP process for filling the insulating film within the groove 2a. Thereby, the flatness of the main surface of the semiconductor substrate 1 including the upper plane of the element isolation region 2 can be improved and the flatness of each layer to be formed over the semiconductor substrate 1 can be improved, resulting in improving the productivity of the semiconductor device. Further, the structure of the upper layers over the semiconductor substrate 1 can be formed appropriately and thereby it is possible to improve the precision of the capacitance element C1 having the metal patterns MP1 to MP4 of the wirings M1 to M5 as the electrodes thereof. Accordingly, the performance of the semiconductor device can be improved.

However, when the active region 1b, 1c has the floating potential in the capacitor formation region, differently from the present embodiment, the potential of this active region tends to be unstable. Accordingly, the active region in the capacitor formation region becomes a noise source to the capacitance element C1, or the parasitic capacitance between the metal pattern MP1, MP2 of the wiring M1 composing the capacitance element C1 and the active region in the capacitor formation region varies to deteriorate the stability of the electrical characteristic of the circuit using the capacitance element C1 and to make the design of the semiconductor device (circuit design) difficult to perform.

On the other hand, in the present embodiment, the active region 1b (p-type semiconductor region 11b) is disposed below the capacitance element C1 which has the metal patterns MP1 to MP4 of the wirings M1 to M5 as the electrodes thereof in the capacitor formation region, but this active region 1b (p-type semiconductor region 11b) is electrically coupled to the shielding metal pattern MG1 via the p-type well region 3, the active region 1c (p-type semiconductor region 11c), and the plug 23a. Thereby, the active region 1b (p-type semiconductor region 11b) disposed below the capacitance element C1 is connected to the fixed potential, and the potential of the active region 1b (p-type semiconductor region 11b) becomes stable and the potential of the active region 1b (p-type semiconductor region 11b) is prevented from varying. As a result, the active region 1b, 1c (particularly, active region 1b, i.e., p-type semiconductor region 11b) in the capacitor formation region can be prevented from becoming the noise source to the capacitance element C1, and also the parasitic capacitance between the metal pattern MP1, MP2 of the wiring M1 composing the capacitance element C1 and the active region 1b, 1c (particularly, active region 1b, i.e., p-type semiconductor region 11b) in the capacitor formation region can be prevented from varying. Accordingly, it is possible to improve the performance of the semiconductor device having the capacitance element C1. Further, it is possible to improve the stability of the electrical characteristic in the circuit using the capacitance element C1. In addition, the design of the semiconductor device (circuit design) becomes easy to perform.

Further, when the active region 1b (p-type semiconductor region 11b) and the wiring part MD1, MD2 in the metal patterns MP1, MP2 of the wiring M1 overlap each other in a planar manner and face each other vertically in the capacitor formation region, differently from the present embodiment, both of the patterns interfere with each other and the parasitic capacitance is increased. This may degrade the electrical characteristic of the circuit using the capacitance element C1.

On the other hand, in the present embodiment, the active region 1b (p-type semiconductor region 11b) is disposed below the capacitance element C1 but is disposed so as not to overlap the metal pattern MP1, PM2 (particularly, wiring part MD1, MD2) of the wiring M1 in a planar manner. That is, in a planar view in the capacitor formation region, the active region 1b (p-type semiconductor region 11b) is disposed between the wiring part MD1 in the metal pattern MP1 and the wiring part MD2 in the metal pattern MP2, and extends in the X direction as same as the extension direction of the wiring part MD1, MD2, such that the active region 1b (p-type semiconductor region 11b) and the wiring part MD1, MD2 in the metal patterns MP1, MP2 of the wiring M1 do not overlap each other in a planar manner. Further, preferably the active region 1b (p-type semiconductor region 11b) is disposed so as not to overlap the wiring part MC1, MC2 in the metal patterns MP1, MP2 of the wiring M1 in a planar manner. Thereby, the upper surface of the active region 1b (p-type semiconductor region 11b) and the lower plane of the metal pattern MP1, MP2 (particularly, wiring part MD1, MD2) of the wiring M1 do not become to have the state to face each other vertically (in the direction corresponding to one perpendicular to the main surface of the semiconductor substrate 1), and the interference between both of the patterns can be suppressed or prevented and the parasitic capacitance between both of the patterns can be suppressed or prevented. Accordingly, it is possible to improve the electrical characteristic of the circuit using the capacitance element C1 and furthermore to improve the performance of the semiconductor device having the capacitance element C1.

Further, in the present embodiment, the conductor pattern 8b is disposed not over the active region but over the element isolation region 2 such that the p-type semiconductor region 11b, 11c does not overlap the conductor pattern 8b in a planar manner in the capacitor formation region. By disposing the conductor pattern 8b over the element isolation region 2, the conductor pattern 8b is prevented from forming an unnecessary element (parasitic element).

In addition, in the capacitance formation region, the length (size) L1 of the active region 1b (p-type semiconductor region 11b) in the X direction, shown in FIG. 15, is more preferably the distance (spacing) L2 or less, shown in FIG. 16, between the wiring part MC1 in the metal pattern MP1 of the wiring M1 and the wiring part MC2 in the metal pattern MP2 of the wiring M1 (L1=L2). Thereby, the wiring part MC1, MC2 in the metal patterns MP1, MP2 of the wiring M1 and the active region 1b (p-type semiconductor region 11b) can be disposed not to overlap each other in a planar manner. Accordingly, it is possible further to reduce the parasitic capacitance between the metal pattern MP1, MP2 of the wiring M1 and the active region 1b (p-type semiconductor region 11b) and furthermore to improve the electrical characteristic of the circuit using the capacitance element C1.

Further, in the capacitor formation region, the length (size) L1 of the active region 1b (p-type semiconductor region 11b) in the X direction is more preferably the length (size) L3 or more, shown in FIG. 6, of the range where the wiring part MD1 in the metal pattern MP1 of the wiring M1 and the wiring part MD2 in the metal pattern MP2 of the wiring M1 overlap each other in the X direction (L1=L3). When the length (size) L1 of the active region 1b (p-type semiconductor region 11b) in the X direction is too small, it may reduce the effect of providing the active region 1b (p-type semiconductor region 11b) defined by the element isolation region 2 also in the capacitor formation region to prevent the dishing (dishing in the CMP process for forming the element isolation region 2) in the capacitor formation region. By making the length L1 of the active region 1b (p-type semiconductor region 11b) in the X direction to be the above length L3 or more (L1=L3), it is possible appropriately to increase the effect to prevent the dishing (dishing in the CMP process for forming the element isolation region 2) in the capacitor formation region.

Moreover, in the capacitor formation region, more preferably, the width (size) W1, shown in FIG. 15, of the active region 1b (p-type semiconductor region 11b) in the Y direction is the size (spacing) W2 or less, shown in FIG. 16, between the wiring part MD1 and the wiring part MD2 of the wiring M1 neighboring each other (W1=W2). Thereby, when the active region 1b (p-type semiconductor region 11b) is disposed between the wiring part MD1 (wiring part in the metal pattern MP1) and the wiring part MD2 (wiring part MD2 in the metal pattern MP2) of the wiring M1 neighboring each other, the wiring part MD1, MD2 of the metal patterns MP1, MP2 of the wiring M1 and the active region 1b (p-type semiconductor region 11b) do not overlap each other in a planar manner. Accordingly, it is possible furthermore to reduce the parasitic capacitance between the metal pattern MP1, MP2 of the wiring M1 and the active region 1b (p-type semiconductor region 11b) and furthermore to improve the electrical characteristic of the circuit using the capacitance element C1.

Further, in the present embodiment, the conductor pattern 8b or the active region 1b (p-type semiconductor region 11b) is disposed so as not to overlap the wiring parts MD1 to MD4 in the metal patterns MP1 to MP4 of the wirings M1 to M5 in a planar manner, and thereby the parasitic capacitance is reduced between the electrode of the capacitance element C1 and the conductor pattern 8b or the active region 1b (p-type semiconductor region 11b). Note that, among the metal patterns MP1 to MP4 of the wirings M1 to M5 composing the electrodes of the capacitance element C1, the metal pattern MP1, MP2 of the wiring M1 has the smallest distance to the conductor pattern 8b and the active region 1b and easily increases the parasitic capacitance. Therefore, for reducing the parasitic capacitance, it is efficient to dispose at least the wiring parts MD1, MD2 in the metal patterns MP1, MP2 of the wiring M1, among the metal patterns MP1 to MP4 of the wirings M1 to M5 composing the electrodes of the capacitance element C1, so as not to overlap the conductor pattern 8b or the active region 1b (p-type semiconductor region 11b) in a planar manner. Accordingly, in the present embodiment, preferably the conductor pattern 8b or the active region 1b (p-type semiconductor region 11b) is disposed not to overlap the metal patterns MP1, MP2 (particularly, wiring parts MD1, MD2) of the wiring M1 in a planar manner, and more preferably, the conductor pattern 8b or the active region 1b (p-type semiconductor region 11b) is disposed not to overlap the metal patterns MP1 to MP4 (particularly, wiring parts MD1 to MD4) of the wirings M1 to M5 in a planar manner.

Thereby, it is possible to reduce the parasitic capacitance added to the electrode of the capacitance element C1 and furthermore to improve the performance of the semiconductor device.

Moreover, the plurality of wiring layers (multilayer wiring structure) is formed over the insulating film 21, and the metal patterns MP1 to MP4, which are the electrodes of the capacitance element C1, are formed in the wirings M1 to M5 among the wiring layers, in the present embodiment. However, not limiting to these wirings M1 to M5, in any wiring layer among the wiring layers (multilayer wiring structure), it is possible to form the metal patterns for the electrodes of the capacitance element C1 (corresponding to the metal patterns MP1 to MP4) and the shielding metal patterns (corresponding to the metal patterns MG1 to MG5) surrounding the above metal patterns over the insulating film 21. Note that the effect of the parasitic capacitance, between the conductor pattern 8b or the active region 1b (p-type semiconductor region 11b) and the metal patterns for the electrodes of the capacitance element C1, becomes larger as the distance therebetween becomes smaller. Therefore, when the plurality of wiring layers (i.e., multilayer wiring structure) is formed over the insulating film 21 and the metal patterns (corresponding to the metal patterns MP1 to MP4) composing the electrodes of the capacitance element C1 and the shielding metal patterns (corresponding to the metal patterns MG1 to MG5) are formed over at least one wiring layer including the lowermost wiring layer (here, wiring M1) of the wiring layers, the effect of the parasitic capacitance becomes largest. The present embodiment can prevent such an effect of the parasitic capacitance. Accordingly, it is effective to apply the present embodiment to the case in which the wiring layers (i.e., multilayer wiring structure) are formed over the insulating film 21, the metal patterns (corresponding to the metal patterns MP1 to MP4) composing the electrodes of the capacitance element C1 and the shielding metal patterns (corresponding to the metal patterns MG1 to MG5) are formed over at least one wiring layer including the lowermost wiring layer (here, wiring M1) of the wiring layers.

In addition, in the semiconductor device of the present embodiment, the conduction type of each semiconductor region can be reversed. For example, in the capacitor formation region, the p-type well region 3, n-type well region 5, and n-type well region 6 can be replaced by reverse conduction type regions: an n-type well region, p-type well region and p-type well region, respectively. The p-type semiconductor regions 11b, 11c can be replaced by n-type semiconductor regions of the reverse conduction type, respectively. Further, the MISFET formed in the MISFET formation region can be replaced by an n-channel-type MISFET, and also both of a p-channel-type MISFET and an n-channel-type MISFET can be formed in the MISFET formation region (i.e., formation of a CMISFET (Complementary Metal Insulator Semiconductor Field Effect Transistor)).

Figure 14:
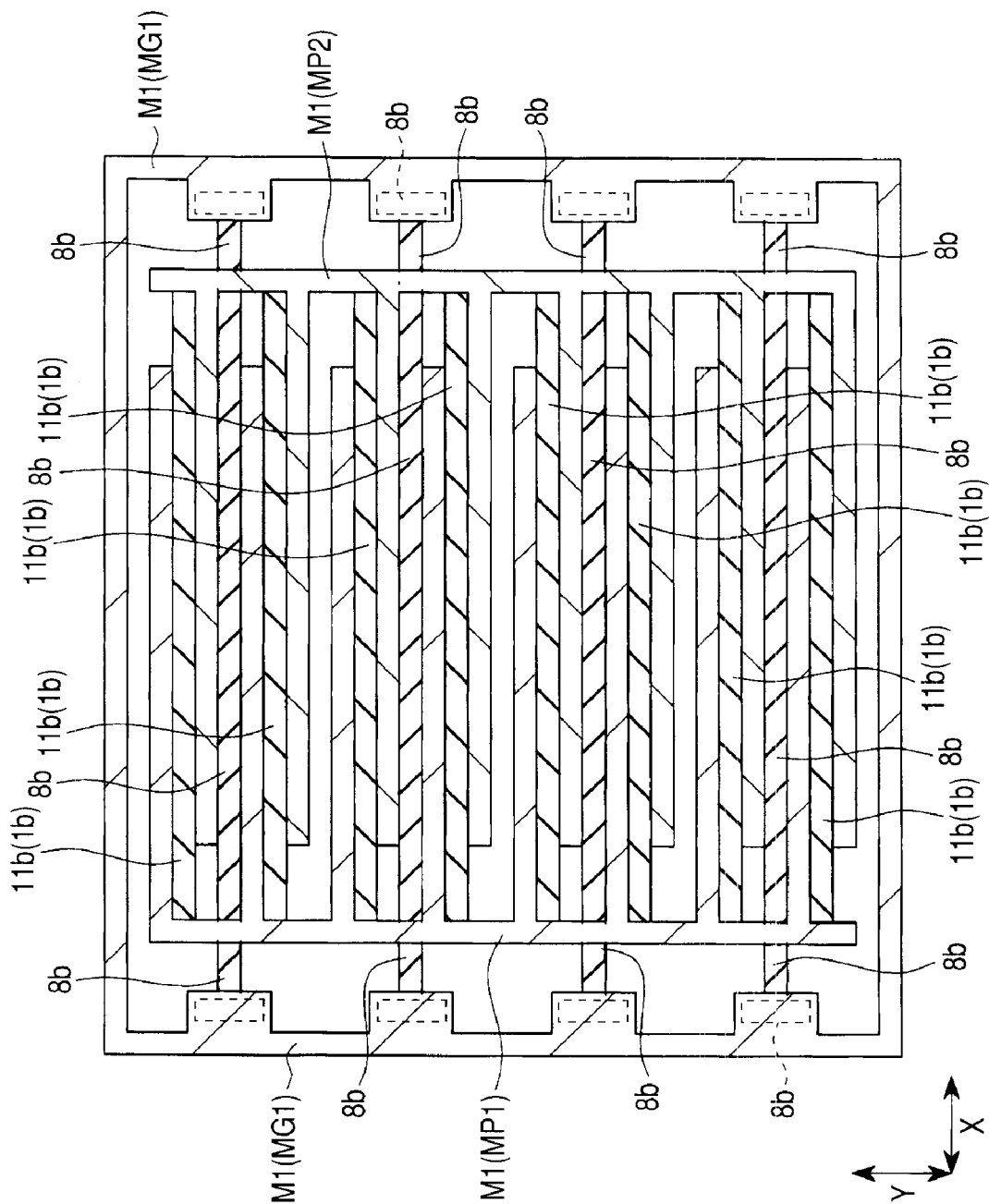
FIG. 14 is a plan view of a substantial part in a semiconductor device according to one embodiment of the present invention.
Figure 31:
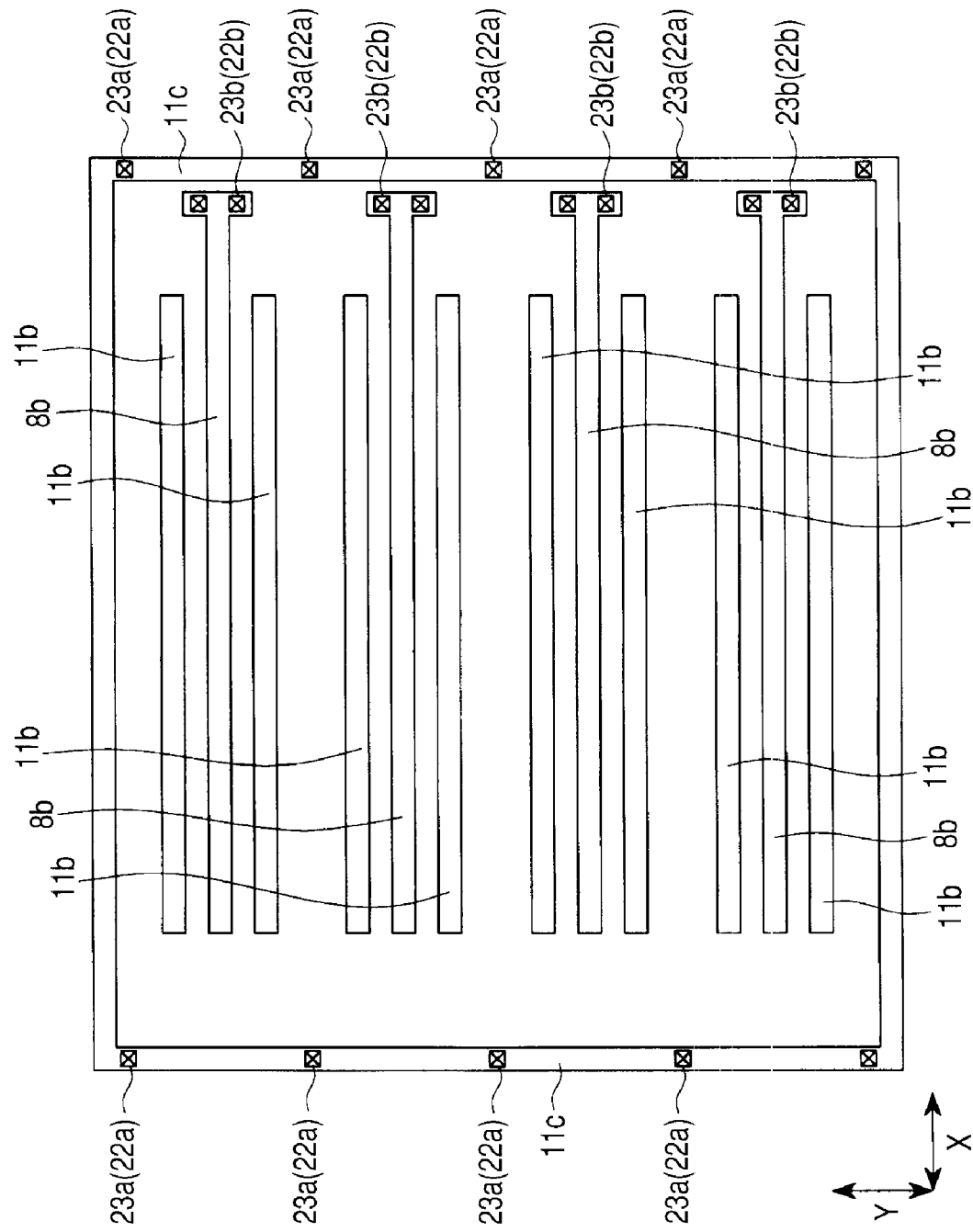
FIG. 31 is a cross-sectional view of a substantial part in a semiconductor device according to another embodiment of the present invention.
Figure 32:
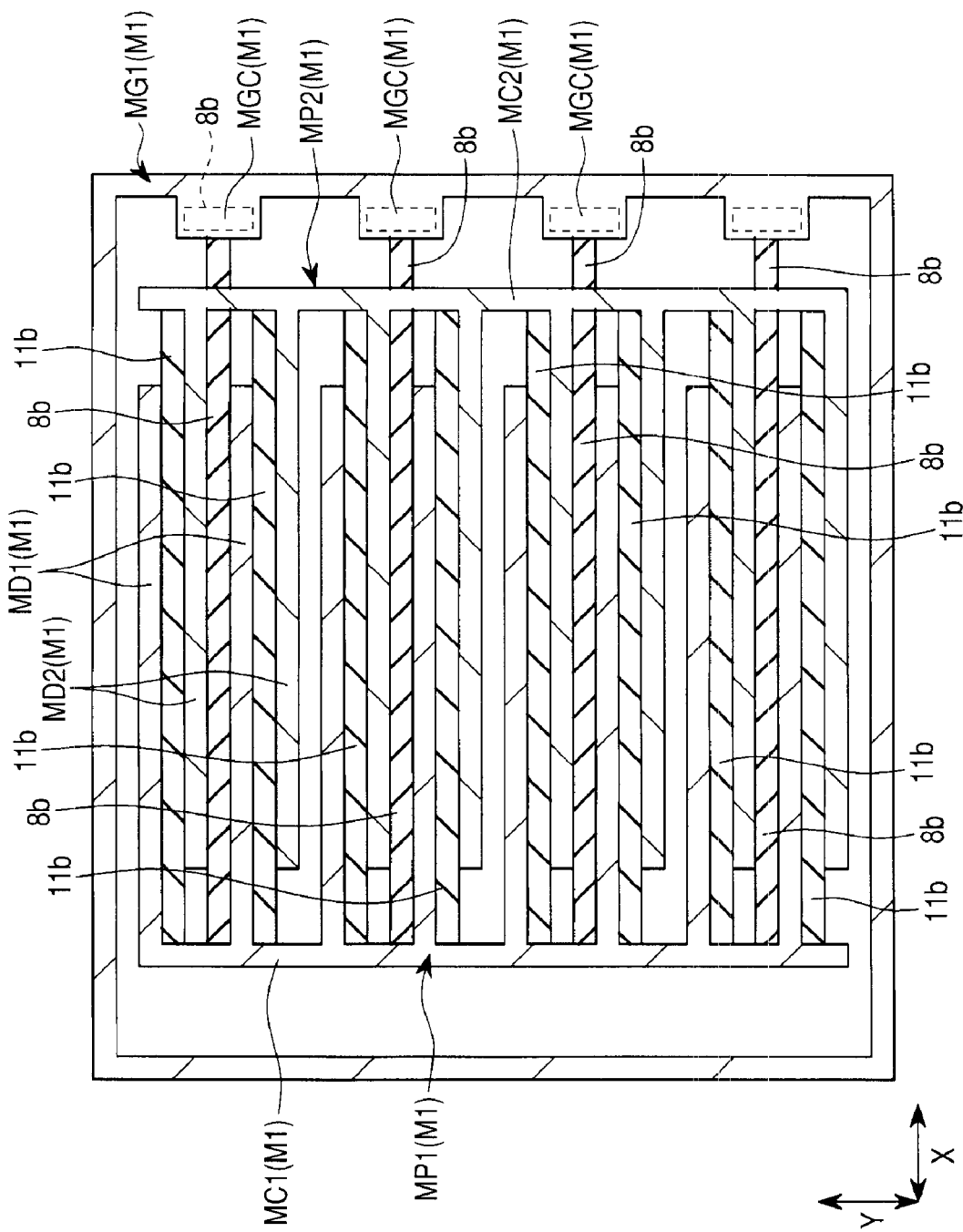
FIG. 32 is a cross-sectional view of a substantial part in a semiconductor device according to another embodiment of the present invention.

(Second Embodiment) FIG. 31 and FIG. 32 are plan views of substantial parts of the semiconductor device in the present embodiment and correspond to FIG. 15 and FIG. 14 of the above first embodiment, respectively. Note that FIG. 32 is a plan view but provides hatching to the conductor pattern 8b, the p-type semiconductor regions 11b, 11c (active regions 1b, 1c), and the wiring M1 for making the drawings easily to be viewed as in FIG. 14 of the first embodiment.

Each of the conductor patterns 8b disposed below the capacitance element C1 needs to be electrically coupled to the metal pattern MG1. For this purpose, in the capacitor formation region, each of the conductor patterns 8b needs to cross in a planar manner at least one of the wiring part MC1 in the metal pattern MP1 and the wiring part MC2 in the metal pattern MP2, and to extend in the X direction for being electrically coupled to the metal pattern MG1 via the plug 23b embedded in the contact hole 22b formed in the insulating film 21.

In the above first embodiment, each of the conductor patterns 8b extends in the X direction, and crosses the wiring part MC1 in a planar manner in the metal pattern MP1 and also crosses the wiring part MC2 in a planar manner in the metal pattern MP2 in the capacitor formation region. This is because each of the conductor patterns 8b is extended to reach a region below the contact part MGC of the metal pattern MG1 by crossing over both of the wiring part MC1 in the metal pattern MP1 and the wiring part MC2 in the metal pattern MP2, in order to couple both ends thereof to the contact part MGC of the metal pattern MG1 in the wiring M1 via the plug 23b.

On the other hand, in the present embodiment, each of the conductor patterns 8b, in the capacitance formation region, extends in the X direction and is disposed to cross one of the wiring part MC1 in the metal pattern MP1 and the wiring part MC2 in the metal pattern MP2 (wiring part MC2 in the case of FIG. 31 and FIG. 32) in a planar manner, but not to cross the other one (wiring part MC1 in the case of FIG. 31 and FIG. 32) in a planar manner. Then, in the present embodiment, each of the conductor patterns 8b couples one end thereof, which crosses over the wiring part MC1 or the wiring part MC2 and extends below the contact part MGC of the metal pattern MG1 (right side end in the case of FIG. 31 and FIG. 32), to the contact part MGC of the metal pattern MG1 in the wiring M1 via the plug 23b, and does not couple the other end thereof (left side end in the case of FIG. 31 and FIG. 32) to the metal pattern MG1 via the plug. Except for this point, the semiconductor device of the present embodiment has almost the same configuration as that of the semiconductor device of the above first embodiment and description thereof will be omitted.

In the present embodiment, each of the conductor patterns 8b in the capacitor formation region extends in the X direction and is disposed to cross one of the wiring part MC1 in the metal pattern MP1 and the wiring part MC2 in the metal pattern MP2 (wiring part MC2 in the case of FIG. 31 and FIG. 32) in a planar manner and not to cross the other one (wiring part MC1 in the case of FIG. 31 and FIG. 32) in a planar manner. Thereby, a cross area (area of the overlapped region) of the conductor pattern 8b and the metal pattern MP1, MP2 can be reduced and the parasitic capacitance between the conductor pattern 8b and the metal pattern MP1, MP2 of the wiring M1 in the capacitor formation region can be reduced, compared to the case in which each of the conductor patterns 8b crosses both of the wiring part MC1 in the metal pattern MP1 and the wiring part MC2 in the metal pattern MP2. Thereby, it is possible to reduce the parasitic capacitance between the metal pattern MP1, MP2 of the wiring M1 composing the capacitance element C1 and the conductor pattern 8b, and furthermore to improve the electrical characteristic of the circuit using the capacitance element C1.

Further, as shown in FIG. 31 and FIG. 32, when all the conductor patterns 8b in the capacitor formation region are disposed to cross the wiring part MC2 in the metal pattern MP2 in a planar manner but not to cross the wiring part MC1 in the metal pattern MP1 in a planar manner, the metal patterns MP2, MP4 overlap a part of the conductor patterns 8b but the metal pattern MP1, MP3 does not overlap the conductor patters 8b at all. The first electrode (one of the electrodes) of the capacitance element C1 is composed of the metal patterns MP1, MP3 in the wirings M1 to M5 and the second electrode (the other one of the electrodes) of the capacitance element C1 is composed of the metal patterns MP2, MP4 in the wirings M1 to M5. If the metal pattern MP1, MP3 does not overlap the conductor patterns 8*b* at all as in FIG. 31 and FIG. 32, it is possible to prevent the parasitic capacitance between the conductor pattern 8*b* and the first electrode of the capacitance element C1 from being generated, as efficiently as possible. Therefore, the present embodiment is very effective in an application thereof to a case in which a parasitic component (parasitic capacitance) added to the second electrode of the capacitance element C1 does not matter but a parasitic component (parasitic capacitance) added to the first electrode is required to be reduced as much as possible.

In addition, by an configuration exchanging the right and the left in the planar layout of the conductor pattern 8*b*, the contact hole 22*b*, or the plug 23*b* shown in FIG. 31 and FIG. 32, all the conductor patterns 8*b* in the capacitor formation region also can be disposed to cross the wiring part MC1 in the metal pattern MP1 in a planar manner but not to cross the wiring part MC2 in the metal pattern MP2 in a planar manner. In this case, the metal patterns MP1, MP3 overlap a part of the conductor patterns 8*b* but the metal pattern MP2, MP4 does not overlap the conductor patterns 8*b* at all. Thereby, it is possible to prevent the parasitic capacitance between the second electrode of the capacitance element C1 composed of the metal patterns MP2, MP4 in the wirings M1 to M5 and the conductor patterns 8*b* from being generated as efficiently as possible. This is very effective in an application thereof to a circuit in which the parasitic component (parasitic capacitance) added to the first electrode of the capacitance element C1 does not matter but the parasitic component (parasitic capacitance) added to the second electrode of the capacitance element C1 is required to be reduced as much as possible.

Figure 33:
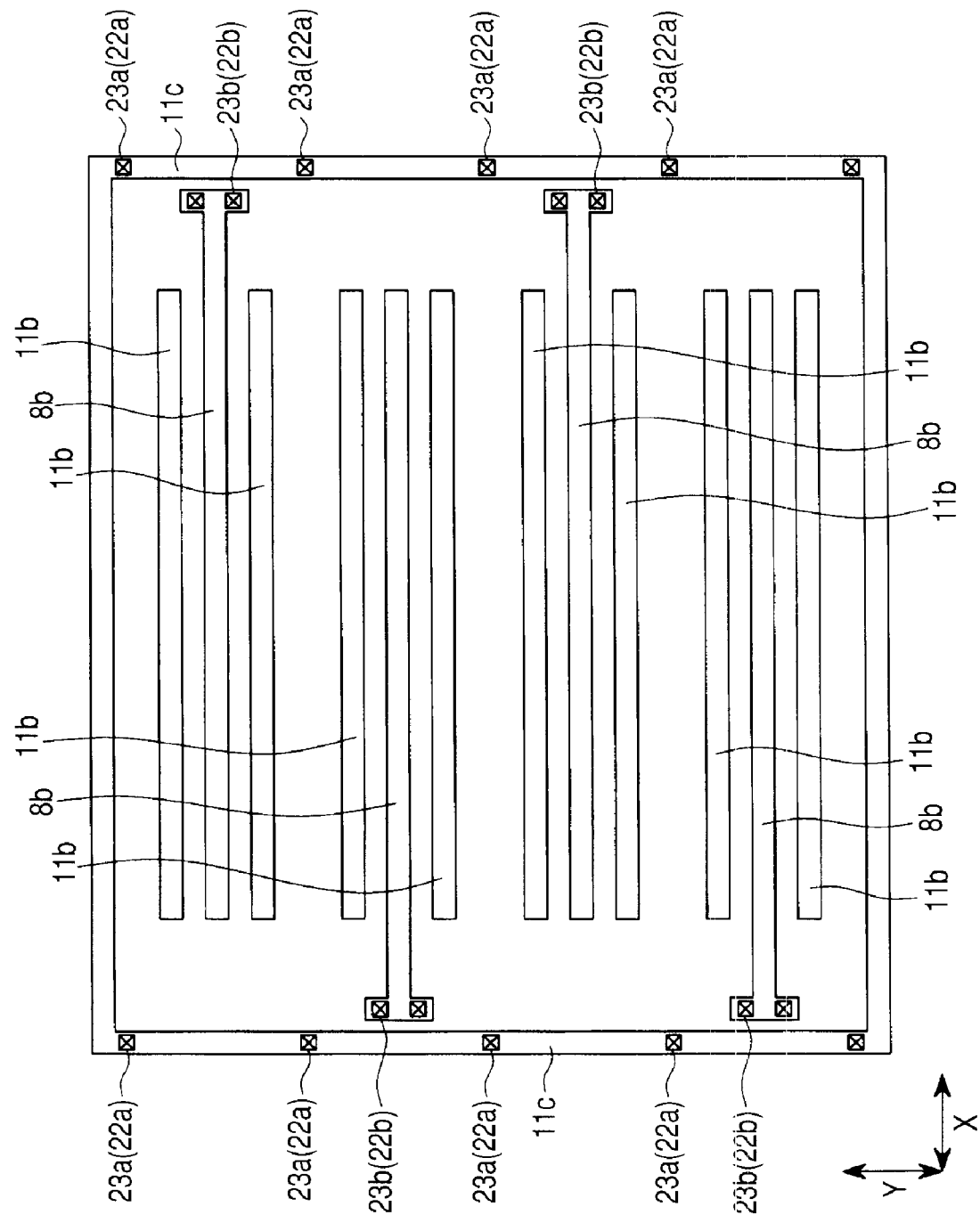
FIG. 33 is a cross-sectional view of a substantial part in a semiconductor device according to another embodiment of the present invention.
Figure 34:
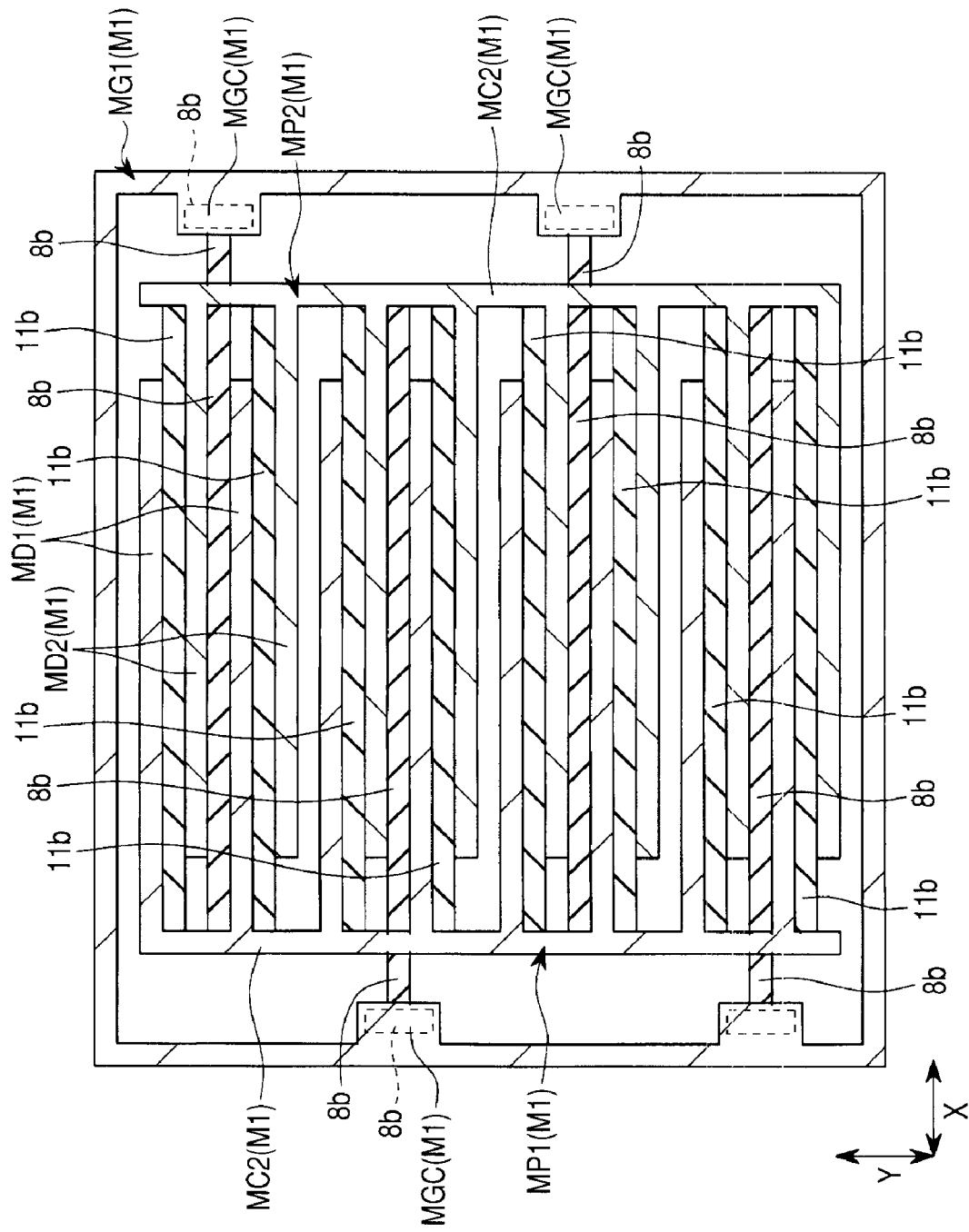
FIG. 34 is a cross-sectional view of a substantial part in a semiconductor device according to another embodiment of the present invention.

(Third Embodiment) FIG. 33 and FIG. 34 are plan views of substantial parts in the semiconductor device of the present embodiment, and correspond to FIG. 31 and FIG. 32 of the above second embodiment, respectively. Note that FIG. 34 is a plan view but provides hatching to the conductor pattern 8*b*, the p-type semiconductor regions 11*b*, 11*c* (active regions 1*b*, 1*c*), and the wiring M1 for making the drawings easily to be viewed as in FIG. 14 of the first embodiment and FIG. 32 of the second embodiment.

Also in the present embodiment, as in the second embodiment, each of the conductor patterns 8*b* in the capacitor formation region extends in the x direction and is disposed to overlap one of the wiring part MC1 in the metal pattern MP1 and the wiring part MC2 in the metal pattern MP2 in a planar manner, but not to overlap the other one in a planar manner. Then, also in the present embodiment, as in the second embodiment, each of the conductor patterns 8*b* couples one end thereof, which crosses over the wiring part MC1 or the wiring part MC2 and extends below the contact part MGC of the metal pattern MG1, to the contact part MGC of the metal pattern MG1 in the wiring M1 via the plug 23*b*, and does not couple the other end thereof to the metal pattern MG1 via the plug.

However, in the above second embodiment, all the conductor patterns 8*b* in the capacitor formation region are disposed to overlap the wiring part MC2 in the metal pattern MP2 in a planar manner but not to overlap the wiring part MC1 in the metal pattern MP1 in a planar manner. On the other hand, in the present embodiment, the conductor pattern 8*b* which crosses the wiring part MC2 in the metal pattern MP2 in a planar manner, and the conductor pattern 8*b* which crosses the wiring part MC1 in the metal pattern MP1 in a planar manner, are arranged alternately in the Y direction. Except for this point, the semiconductor device of the present embodiment is almost the same as that of the above second embodiment and description thereof will be omitted.

In the present embodiment, as shown in FIG. 33 and FIG. 34, the conductor pattern 8*b* which crosses the wiring part MC2 in the metal pattern MP2 in a planar manner, and the conductor pattern 8*b* which crosses the wiring part MC1 in the metal pattern MP1 in a planar manner, are disposed to be arranged alternately in the Y direction. Then, the conductor pattern 8*b*, crossing the wiring part MC2 in the metal pattern MP2 in a planar manner, couples the end thereof, which crosses over the wiring part MC2 and extends below the contact part MGC of the metal pattern MG1, (right side end in the case of FIG. 33 and FIG. 34), to the contact part MGC of the metal pattern MG1 in the wiring M1 via the plug 23*b*. Further, the conductor pattern 8*b*, crossing the wiring part MC1 in the metal pattern MP1 in a planar manner, couples the end thereof, which crosses over the wiring part MC1 and extends to the region below the contact part MGC of the metal pattern MG1, (left side end in the case of FIG. 33 and FIG. 34), to the contact part MGC of the metal pattern MG1 in the wiring M1 via the plug 23*b*.

Thereby, a cross area (area of the overlapped region) of the conductor pattern 8*b* and the metal pattern MP1, MP2 can be reduced and the parasitic capacitance between the conductor pattern 8*b* and the metal patterns MP1, MP2 of the wiring M1 in the capacitor formation region can be reduced, compared to the case in which each of the conductor patterns 8*b* crosses both of the wiring part MC1 in the metal pattern MP1 and the wiring part MC2 in the metal pattern MP2. Thereby, it is possible to reduce the parasitic capacitance between the metal patterns MP1, MP2 of the wiring M1 composing the capacitance element C1 and the conductor pattern 8*b*, and further to improve the electrical characteristic of the circuit using the capacitance element C1.

Further, as shown in FIG. 33 and FIG. 34, if the conductor pattern 8*b* which crosses the wiring part MC2 in the metal pattern MP2 in a planar manner, and the conductor pattern 8*b* which crosses the wiring part MC1 in the metal pattern MP1 in a planar manner, are disposed to be arranged alternately in the Y direction, the area of the region where the metal pattern MP1 crosses the conductor pattern 8*b* (area of the overlapped region) and the area of the region where the metal pattern MP2 crosses the conductor pattern 8*b* (area of the overlapped region) become almost equal to (the same as) each other. Thereby, the parasitic component (parasitic capacitance) added to the first electrode of the capacitance element C1 (the electrode of the capacitance element C1 composed of the metal patterns MP1, MP3 of the wirings M1 to M5) and the parasitic component (parasitic capacitance) added to the second electrode of the capacitance element C1 (the electrode of the capacitance element C1 composed of the metal patterns MP2, MP4 of the wirings M1 to M5) can be made almost the same as each other. Therefore, the present embodiment is very effective in an application thereof to a circuit in which a difference between the parasitic component (parasitic capacitance) added to the first electrode and the parasitic component (parasitic capacitance) added to the second electrode in the capacitance element C1 is required to be reduced as much as possible.

Hereinabove, the invention achieved by the present inventors has been described specifically according to the embodiments thereof, but the present invention is not limited to the foregoing embodiments and obviously can be modified variously in the range without departing from the spirit of the invention.

The present invention is effective in an application thereof to the semiconductor device including a capacitance element.

What is claimed is:

1. A semiconductor device, comprising:
a semiconductor substrate having a first region and a second region;
a first MISFET formed in the first region;
a first capacitance element formed over the second region;
a plurality of grooves formed in the semiconductor substrate and embedded with an insulating material;
a first active region formed in the first region of the semiconductor substrate and defined by the grooves;
a first gate electrode of the first MISFET formed over the first active region;
a first insulating film formed over the first and second regions so as to cover the first gate electrode;
a first metal pattern and a second metal pattern formed over the first insulating film of the second region; and
a third metal pattern substantially surrounding the first and second metal patterns and to be connected to a fixed potential,
wherein the first capacitance element includes the first metal pattern as one electrode and the second metal pattern as another electrode,
wherein a plurality of second active regions defined by the grooves are formed in the second region of the semiconductor substrate below the first capacitance element,
wherein a plurality of first conductor patterns in the same layer as that of the first gate electrode are formed over the second region of the semiconductor substrate below the first capacitance element,
wherein the second active regions are dummy active regions and do not function as part of a MISFET,
wherein the first conductor patterns are dummy conductor patterns and do not function as part of a MISFET,
wherein the first conductor patterns and the second active regions are electrically coupled to the third metal pattern,
wherein each of the first conductor patterns is formed over one corresponding adjacent groove of the plurality of grooves in which the insulating material is embedded, and
wherein each of the second active regions is disposed below the first capacitance element but is disposed so as not to overlap the first metal pattern or the second metal pattern in a planar manner.

2. The semiconductor device according to claim 1, wherein each of the first conductor patterns is disposed below the first capacitance element but is disposed so as not to overlap the first metal pattern or the second metal pattern in a planar manner.

3. The semiconductor device according to claim 2, wherein the third metal pattern is a metal pattern for shielding the first capacitance element.

4. The semiconductor device according to claim 1, wherein:
the first metal pattern has a pattern shape in which a plurality of first conductor parts extending in a first direction are coupled with one another by a first coupling part extending in a second direction that crosses the first direction; and
the second metal pattern has a pattern shape in which a plurality of second conductor parts extending in the first direction and also disposed between the respective first conductor parts are coupled with one another by a second coupling part extending in the second direction.

5. The semiconductor device according to claim 4, wherein each of the second active regions extends in the first direction.

6. The semiconductor device according to claim 5, wherein each of the second active regions is disposed in a planar position between the first conductor part of the first metal pattern and the second conductor part of the second metal pattern.

7. The semiconductor device according to claim 6, wherein each of the second active regions does not overlap the first conductor part of the first metal pattern or the second conductor part of the second metal pattern in a planar manner.

8. The semiconductor device according to claim 6, further comprising:
a third active region disposed in the second region below the third metal pattern and defined by the grooves, the third active region being electrically coupled to the third metal pattern via a first connection conductor part embedded in a first opening part formed in the first insulating film.

9. The semiconductor device according to claim 8, wherein the third active region is formed so as to surround the second active regions disposed in plural numbers in a planar manner.

10. The semiconductor device according to claim 8, further comprising:
a first semiconductor region formed in the second region of the semiconductor substrate and surrounding the second active regions and the third active region, for electrically coupling the second active regions and the third active region with each other.

11. The semiconductor device according to claim 4, wherein
each of the first conductor patterns extends in the first direction.

12. The semiconductor device according to claim 11, wherein
each of the first conductor patterns is disposed in a planar position between the first conductor part of the first metal pattern and the second conductor part of the second metal pattern.

13. The semiconductor device according to claim 12, wherein
each of the first conductor patterns does not overlap the first conductor part of the first metal pattern or the second conductor part of the second metal pattern in a planar manner.

14. The semiconductor device according to claim 12, wherein
each of the first conductor patterns extends in the first direction to cross at least one of the first coupling part of the first metal pattern and the second coupling part of the second metal pattern in a planar manner and is electrically coupled to the third metal pattern via a second connection conductor part embedded in a second opening part formed in the first insulating film.

15. The semiconductor device according to claim 4, further comprising:
a plurality of wiring layers including the first wiring layer formed in an upper layer which is disposed above the first insulating film; and
a fourth metal pattern, a fifth metal pattern, and a sixth metal pattern provided around the fourth and fifth metal patterns formed in the second region by a second wiring layer which is a wiring layer disposed above the first wiring layer by one layer, among the wiring layers,
wherein the first and fourth metal patterns are electrically coupled with each other and form the one electrode of the first capacitance element, the second and fifth metal patterns are electrically coupled with each other and form the other electrode of the first capacitance element, and the third and sixth metal patterns are electrically coupled with each other.

16. The semiconductor device according to claim 15, wherein the fourth metal pattern has a pattern shape in which a plurality of third conductor parts extending in the first direction is coupled with one another by a third coupling part extending in the second direction, wherein the fifth metal pattern has a pattern shape in which a plurality of fourth conductor parts extending in the first direction and also disposed between the respective third conductor parts is coupled with one another by a fourth coupling part extending in the second direction, wherein the third conductor part of the fourth metal pattern is disposed at a position which overlaps the second conductor part of the second metal pattern in a planar manner, and wherein the fourth conductor part of the fifth metal pattern is disposed at a position which overlaps the first conductor part of the first metal pattern in a planar manner.

17. The semiconductor device according to claim 1, further comprising:

a plurality of wiring layers including the first wiring layer formed in an upper layer which is disposed above the first insulating film, wherein the first wiring layer is a lowermost wiring layer among the wiring layers.

* * * * *